United States Patent
Kim et al.

(10) Patent No.: US 10,055,057 B2
(45) Date of Patent: Aug. 21, 2018

(54) TOUCH SENSOR INTEGRATED DISPLAY DEVICE AND METHOD FOR DRIVING THE SAME

(71) Applicant: LG Display Co., Ltd., Seoul (KR)

(72) Inventors: Taegung Kim, Paju-si (KR); Seungtae Kim, Goyang-si (KR); Junghyeon Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 268 days.

(21) Appl. No.: 15/235,096

(22) Filed: Aug. 11, 2016

(65) Prior Publication Data

US 2017/0046006 A1    Feb. 16, 2017

(30) Foreign Application Priority Data

Aug. 14, 2015  (KR) .................. 10-2015-0115033

(51) Int. Cl.
*G06F 3/041*  (2006.01)
*G02F 1/1333*  (2006.01)
(Continued)

(52) U.S. Cl.
CPC ........ *G06F 3/0418* (2013.01); *G02F 1/13338* (2013.01); *G06F 3/044* (2013.01);
(Continued)

(58) Field of Classification Search
CPC .. G09G 2320/045; G06F 3/0412; G06F 3/044
See application file for complete search history.

(56) References Cited

U.S. PATENT DOCUMENTS

2007/0030255 A1  2/2007  Pak et al.
2009/0015166 A1  1/2009  Kwon
(Continued)

FOREIGN PATENT DOCUMENTS

CN    104699316 A    6/2015
EP    2428878 A2    3/2012
(Continued)

OTHER PUBLICATIONS

European Partial Search Report, European Application No. 16182509.6, dated Dec. 20, 2016, 9 pages.
(Continued)

*Primary Examiner* — Priyank Shah
(74) *Attorney, Agent, or Firm* — Fenwick & West LLP

(57) ABSTRACT

A touch sensor integrated display device and a method for driving the same are disclosed. The touch sensor integrated display device includes a display panel, in which a pixel array is divided into a plurality of touch blocks, each touch block includes pixels displaying an input image and a sensing target dummy pixel sensing a touch input, and the sensing target dummy pixel includes a dummy driving TFT configured to control a source-drain current based on a gate-source voltage, and a panel drive circuit, which in a touch sensing period, supplies a scan control signal and a sensing control signal to the sensing target dummy pixel and sets the gate-source voltage to turn on the dummy driving TFT by applying a touch driving data voltage to a gate node of the dummy driving TFT and applying a reference voltage to a source node of the dummy driving TFT.

19 Claims, 51 Drawing Sheets

(51) Int. Cl.
  *G06F 3/044* (2006.01)
  *G09G 3/3233* (2016.01)
  *G09G 3/3225* (2016.01)
  *G09G 3/3266* (2016.01)
  *H01L 27/32* (2006.01)

(52) U.S. Cl.
  CPC ......... *G06F 3/0412* (2013.01); *G09G 3/3225* (2013.01); *G09G 3/3233* (2013.01); *G09G 3/3266* (2013.01); *H01L 27/323* (2013.01); *H01L 27/3223* (2013.01)

(56) References Cited

U.S. PATENT DOCUMENTS

| | | |
|---|---|---|
| 2010/0149128 A1 | 6/2010 | No et al. |
| 2013/0050138 A1 | 2/2013 | Chan et al. |
| 2014/0111466 A1 | 4/2014 | Kim et al. |
| 2014/0160041 A1 | 6/2014 | Kim et al. |
| 2014/0168127 A1* | 6/2014 | Yang ............... G06F 3/0412 345/173 |
| 2014/0176525 A1* | 6/2014 | Woo ............... G09G 3/3233 345/212 |
| 2014/0225838 A1* | 8/2014 | Gupta ............... G06F 3/0412 345/173 |
| 2015/0170565 A1 | 6/2015 | Hong et al. |
| 2015/0177869 A1 | 6/2015 | Morein et al. |
| 2015/0221255 A1* | 8/2015 | Qing ............... G06F 3/0412 345/173 |
| 2016/0071445 A1* | 3/2016 | Kim ............... G09G 3/006 345/212 |
| 2016/0216800 A1* | 7/2016 | Cho ............... G06F 3/044 |
| 2016/0291758 A1 | 10/2016 | Du et al. |
| 2017/0031485 A1* | 2/2017 | Kim ............... G06F 3/0412 |
| 2017/0038898 A1* | 2/2017 | Kim ............... G09G 3/3225 |

FOREIGN PATENT DOCUMENTS

| | | |
|---|---|---|
| EP | 2889862 A1 | 7/2015 |
| KR | 10-2015-0052606 A | 5/2015 |
| KR | 10-2015-0057672 A | 5/2015 |
| KR | 10-2015-0064798 A | 6/2015 |
| KR | 10-1549343 B1 | 9/2015 |
| KR | 10-1577909 B1 | 12/2015 |
| KR | 10-2016-0001822 A | 1/2016 |
| KR | 10-2016-0007971 A | 1/2016 |
| TW | 201121354 A1 | 6/2011 |
| TW | 201426713 A | 7/2014 |
| TW | 201440029 A | 10/2014 |

OTHER PUBLICATIONS

European Extended Search Report, European Application No. 16182509.6, dated Feb. 28, 2017, 16 pages.

Taiwan Office Action, Taiwan Application No. 105125749, dated May 10, 2017, 12 pages.

* cited by examiner (A)

(B)

TOUCH SENSOR INTEGRATED DISPLAY DEVICE AND METHOD FOR DRIVING THE SAME

This application claims the benefit of Korean Patent Application No. 10-2015-0115033 filed on Aug. 14, 2015, which is incorporated herein by reference for all purposes as if fully set forth herein.

BACKGROUND

Related Field

The present disclosure relates to a touch sensor integrated display device and a method for driving the same.

Discussion of the Related Art

Touch sensors are being proposed which enable users to directly touch or get close to the screen and enter data with their finger or a pen while watching displays of a variety of home electronics or data communication devices. The touch sensors are used for various display devices because they are simple to use, have low possibility of malfunction, allow for user input without using an additional input device, and enable the users to operate them quickly and easily through content displayed on the screen.

The touch sensors may be implemented by well-known technologies such as capacitive sensing, infrared (IR) sensing, etc.

Capacitive sensing may be classified into add-on type, on-cell type, and in-cell type.

In the add-on type, as shown in FIG. 1, a display device 1 and 2 and a touch film 3 with touch sensors are separately manufactured, and the touch film 3 is attached to the surface of the display device. In FIG. 1, reference numeral 1 denotes a display panel, reference numeral 2 denotes an encapsulation substrate, and reference numeral 4 denotes a touch IC. The add-on type has the problem of low visibility caused by its large thickness and the low brightness of the display device 1 and 2 because a finished touch film 3 is mounted over the display device 1 and 2.

In the on-cell type, touch sensors are directly formed on the surface of an upper glass substrate of a display device. In case of the on-cell type, touch sensors are formed on the upper surface of a display device, with a reduction in thickness compared with the add-on type, but still a driving electrode layer and sensing electrode layer constituting the touch sensors and an insulating film for insulating these layers increase the entire thickness and the number of process steps, leading to an increase in the manufacturing cost.

In the in-cell type, touch sensors are formed inside a display device, which is attracting a lot of attention in that the touch sensors can be made thin. Known examples of the in-cell type touch sensors include mutual capacitance touch sensors and self-capacitance touch sensors. In mutual capacitance sensing, driving electrode lines and sensing electrode lines cross each other within a display panel to form touch sensors, a touch driving signal is applied to the driving electrode lines, and then touch input is sensed by detecting a change in mutual capacitance at the touch sensors through the sensing electrode lines. In self-capacitance sensing, touch electrodes and sensor lines are formed on a display panel, a touch driving signal is applied to the touch electrode through the sensor lines, and touch input is sensed by detecting a change in self-capacitance at the touch electrodes.

The in-cell type too requires signal lines (e.g., driving electrode lines, sensing electrode lines, and sensor lines) associated with touch to be added on the display panel. Moreover, the in-cell type requires an electrode patterning process because an internal electrode used for display is used as an electrode of the touch sensors to achieve a thin profile and has large parasitic capacitance due to the coupling between touch sensors and pixels. This leads to a reduction in touch sensitivity and touch recognition accuracy.

In IR (infrared) sensing, as shown in FIG. 2, a display device 1 and 2 and a touch bezel 5 with touch sensors are separately manufactured, and the display device 1 and 2 and the touch bezel 5 are joined together. In FIG. 2, reference numeral 1 denotes a display panel, reference numeral 2 denotes an encapsulation substrate, and reference numeral 4 denotes a touch IC. IR (infrared) sensing does not support multi-touch due to the low response rate and the low touch resolution.

As seen from above, the conventional touch sensor technology requires complicated elements for touch sensing to be added on a display device, which complicates the manufacturing process, increases the manufacturing cost, and lowers touch sensing capabilities.

SUMMARY

An aspect of the present disclosure is to provide a touch sensor integrated display device which can minimize additional elements for touch sensing and enhance touch sensing capabilities.

In one aspect, there is provided a touch sensor integrated display device comprising a display panel including a pixel array configured to display an input image, the pixel array being divided into a plurality of touch blocks, each touch block including pixels displaying the input image and a sensing target dummy pixel sensing a touch input, the sensing target dummy pixel including a dummy driving thin film transistor (TFT) a source-drain current of the dummy driving TFT controlled based on a gate-source voltage of the dummy driving TFT, the sensing target dummy pixel not displaying the input image; a panel drive circuit configured to, in a touch sensing period, supply a scan control signal and a sensing control signal to the sensing target dummy pixel, set the gate-source voltage of the dummy driving TFT to turn on the dummy driving TFT by applying a touch driving data voltage to a gate node of the dummy driving TFT and applying a reference voltage to a source node of the dummy driving TFT, and output a sensing value by sensing a change in the source-drain current of the dummy driving TFT caused by the touch input; and a timing controller configured to compare the sensing value with a predetermined reference value and detect the touch input.

In one or more embodiments, each of the pixels displaying the input image includes a driving TFT on a same layer as the dummy driving TFT of the sensing target dummy pixel.

In one or more embodiments, each of the pixels displaying the input image includes a driving TFT and an organic light emitting diode (OLED) coupled to the driving TFT. The sensing target dummy pixel may further include a capacitor coupled to the dummy driving TFT without the OLED.

In one or more embodiments, touch sensing periods of a number of the touch blocks are assigned to a vertical active period for an image display. Image display data address periods, in which image display data is written on the pixels of each touch block, may be further assigned to the vertical active period. The touch sensing periods and the image display data address periods may be alternately positioned in the vertical active period. A transmission timing of a sensing value of a first touch block of the touch blocks may overlap an image display data address period of a second touch block of the touch blocks adjacent to the first touch block.

In one or more embodiments, touch sensing periods of a number of the touch blocks are assigned to a vertical blank period between vertical active periods. Image display data may be written on the pixels of the touch blocks in the vertical active periods. A transmission timing of a sensing value of a first touch block of the touch blocks may overlap a touch sensing period of a second touch block of the touch blocks adjacent to the first touch block.

In one or more embodiments, the touch blocks are simultaneously sensed in groups. Touch blocks in a touch group may be individually connected to different sensing units of the panel drive circuit. A transmission timing of a sensing value with respect to a first touch group may overlap a touch sensing period of a second touch group adjacent to the first touch group.

In one or more embodiments, the touch sensing period further includes a bias stress reduction period. The panel drive circuit may apply a stress reduction data voltage to the gate node of the dummy driving TFT to turn off the dummy driving TFT during the bias stress reduction period. The stress reduction data voltage may be equal to or less than the reference voltage.

In one or more embodiments, an external compensation period, in which a change in electrical characteristics of a driving TFT included in each of the pixels displaying the input image is sensed, is assigned to a vertical blank period. In the external compensation period, the panel drive circuit may apply an external compensation data voltage greater than the touch driving data voltage to a gate node of the driving TFT and apply the reference voltage to a source node of the driving TFT.

In one or more embodiments, an external compensation period, in which a change in electrical characteristics of a driving TFT included in each of the pixels displaying the input image is sensed, is further assigned to the vertical blank period. The panel drive circuit may apply the scan control signal and the sensing control signal to couple a gate node and a source node of the driving TFT to corresponding signal lines during a sensing period included in the external compensation period and to prevent the gate node and the source node of the driving TFT from being floated.

In one or more embodiments, the timing controller includes a memory and a memory controller configured to store image data input in the memory at a first frame frequency and output data stored in the memory at a second frame frequency less than the first frame frequency.

In one or more embodiments, a touch capacitor caused by the touch input is connected to the gate node or the source node of the dummy driving TFT and changes the gate-source voltage of the dummy driving TFT.

In one or more embodiments, the display panel further includes an auxiliary electrode patterned on each touch block and connected to the sensing target dummy pixel. The auxiliary electrode may be positioned between one side electrode of a touch capacitor caused by the touch input and a substrate, and may be electrically connected to the one side electrode of the touch capacitor through a contact hole passing through an insulating film.

In one or more embodiments, the display panel further includes an auxiliary electrode patterned on each dummy pixel line and connected to the sensing target dummy pixel, the sensing target dummy pixel being disposed on the dummy pixel line. The auxiliary electrode may be positioned between one side electrode of a touch capacitor caused by the touch input and a substrate, and may be directly connected to the one side electrode of the touch capacitor. The auxiliary electrode may be formed by extending the gate node of the dummy driving TFT on the dummy pixel line.

In another aspect, there is provided a method for driving a touch sensor integrated display device. The method comprises a first step of setting a touch sensing period with respect to a display panel, in which a pixel array displaying an input image is divided into a plurality of touch blocks, each touch block includes a plurality of pixels displaying the input image and a sensing target dummy pixel sensing a touch input, and the sensing target dummy pixel includes a dummy driving thin film transistor (TFT) controlling a source-drain current based on a gate-source voltage; a second step of, in the touch sensing period, supplying a scan control signal and a sensing control signal to the sensing target dummy pixel corresponding to a touch block of the plurality of touch blocks, setting the gate-source voltage of the dummy driving TFT to turn on the dummy driving TFT by applying a touch driving data voltage to a gate node of the dummy driving TFT and applying a reference voltage to a source node of the dummy driving TFT, and outputting a sensing value by sensing a change in the source-drain current of the dummy driving TFT caused by the touch input; and a third step of comparing the sensing value with a predetermined reference value to detect the touch input based on the comparison.

In another aspect, a touch sensor integrated display device is disclosed. The touch sensor integrated display device comprises: a display panel including a pixel array, the pixel array being divided into a plurality of touch blocks, each touch block including pixels configured to emit light according to image data and a dummy pixel not configured to emit light, each of the pixels including a driving transistor to generate a current according to the image data to emit the light, the dummy pixel including a dummy driving transistor to generate a current according to a touch input.

In one or more embodiments, the driving transistor is formed on a same layer as the dummy driving transistor.

In one or more embodiments, each of the pixels further includes an organic light emitting diode (OLED) coupled to the driving transistor, and wherein the dummy pixel further includes a capacitor coupled to the driving transistor without the OLED.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Hereinafter, various embodiments of a touch sensor integrated display device will be described with reference to FIGS. 3 to 55.

Figure 1:
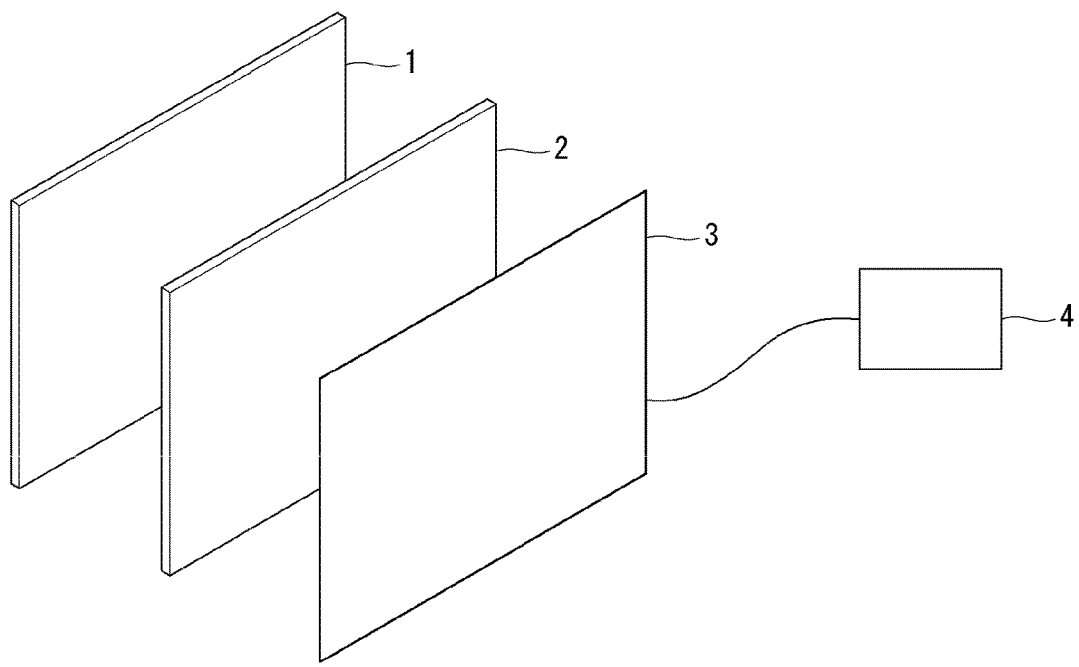
FIG. 1 is a view showing a method for implementing touch sensors by capacitive sensing according to the conventional art.
Figure 2:
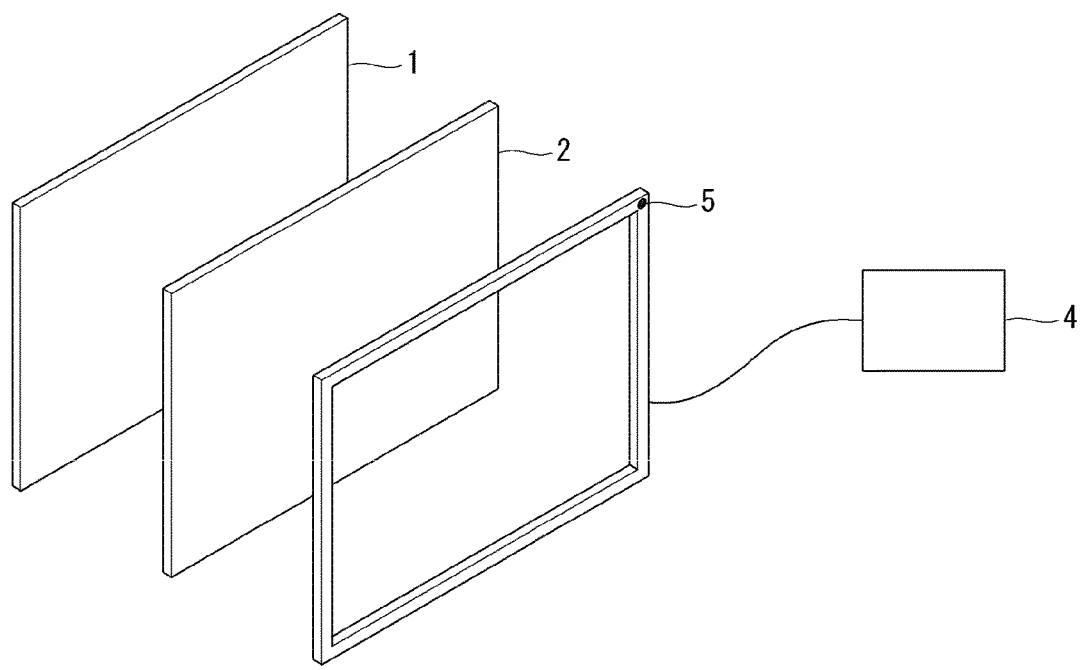
FIG. 2 is a view showing a method for implementing touch sensors by IR (Infrared) sensing according to the conventional art.
Figure 3:
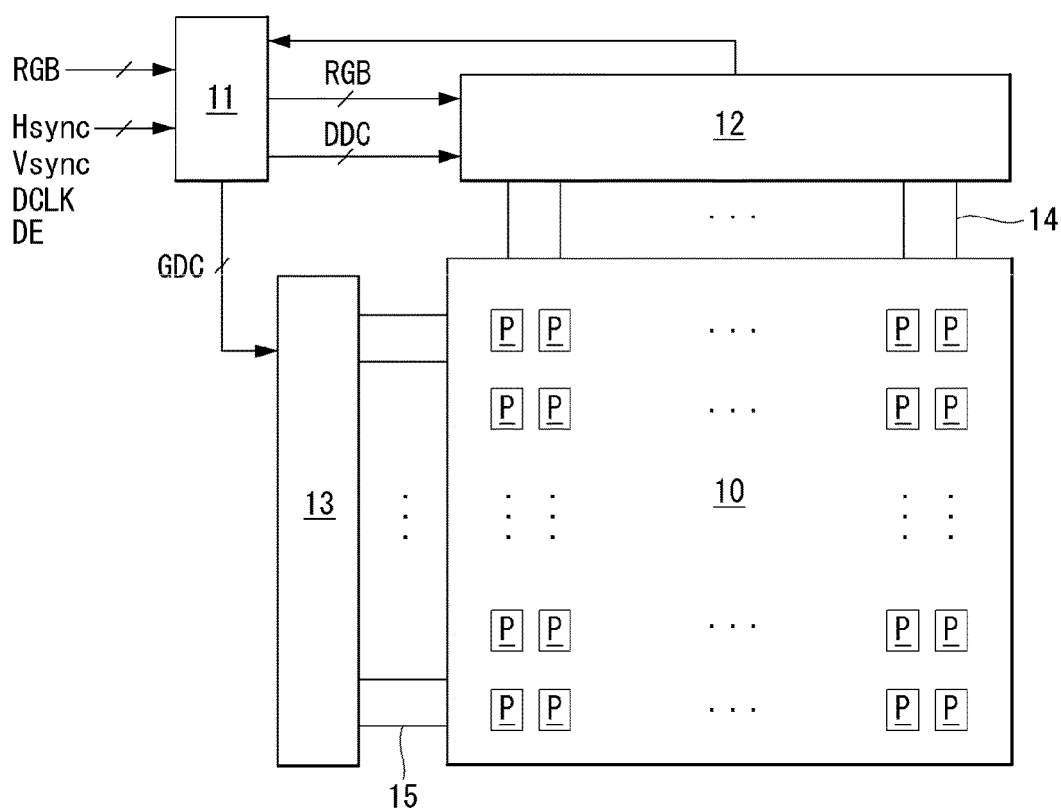
FIG. 3 is a view showing a touch sensor integrated display device according to one embodiment.
Figure 4:
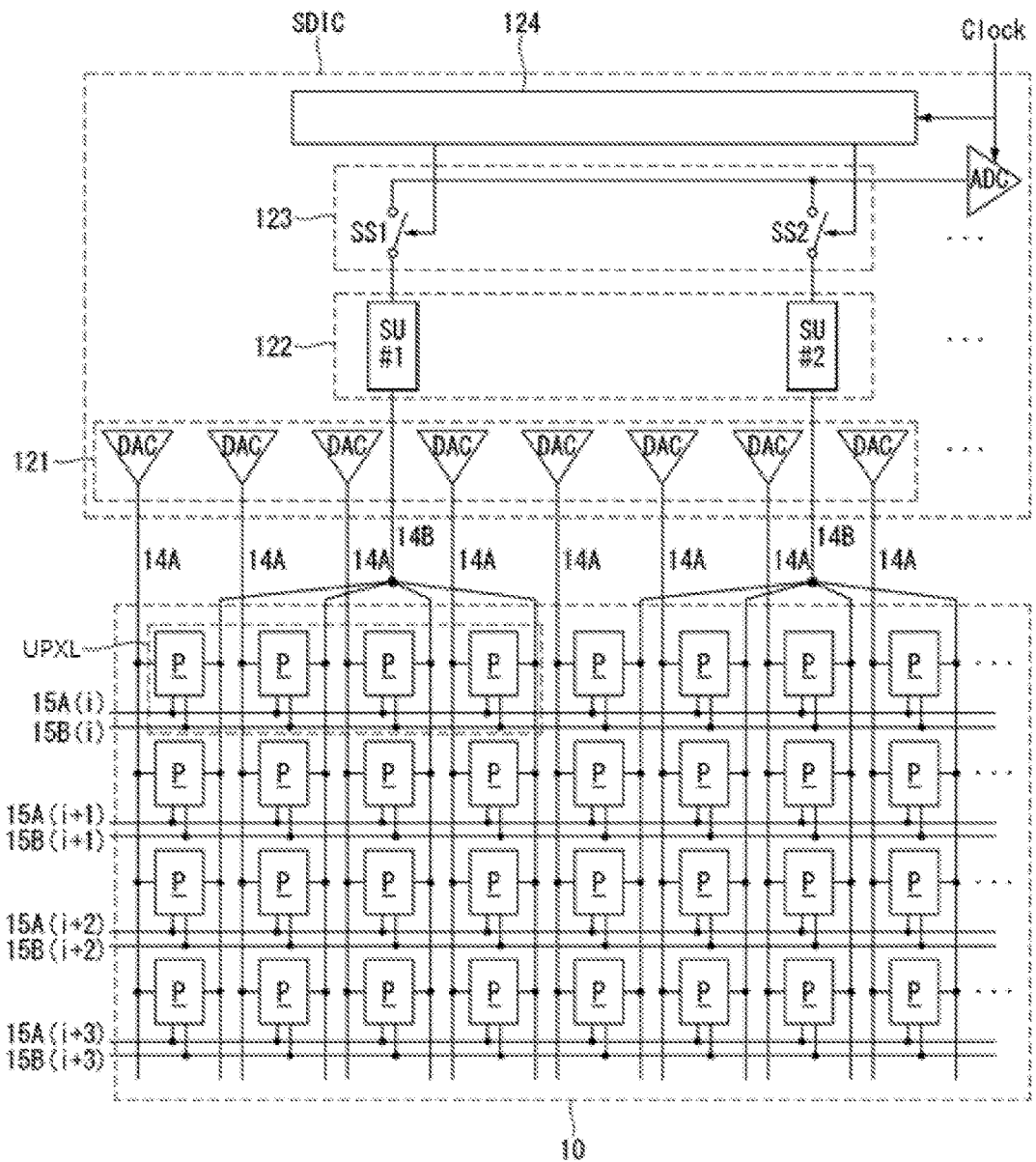
FIG. 4 is a view showing a configuration example of a pixel array comprising a plurality of pixels, which can be used as touch sensors, and a source drive IC.
Figure 5:
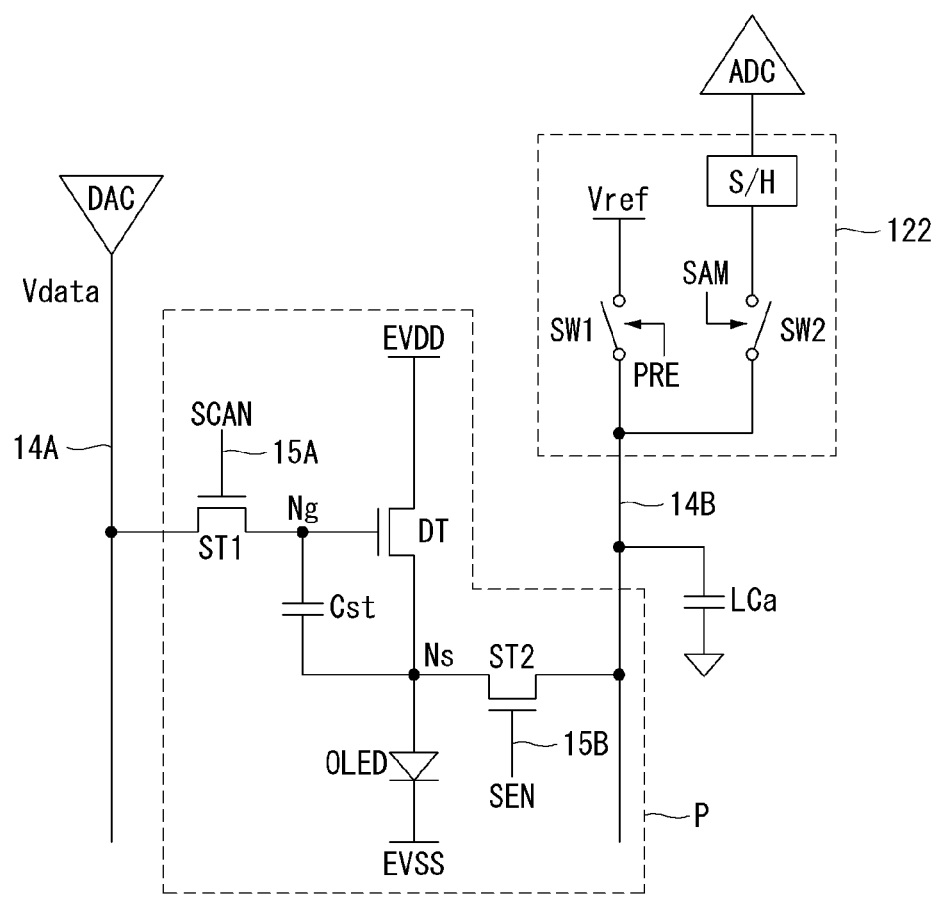
FIG. 5 is a view showing a configuration of a pixel and a configuration example of a sensing unit connected to a pixel according to one embodiment.
Figure 6:
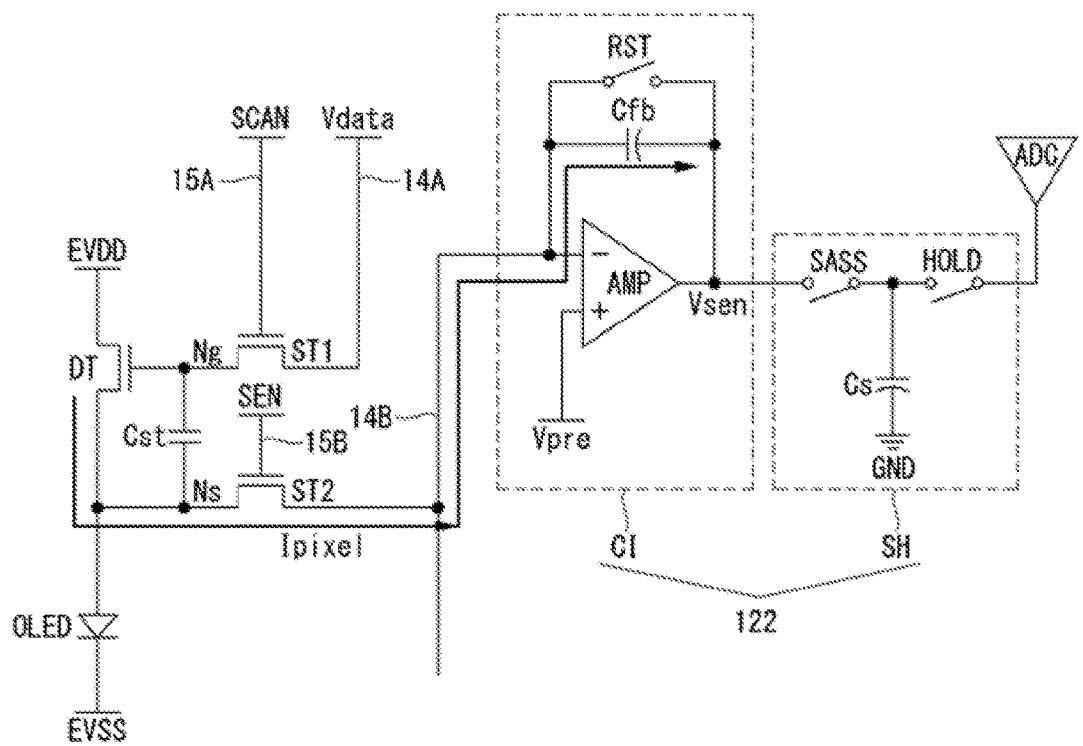
FIG. 6 is a view showing a configuration of a pixel and a configuration example of a sensing unit connected to a pixel according to another embodiment.

FIG. 3 is a view showing a touch sensor integrated display device according to one embodiment. FIG. 4 is a view showing a configuration example of a pixel array comprising a plurality of pixels, which can be used as touch sensors, and a source drive IC. FIGS. 5 and 6 are views showing the configuration of a pixel and a configuration example of a sensing unit connected to the pixel according one embodiment.

The touch sensor integrated display device is implemented as an organic light-emitting display device, especially, one comprising a pixel array for external compensation. The touch sensor integrated display device requires no touch electrodes and sensor lines and can minimize additional elements for touch sensing because it senses touch input using an external compensation-type pixel array.

External compensation is a technique of sensing electrical characteristics of organic light-emitting diodes (hereinafter, OLEDs) and driving TFTs (thin film transistors) included in pixels and correcting input video data according to sensing values. An organic light-emitting device comprising a pixel array for external compensation is disclosed in Republic of Korea Patent Application Nos. 10-2013-0134256 (filed on Nov. 6, 2013), 10-2013-0141334 (filed on Nov. 20, 2013), 10-2013-0149395 (filed on Dec. 3, 2013), 10-2014-0086901 (filed on Jul. 10, 2014), 10-2014-0079255 (filed on Jun. 26, 2014), 10-2014-0079587 (filed on Jun. 27, 2014), 10-2014-0119357 (filed on Sep. 5, 2014), etc. which are incorporated herein by reference.

Referring to FIGS. 3 to 6, a touch sensor integrated display device according to an exemplary embodiment may comprise a display panel 10, a timing controller 11, a data drive circuit 12, and a gate drive circuit 13. The data drive circuit 12 and the gate drive circuit 13 may constitute a panel drive circuit.

A plurality of data lines and sensing lines 14A and 14B and a plurality of gate lines 15 intersect each other on the display panel 10, and pixels P capable of being compensated externally are arranged in a matrix form at the intersections to form a pixel array. The gate lines 15 comprise a plurality of first gate lines 15A to which a scan control signal SCAN is supplied, and a plurality of second gate lines 15B to which a sensing control signal SEN is supplied.

Each pixel P may be connected to one of the data lines 14A, one of the sensing lines 14B, one of the first gate lines 15A, and one of the second gate lines 15B. A plurality of pixels P included in a pixel unit UPXL may share one sensing line 14B. The pixel unit UPXL may comprise, but not be limited to, four pixels: a red pixel, a green pixel, a blue pixel, and a white pixel. Also, the pixels included in the pixel unit UPXL may be individually connected to a plurality of sensing lines, rather than sharing one sensing line. Each pixel P receives a high-potential driving voltage EVDD and a low-potential driving voltage EVSS from a power generator (not shown).

A pixel P for external compensation may comprise an OLED, a driving TFT DT, a storage capacitor Cst, a first switching TFT ST1, and a second switching TFT ST2. The TFTs may be implemented as p-type, or n-type, or a hybrid of p-type and n-type. Also, a semiconductor layer of the TFTs may comprise amorphous silicon, polysilicon, or an oxide.

The OLED comprises an anode connected to a source node Ns, a cathode connected to an input terminal of low-potential driving voltage EVSS, and an organic compound layer located between the anode and the cathode. The organic compound layer may comprise a hole injection layer HIL, a hole transport layer HTL, an emission layer EML, an electron transport layer ETL, and an electron injection layer EIL.

The driving TFT DL controls the amount of source-drain current (hereinafter, Ids) of the driving TFT DT flowing to the OLED according to a gate-source voltage (hereinafter, Vgs). The driving TFT DT has a gate electrode connected to a gate node Ng, a drain electrode connected to an input terminal of high-potential driving voltage EVDD, and a source electrode connected to a source node Ns. The storage capacitor Cst is connected between the gate node Ng and the source node Ns to maintain the Vgs of the driving TFT DT for a certain period of time. The first switching TFT ST1 switches on an electrical connection between a data line 14A and the gate node Ng in response to a scan control signal SCAN. The first switching TFT ST1 has a gate electrode connected to a first gate line 15A, a drain electrode connected to the data line 14A, and a source electrode connected to the gate node Ng. The second switching TFT ST2 switches on an electrical connection between the source node Ns and a sensing line 14B in response to a sensing control signal SEN. The second switching TFT ST2 has a gate electrode connected to a second gate line 15B, a drain electrode connected to the sensing line 14B, and a source electrode connected to the source node Ns.

A touch sensor integrated display device having such a pixel array for external compensation may operate in a first driving mode for displaying images and making external compensation or in a second driving mode for displaying images, making external compensation, and performing touch sensing.

When the touch sensor integrated display device operates in the first driving mode, external compensation is made in a vertical blanking interval during image display, or in a power-on sequence interval before the beginning of image display, or in a power-off sequence interval after the end of image display. The vertical blanking interval is the time during which image data is not written (or not programmed), which is arranged between vertical active periods in which one frame of image data is written (or programmed). The power-on sequence interval is the time between the turn-on of driving power and the beginning of image display. The power-off sequence interval is the time between the end of image display and the turn-off of driving power.

When the touch sensor integrated display device operates in the second driving mode, touch sensing is performed in a horizontal blanking interval during image display or in a vertical blanking interval during image display. The horizontal blanking interval is the time during which no image data is written, which is arranged between horizontal active periods in which one horizontal line of image data is written. When the touch sensor integrated display device operates in the second driving mode, external compensation may be made in a vertical blanking interval, with touch sensing separately, or in the power-on sequence period, or in the power-off sequence period.

The timing controller 11 may switch between the driving modes based on information about the user's mode selection, whether touch input is present or not, and the distance between the display device and the user. The timing controller 11 may switch from the first driving mode to the second driving mode or vice versa depending on information about the user's mode selection via a remote control, a smartphone, buttons, and so on. Also, the timing controller 11 may determine whether touch input is present or not, by performing as little touch sensing as possible, without affecting the picture quality, and may switch from the first driving mode to the second driving mode when touch input is sensed or switch from the second driving mode to the first driving mode when no touch input is sensed for a certain period of time or longer. Also, the timing controller 11 may determine the distance between the display device and the user based on information input from a camera, infrared sensor, etc., and may switch from the first driving mode to the second driving mode if the user comes within a given distance or switch from the second driving mode to the first driving mode if the user moves the given distance away.

The timing controller 11 generates a data control signal DDC for controlling the operation timing of the data drive circuit 12 and a gate control signal GDC for controlling the operation timing of the gate drive circuit 13, based on timing signals such as a vertical synchronization signal Vsync, a horizontal synchronization signal Hsync, a dot clock signal DCLK, and a data enable signal DE. In the first driving mode, the timing controller 11 may temporally separate an image display period and an external compensation period and generate the control signals DDC and GDC differently for image display and external compensation, respectively. In the second driving mode, the timing controller 11 may temporally separate an image display period and an external compensation period and generate the control signals DDC and GDC differently for image display, external compensation, and touch sensing, respectively.

The timing controller 11 may adjust the frequencies of the gate control signal GDC and the data control signal DDC with respect to a frame frequency of k/i Hz so that digital video data received at a frame frequency of k Hz is written in the pixel array of the display panel 10 at a frequency of k/i (k and i are positive integers), in order to secure a sensing period for external compensation and/or a touch sensing period.

The gate control signal GDC comprises a gate start pulse GSP, a gate shift clock GSC, and a gate output enable signal GOE. The gate start pulse GSP is applied to a gate stage for generating a first scan signal and controls the gate stage to generate the first scan signal. The gate shift clock GSC is a clock signal that is commonly input into gate stages and shifts the gate start pulse GSP. The gate output enable signal GOE is a masking signal that controls the output of the gate stages.

The data control signal DDC comprises a source start pulse SSP, a source sampling clock SSC, and a source output enable signal SOE. The source start pulse SSP controls the timing of the start of data sampling of the data drive circuit 12. The source sampling clock SSC is a clock signal that controls the timing of data sampling in each source drive IC based on a rising or falling edge. The source output enable signal SOE controls the output timing of the data drive circuit 12. The data control signal DDC comprises a reference voltage control signal PRE and sampling control signal SAM for controlling the operation of a sensing unit 122 included in the data drive circuit 12. The reference voltage control signal PRE controls the timing for applying a reference voltage to the sensing lines 14B. The sampling control signal SAM controls the timing for sampling a sensing value resulting from external compensation or a sensing value resulting from touch sensing.

The timing controller 11 may store the sensing value resulting from external compensation in a memory (not shown) and then compensate digital video data RGB based on the sensing value to compensate for differences in the electrical characteristics of the driving TFTs between the pixels or differences in OLED degradation between the pixels. The timing controller 11 may compare the sensing value resulting from touch sensing with a predetermined reference value and obtain the coordinates of the touch input position.

The timing controller 11, while operating for image display, may transmit digital video data RGB input from an external video source to the data drive circuit 12. The timing controller 11, while operating for external compensation, may transmit a certain level of digital data for external compensation to the data drive circuit 12. The timing controller 11, while operating for touch sensing, may transmit a certain level of digital data for touch sensing to the data drive circuit 12.

The data drive circuit 12 comprises at least one source drive IC (Integrated circuit) SDIC. The source drive IC SDIC may comprise a latch array (not shown), a plurality of digital-to-analog converters (hereinafter, DACs) 121 connected to each data line 14A, a plurality of sensing units 122 connected to the sensing lines 14B, a MUX 123 for selectively connecting the sensing units 122 to the analog-to-digital converter (hereinafter, ADC), and a shift register 124 for generating a selection control signal and sequentially turning on switches SS1 and S S2 in the MUX 123.

The latch array latches various kinds of digital data input from the timing controller 11 and supplies it to the DAC based on the data control signal DDC. For image display, the DAC may convert digital video data RGB input from the timing controller 11 to a data voltage for image display and supply it to the data lines 14A. In an external compensation operation, the DAC may convert digital data for external compensation input from the timing controller 11 to a data voltage for external compensation and supply it to the data lines 14A. In a touch sensing operation, the DAC may convert digital data for touch sensing input from the timing controller 11 to a data voltage for touch sensing and supply it to the data lines 14A.

The sensing units 122 may supply a reference voltage Vref to the sensing lines 14B based on the data control signal DDC, or may sample a sensing value input through the sensing lines 14B and supply it to the ADC. This sensing value may be one for external compensation or one for touch sensing.

The sensing units 122 may be implemented as voltage sensing-type shown in FIG. 5 or current sensing-type shown in FIG. 6.

The voltage sensing-type sensing unit 122 of FIG. 5 senses a voltage stored in a line capacitors LCa of a sensing line 14B according to the Ids of a driving TFT DT, and may comprise a reference voltage control switch SW1, a sampling switch SW2, and a sample and hold portion S/H. The reference voltage control switch SW1 switches on an electrical connection between an input terminal of reference voltage Vref and the sensing line 14B, in response to a reference voltage control signal PRE. The sampling switch SW2 switches on an electrical connection between the sensing line 14B and the sample and hold portion S/H in response to a sampling control signal SAM. If the source node voltage of the driving TFT DT changes according to the Ids of the driving TFT DT, the sample and hold portion S/H samples and holds the source node voltage of the driving TFT DT stored in the line capacitor LCa of the sensing line 14B as a sensed voltage when the sampling switch SW2 is turned on, and then transmits it to the ADC.

The current sensing-type sensing unit 122 of FIG. 6 directly senses the Ids of the driving TFT transmitted through the sensing line 14B, and may comprise a current integrator CI and a sample and hold portion SH. The current integrator CI integrates current data input through the sensing line 14B and generates a sensing value Vsen. The current integrator CI comprises an amplifier AMP comprising an inverting input terminal (−) for receiving the Ids of the driving TFT from the sensing line 14B, a non-inverting input terminal (+) for receiving an amplifier reference voltage Vpre, and an output terminal, an integrating capacitor Cfb connected between the inverting input terminal (−) and output terminal of the amplifier AMP, and a reset switch RST connected to both ends of the integrating capacitor Cfb. The current integrator CI is connected to the ADC through the sample and hold portion SH. The sample and hold portion SH may comprise a sampling switch SASS for sampling a sensing value Vsen output from the amplifier AMP and storing it in a sampling capacitor Cs, and a holding switch HOLD for transmitting the sensing value Vsen stored in the sampling capacitor Cs to the ADC.

The gate drive circuit 13 generates a scan control signal SCAN for image display, external compensation, or touch sensing based on the gate control signal GDC, and then supplies it to the first gate lines 15A. The gate drive circuit 13 generates a sensing control signal SEN for image display, external compensation, or touch sensing based on the gate control signal GDC, and then supplies it to the second gate lines 15B.

The principle of sensing touch input in the touch sensor integrated display device will be briefly described. When a finger or conductive object (hereinafter, collectively referred to as a finger) touches the surface of the display device, with the Vgs of the driving TFT set in advance, the Vgs of the driving TFT changes due to a touch capacitor between the finger and the driving TFT. As the change in the Vgs of the driving TFT leads to a change in the Ids of the driving TFT, a touch can be detected based on the difference in the Ids of the driving TFT between pixels touched with the finger and the other pixels. The Ids is proportional to the square of a difference between Vgs and a threshold voltage of the driving TFT. Thus, the Ids is sensed as an amplified current even if the amount of Vgs change caused by touch input is small, which offers an advantage to enhancing sensing capabilities.

Hereinafter, a concrete driving method for touch sensing under the second driving mode will be described in detail.

Figure 7:
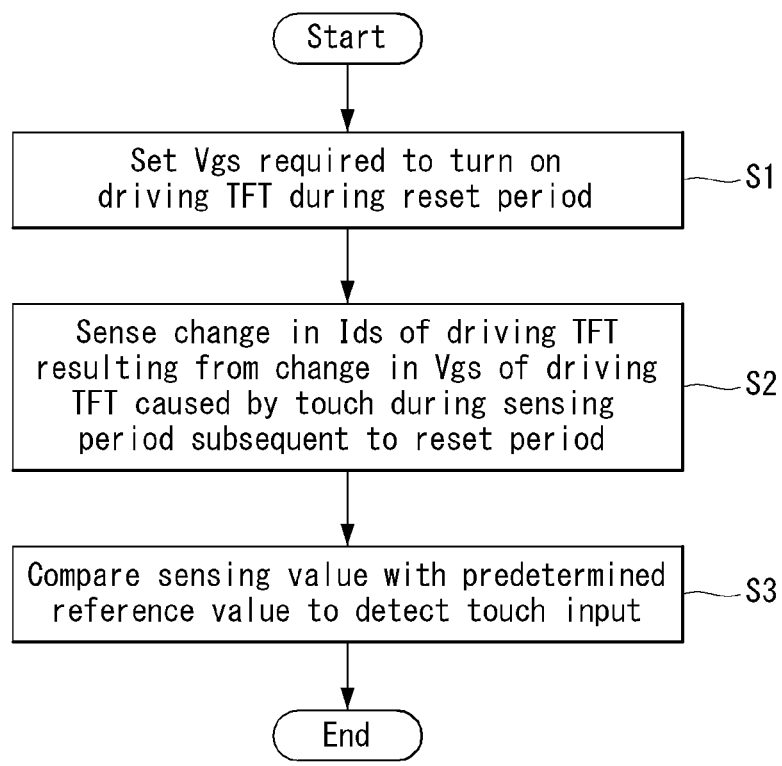
FIG. 7 shows a method of driving a touch sensor integrated display device according to one embodiment.

FIG. 7 shows a method of driving a touch sensor integrated display device according to an exemplary embodiment.

Referring to FIG. 7, a reset period and a sensing period are set based on a scan control signal and sensing control signal that are applied to the gate lines 15A and 15B of the display panel 10 and a reference voltage control signal PRE that controls an electrical connection between the sensing lines 14B and the input terminal of reference voltage Vref (S1).

In one embodiment, during the reset period, a Vgs required to turn on the driving TFT DT is set by applying a data voltage for touch sensing to the gate node Ng of the driving TFT DT through the data line 14A and a reference voltage to the source node Ns of the driving TFT DT through the sensing line 14B (S1). Next, during the sensing period subsequent to the reset period, a sensing value is output by sensing a change in the Ids of the driving TFT DT caused by touch input (S2).

The sensing value is compared with a predetermined reference value to detect touch input (S3).

[First Sensing Approach for Sensing Change in Vgs of Driving TFT]

Figure 8:
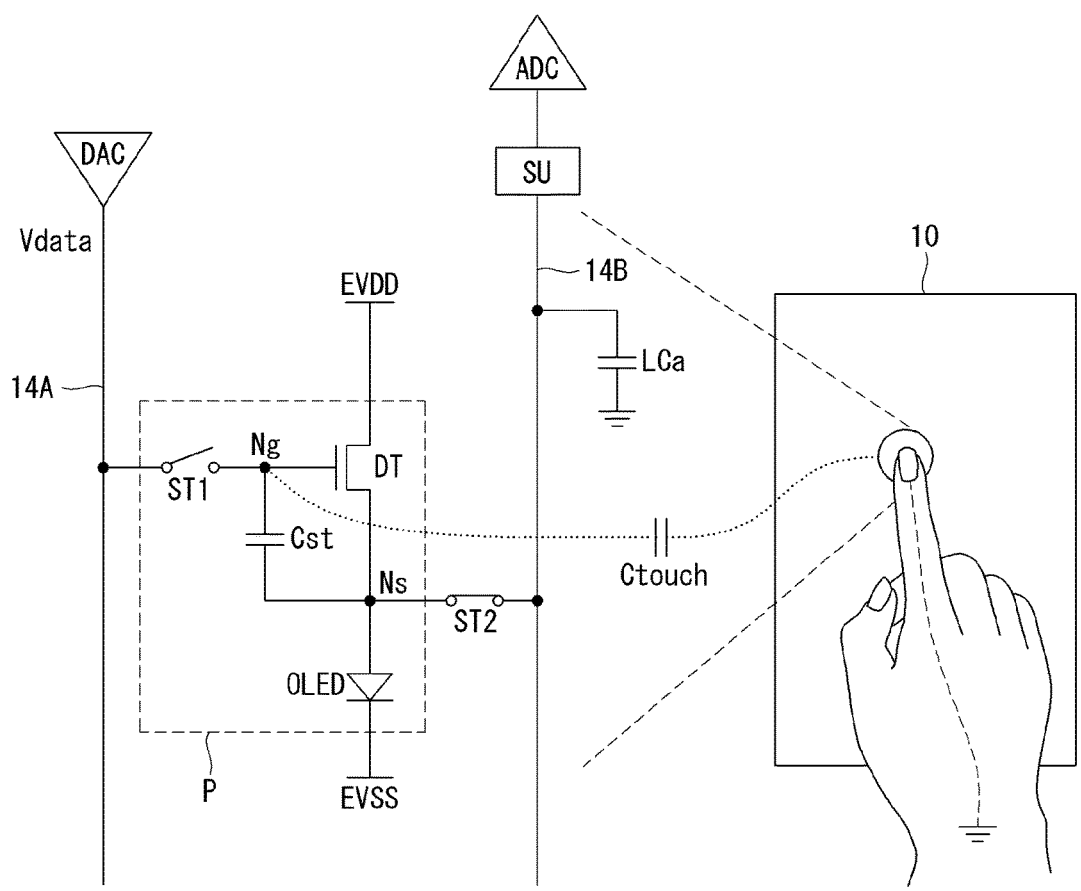
FIG. 8 shows a first sensing approach for sensing a change in a gate source voltage (Vgs) of a driving TFT caused by touch input when a touch capacitor is connected to the gate node of the driving TFT.
Figure 9:
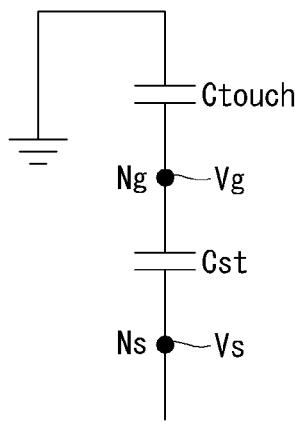
FIG. 9 shows a circuit diagram of a capacitor network for performing touch sensing according to the first sensing approach.

FIGS. 8 and 9 show a first sensing approach for sensing a change in the Vgs of a driving TFT caused by touch input when a touch capacitor is connected to the gate node of the driving TFT.

Referring to FIGS. 8 and 9, when a finger touches the surface of the display device after the Vgs of the driving TFT DT is set in the storage capacitor Cst in the reset period, a touch capacitor Ctouch between the finger and the driving TFT DT is connected to the gate node Ng of the driving TFT DT. The touch capacitor Ctouch connected to the gate node Ng is a finger capacitor between the gate electrode of the driving TFT DT and the finger. As the area contacted by the finger is larger than the area occupied by one pixel, the touch capacitor Ctouch between the finger and the driving TFT DT may be connected to the source node Ns of the driving TFT DT as well. The touch capacitor Ctouch connected to the source node Ns is a finger capacitor between the source electrode of the driving TFT DT and the finger. As the finger capacitor between the source electrode of the driving TFT DT and the finger is smaller than the line capacitor LCa of the sensing line 14B, it has a very small effect on the change in the Vgs of the driving TFT. This is because, in the first sensing approach, the touch capacitor Ctouch induces the change in the Vgs of the driving TFT while the gate node Ng is floating and the source node Ns is connected to the sensing line 14B. Accordingly, in the first sensing approach, it is deemed that there is no finger capacitor between the source electrode of the driving TFT DT and the finger.

When the touch capacitor Ctouch is connected to the gate node Ng while the gate node Ng is floating, the Vgs of the driving TFT DT changes and the Ids of the driving TFT DT therefore changes. By changing the reference voltage applied to the source node Ns when the touch capacitor Ctouch is connected to the gate node Ng while the gate node Ng is floating, the Vgs of the driving TFT DT can be rapidly changed, and the Ids of the driving TFT DT can be therefore rapidly changed.

Figure 10:
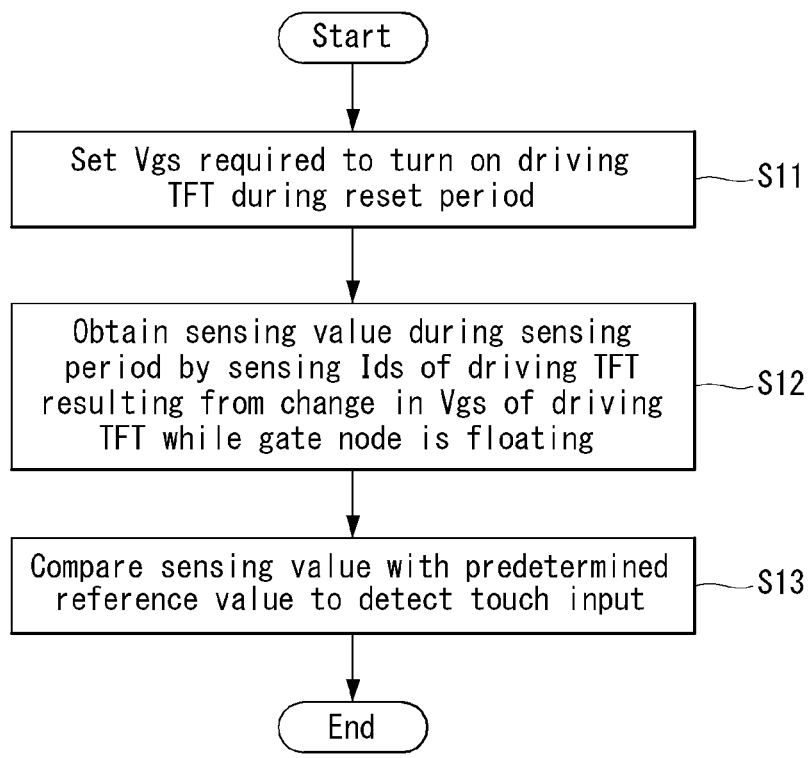
FIG. 10 shows a method of sensing a change in the Vgs of a driving TFT caused by touch input, according to one embodiment of the first sensing approach.
Figure 11:
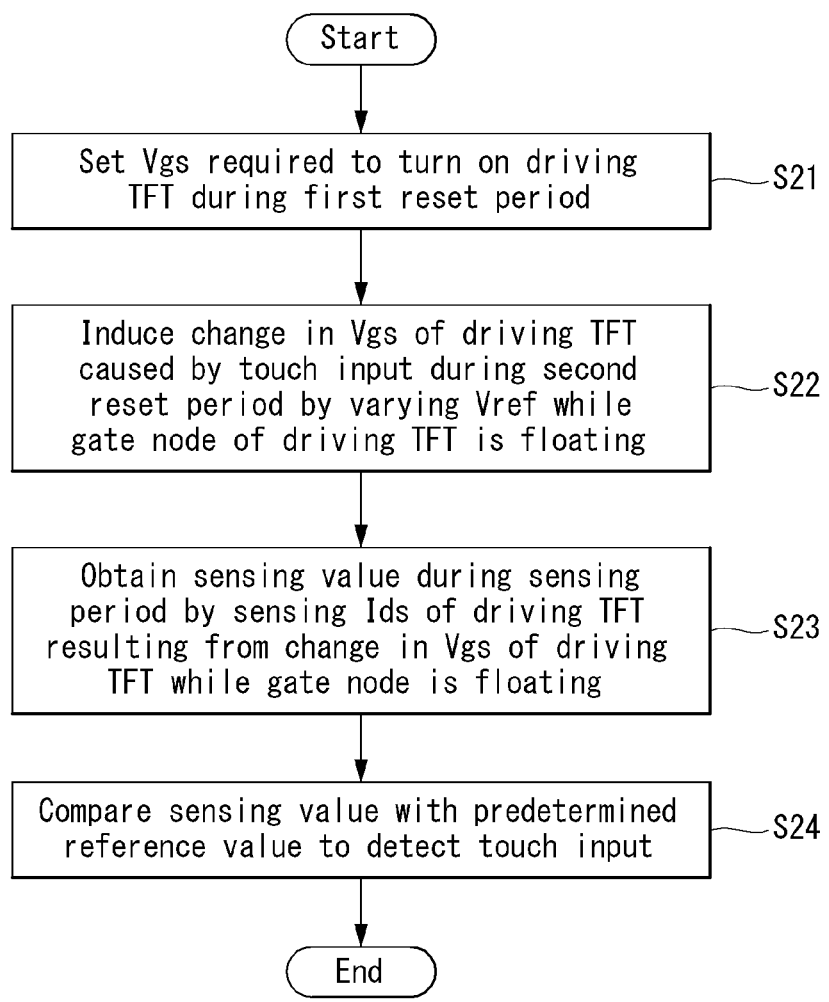
FIG. 11 shows a method of sensing a change in the Vgs of a driving TFT caused by touch input, according to another embodiment of the first sensing approach.

FIGS. 10 and 11 show concrete driving methods for implementing the first sensing approach of FIGS. 8 and 9.

Referring to FIG. 10, in one driving method for implementing the first sensing approach, during the reset period, a Vgs required to turn on the driving TFT DT is set by applying a data voltage for touch sensing to the gate node Ng of the driving TFT DT through the data line 14A and a reference voltage to the source node Ns of the driving TFT DT through the sensing line 14B (S11).

In one driving method, during the sensing period subsequent to the reset period, a sensing value Vsen is obtained by sensing the Ids of the driving TFT DT resulting from change in the Vgs of the driving TFT DT while the gate node Ng is floating (S12). The Ids of the driving TFT DT at a touched area connected to the touch capacitor Ctouch is lower than Ids of a driving TFT DT at an untouched area, and this leads to a decrease in sensing value Vsen.

More concretely, an Ids flows through the driving TFT DT by the Vgs of the driving TFT DT, which is set in the reset period, and the potential Vs of the source node Ns rises by ΔVs due to the Ids. In this case, if the touch capacitor Ctouch is connected to the floating gate node Ng (that is, there is no touch input), the potential of the gate node Ng rises by ΔVs. Thus, there is no change in the Vgs of the driving TFT DT, and the static current mode is maintained. In contrast, if the touch capacitor Ctouch is connected to the floating gate node Ng (that is, there is touch input), the potential of the gate node Ng rises by ΔVs', which is smaller than ΔVs, due to voltage division between the storage capacitor Cst and the touch capacitor Ctouch. Thus, the Vgs of the driving TFT DT decreases compared to the initial one, and as a result, the Ids of the driving TFT DT also decreases.

$$Vgs' = Vgs - (\Delta Vs - \Delta Vs') \qquad \text{[Equation 1]}$$

$$\Delta Vs' = \Delta Vs \times \frac{CST}{(CST + CTOUCH)}$$

That is, the gate-source voltage of the driving TFT DT for the touched area is the Vgs' of Equation 1. Accordingly, the Ids of the driving TFT DT for the touched area is lower than Ids of a driving TFT DT for the untouched area according to the expression of TFT current (Ids=K(Vgs−Vth)$^2$). By sensing this change in the Ids of the driving TFT DT, touch input can be detected. In Equation 1, CST denotes the capacitance of the storage capacitor Cst, and CTOUCH denotes the capacitance of the touch capacitor Ctouch.

In one driving method, touch input is detected by comparing the sensing value Vsen with a stored reference value (S13). As used herein, the reference value is determined based on the Vgs set during the reset period. If the difference between the sensing value Vsen of a pixel and the reference value is smaller than or equal to a threshold, the corresponding position associated with the pixel may be detected as the untouched area, or if the difference between the sensing value Vsen of a pixel and the reference value is greater than the threshold, the corresponding position associated with the pixel may be detected as the touched area.

FIG. 11 shows another driving method for implementing the first sensing approach. The reset period is divided into a first reset period in which the gate node Ng of the driving TFT DT is connected to the data line 14A, and a second reset period in which the gate node Ng of the driving TFT DT is floating.

In another driving method, during the first reset period, a Vgs required to turn on the driving TFT DT is set by applying a data voltage for touch sensing to the gate node Ng of the driving TFT DT through the data line 14A and a reference voltage to the source node Ns of the driving TFT DT through the sensing line 14B (S21).

In another driving method, during the second reset period subsequent to the first reset period, a rapid change in the Vgs of the driving TFT DT is induced by varying (decreasing or increasing) the reference voltage while the gate node Ng of the driving TFT DT is floating (S22). For example, in another driving method, during the second reset period, the reference voltage applied to the source node Ns may decrease by ΔVs while the gate node Ng of the driving TFT DT is floating. In this case, if the touch capacitor Ctouch is not connected to the floating gate node Ng (that is, there is no touch input), the potential of the gate node Ng falls by ΔVs. Thus, there is no change in the Vgs of the driving TFT DT, and the static current mode is maintained. In contrast, if the touch capacitor Ctouch is connected to the floating gate node Ng (that is, there is touch input), the potential of the gate node Ng falls by ΔVs', which is smaller than ΔVs, due to voltage division between the storage capacitor Cst and the touch capacitor Ctouch. Thus, the Vgs of the driving TFT DT increases compared to the initial one, and as a result, the Ids of the driving TFT DT also increases. By inducing a rapid change in the Vgs of the driving TFT DT, the time needed for sensing can be reduced.

In another driving method, during the sensing period subsequent to the second reset period, a sensing value Vsen is obtained by sensing the Ids of the driving TFT DT resulting from the change in the Vgs of the driving TFT DT while the gate node Ng is floating (S23). The Ids of the driving TFT DT at a touched area connected to the touch capacitor Ctouch is different from Ids of a driving TFT DT at an untouched area, and this leads to a difference in sensing value Vsen. By sensing this change in the Ids of the driving TFT DT, touch input can be detected.

In another driving method, touch input is detected by comparing the sensing value Vsen with a stored reference value (S24). As used herein, the reference value is determined based on the Vgs set during the first reset period. If the difference between the sensing value Vsen of a pixel and the reference value is smaller than or equal to a threshold, the corresponding position associated with the pixel may be detected as the untouched area, or if the difference between the sensing value Vsen of a pixel and the reference value is greater than the threshold, the corresponding position associated with the pixel may be detected as the touched area.

[Second Sensing Approach for Sensing Change in Vgs of Driving TFT]

Figure 12:
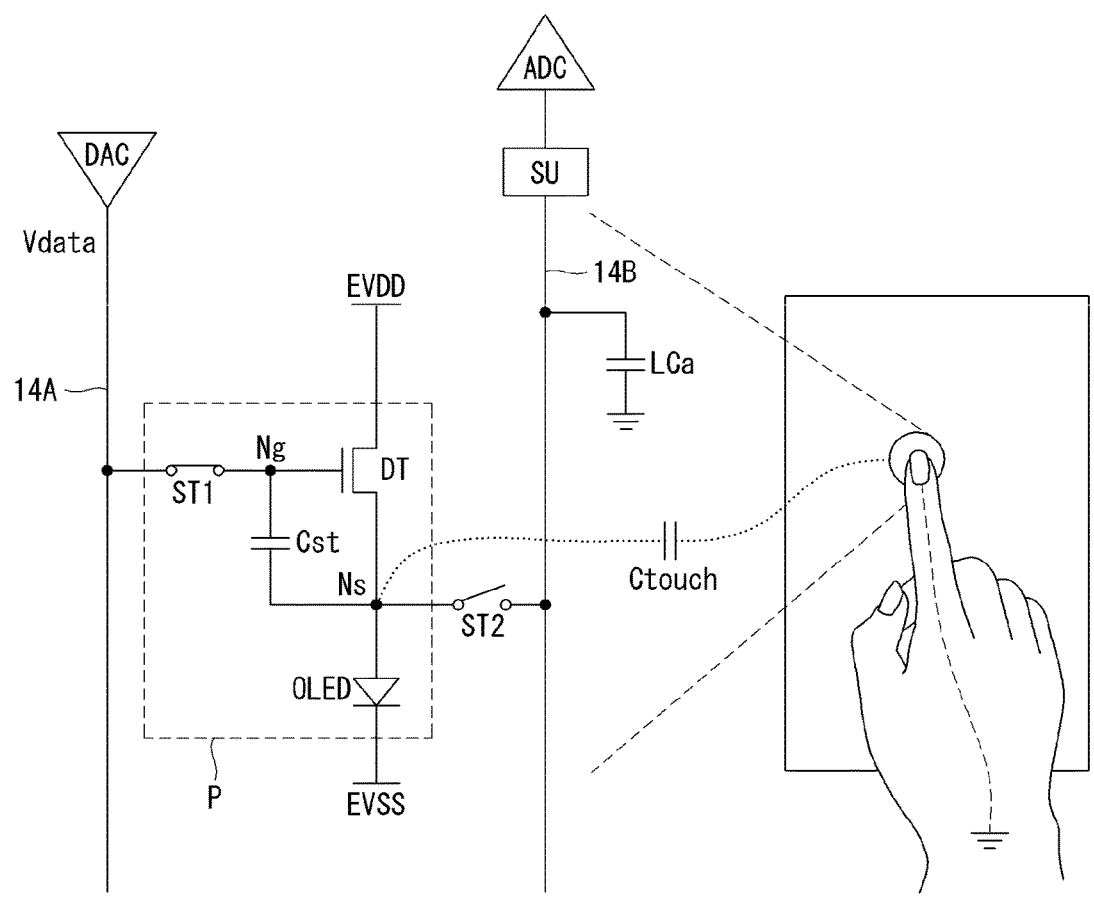
FIG. 12 shows a second sensing approach for sensing a change in the Vgs of a driving TFT caused by touch input when a touch capacitor is connected to the gate node of the driving TFT.
Figure 13:
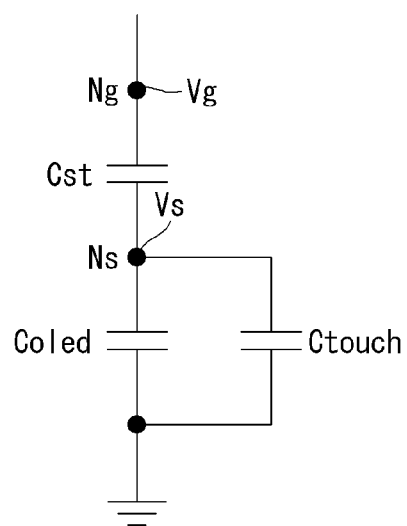
FIG. 13 shows a circuit diagram of a capacitor network for performing touch sensing according to the second approach.

FIGS. 12 and 13 show a second sensing approach for sensing a change in the Vgs of a driving TFT caused by touch input when a touch capacitor is connected to the gate node of the driving TFT.

Referring to FIGS. 12 and 13, when a finger touches the surface of the display device after the Vgs of the driving TFT DT is set in the storage capacitor Cst in the reset period, a touch capacitor Ctouch between the finger and the driving TFT DT is connected to the source node Ns of the driving TFT DT. The touch capacitor Ctouch connected to the source node Ns is a finger capacitor between the source node of the driving TFT DT and the finger. As the area contacted by the finger is larger than the area occupied by one pixel, the touch capacitor Ctouch between the finger and the driving TFT DT may be connected to the gate node Ng of the driving TFT DT as well. The touch capacitor Ctouch connected to the gate node Ng is a finger capacitor between the gate electrode of the driving TFT DT and the finger. The finger capacitor between the gate electrode of the driving TFT DT and the finger has no effect on the potential of the gate node Ng. This is because, in the second sensing approach, the touch capacitor Ctouch induces the change in the Vgs of the driving TFT while the potential of the gate node Ng is fixed and the source node Ns is floating. Accordingly, in the second sensing approach, it is deemed that there is no finger capacitor between the gate electrode of the driving TFT DT and the finger.

When the touch capacitor Ctouch is connected to the source node Ns while the source node Ns is floating, the Vgs of the driving TFT DT changes, thus the Ids of the driving TFT DT changes accordingly. By changing the data voltage for touch sensing applied to the gate node Ng when the touch capacitor Ctouch is connected to the source node Ns while the source node Ns is floating, the Vgs of the driving TFT DT can be rapidly changed, and the Ids of the driving TFT DT can be therefore rapidly changed.

Figure 14:
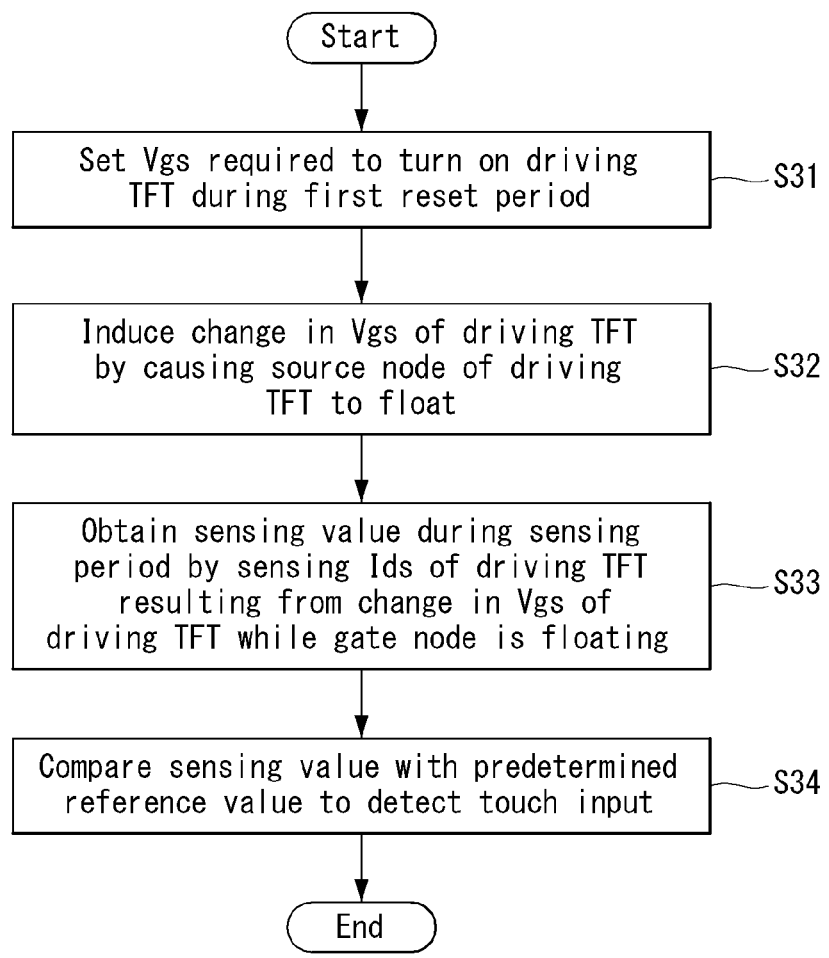
FIG. 14 shows a method of sensing a change in the Vgs of a driving TFT caused by touch input, according to one embodiment of the second sensing approach.
Figure 15:
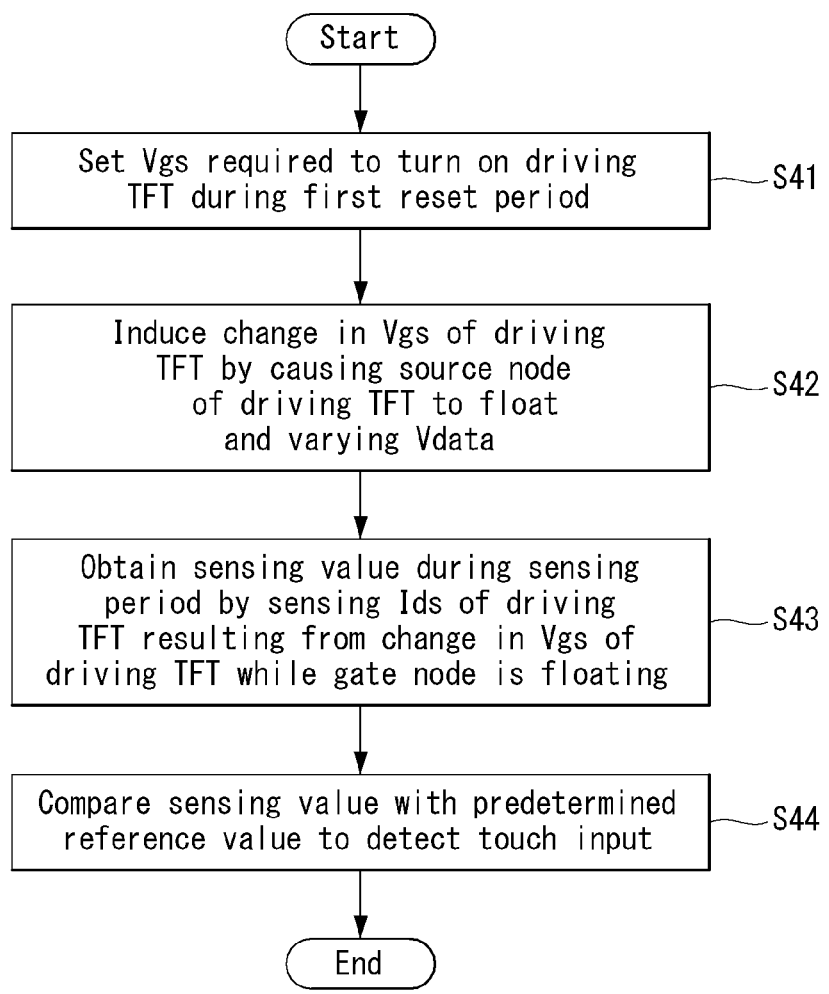
FIG. 15 shows a method of sensing a change in the Vgs of a driving TFT caused by touch input, according to another embodiment of the second sensing approach.

FIGS. 14 and 15 show concrete driving methods for implementing the second sensing approach for sensing a change in the Vgs of a driving TFT caused by touch input.

Referring to FIG. 14, in one driving method for implementing the second sensing approach, the reset period is divided into a first reset period in which the source node Ns of the driving TFT DT is connected to the input terminal of reference voltage, and a second reset period in which the source node Ns of the driving TFT DT is floating.

In one driving method, during the first reset period, a Vgs required to turn on the driving TFT DT is set by applying a data voltage for touch sensing to the gate node Ng of the driving TFT DT through the data line 14A and a reference voltage to the source node Ns of the driving TFT DT through the sensing line 14B (S31).

In one driving method, during the second reset period subsequent to the first reset period, a rapid change in the Vgs of the driving TFT DT is induced by causing the source node Ns of the driving TFT DT to float and operating the driving TFT DT as a source follower type (S32).

In one driving method, during the sensing period subsequent to the reset period, a sensing value Vsen is obtained by sensing the Ids of the driving TFT DT resulting from the change in the Vgs of the driving TFT DT while the gate node Ng is floating (S33). The Ids of the driving TFT DT at a touched area connected to the touch capacitor Ctouch is higher than Ids of a driving TFT DT at an untouched area, and this leads to an increase in sensing value Vs en.

More concretely, an Ids flows through the driving TFT DT by the Vgs of the driving TFT DT, which is set in the first reset period, the potential Vs of the source node Ns rises in the second reset period due to the Ids, and the potential Vg of the gate node Ng is fixed at the data voltage for touch driving in the second reset period. In this case, the amount of increase in the potential Vs of the source node Ns differs depending on whether the touch capacitor Ctouch is connected to the floating source node Ns (that is, there is touch input) or not (that is, there is no touch input). Due to voltage division between a parasitic capacitor Coled at two ends of the OLED and the touch capacitor Ctouch, the amount ΔVs of increase in the potential Vs of the source node Ns observed when there is touch input is expressed by Equation 2:

$$Vgs' = Vgs - \Delta Vs \quad \text{[Equation 2]}$$
$$\Delta Vs = \frac{Ids \times \Delta t}{(COLED + CTOUCH)}$$

On the contrary, the amount ΔVs of increase in the potential Vs of the source node Ns observed when there is no touch input is not affected by the touch capacitor Ctouch, and therefore the amount ΔVs without the touch capacitor Ctouch becomes Ids*Δt/COLED, which is greater than that observed when there is touch input. That is, when the touch capacitor Ctouch is connected to the floating source node Ns, the potential Vs of the source node Ns rises by a smaller amount than that observed when the touch capacitor Ctouch is not connected to the floating source node Ns. Thus, the Vgs of the driving TFT DT increases relatively, and as a result, the Ids of the driving TFT DT also increases. In Equation 2, COLED denotes the capacitance of the OLED capacitor Coled, and CTOUCH denotes the capacitance of the touch capacitor Ctouch.

In one driving method, touch input is detected by comparing the sensing value Vsen with a stored reference value (S34). As used herein, the reference value is determined based on the Vgs set during the reset period. If the difference between the sensing value Vsen of a pixel and the reference value is smaller than or equal to a threshold, the corresponding position associated with the pixel may be detected as the untouched area, or if the difference between the sensing value Vsen of a pixel and the reference value is greater than the threshold, the corresponding position associated with the pixel may be detected as the touched area.

FIG. 15 shows another driving method for implementing the second sensing approach. The reset period is divided into a first reset period in which the source node Ns of the driving TFT DT is connected to the input terminal of reference voltage, and a second reset period in which the source node Ns of the driving TFT DT is floating.

In another driving method, during the first reset period, a Vgs required to turn on the driving TFT DT is set by applying a data voltage for touch sensing to the gate node Ng of the driving TFT DT through the data line 14A and a reference voltage to the source node Ns of the driving TFT DT through the sensing line 14B (S41).

In another driving method, during the second reset period subsequent to the first reset period, a rapid change in the Vgs of the driving TFT DT is induced by causing the source node Ns of the driving TFT DT to float, operating the driving TFT DT as a source follower type, and varying (decreasing or increasing) the data voltage for touch sensing (S42). For example, in another driving method, during the second reset period, the data voltage for touch sensing applied to the gate node Ng may decrease by ΔVg while the source node Ns of the driving TFT DT is floating. In this case, if the touch capacitor Ctouch is not connected to the floating source node Ns (that is, there is no touch input), the potential of the source node Ns falls by ΔVg and gradually rises according to the source follower method. In contrast, if the touch capacitor Ctouch is connected to the floating source node Ns (that is, there is touch input), the potential of the source node Ns falls by ΔVg', which is smaller than ΔVg, due to voltage division between the parasitic capacitor Coled at two ends of the OLED and the touch capacitor Ctouch. Thus, the Vgs of the driving TFT DT decreases according to the touch capacitor Ctouch, and as a result, the Ids of the driving TFT DT also decreases accordingly. By inducing a rapid change in the Vgs of the driving TFT DT, the time needed for sensing can be reduced.

In another driving method, during the sensing period subsequent to the second reset period, a sensing value Vsen is obtained by sensing the Ids of the driving TFT DT resulting from the change in the Vgs of the driving TFT DT while the gate node Ng is floating (S43). The Ids of the driving TFT DT at a touched area connected to the touch capacitor Ctouch is different from Ids of a driving TFT DT at an untouched area, and this leads to a difference in sensing value Vsen. By sensing this change in the Ids of the driving TFT DT, touch input can be detected.

In another driving method, touch input is detected by comparing the sensing value Vsen with a stored reference value (S44). As used herein, the reference value is determined based on the Vgs set during the first reset period. If the difference between the sensing value Vsen of a pixel and the reference value is smaller than or equal to a threshold, the corresponding position associated with the pixel may be detected as the untouched area, or if the difference between the sensing value Vsen of a pixel and the reference value is greater than the threshold, the corresponding position associated with the pixel may be detected as the touched area.

[First Driving Example for Implementing First Sensing Approach]

Figure 16:
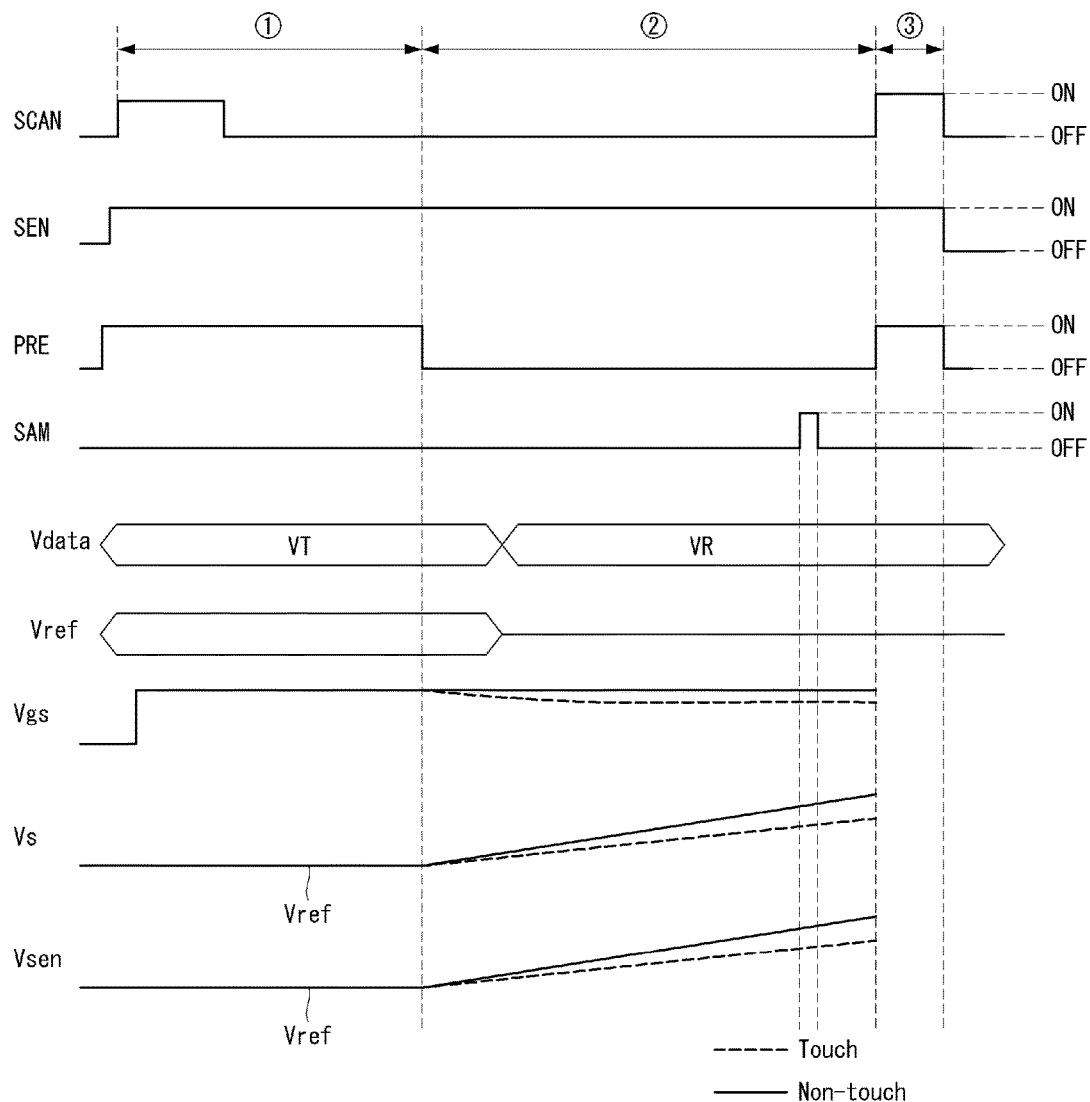
FIG. 16 shows signal waveforms according to the driving method of FIG. 10.
Figure 17A:
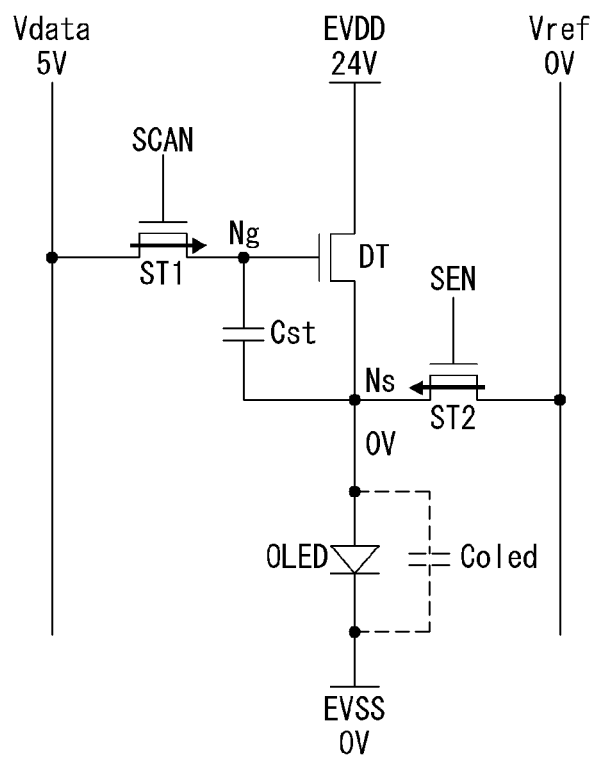
FIG. 17A shows an operation of a pixel during a reset period.
Figure 17B:
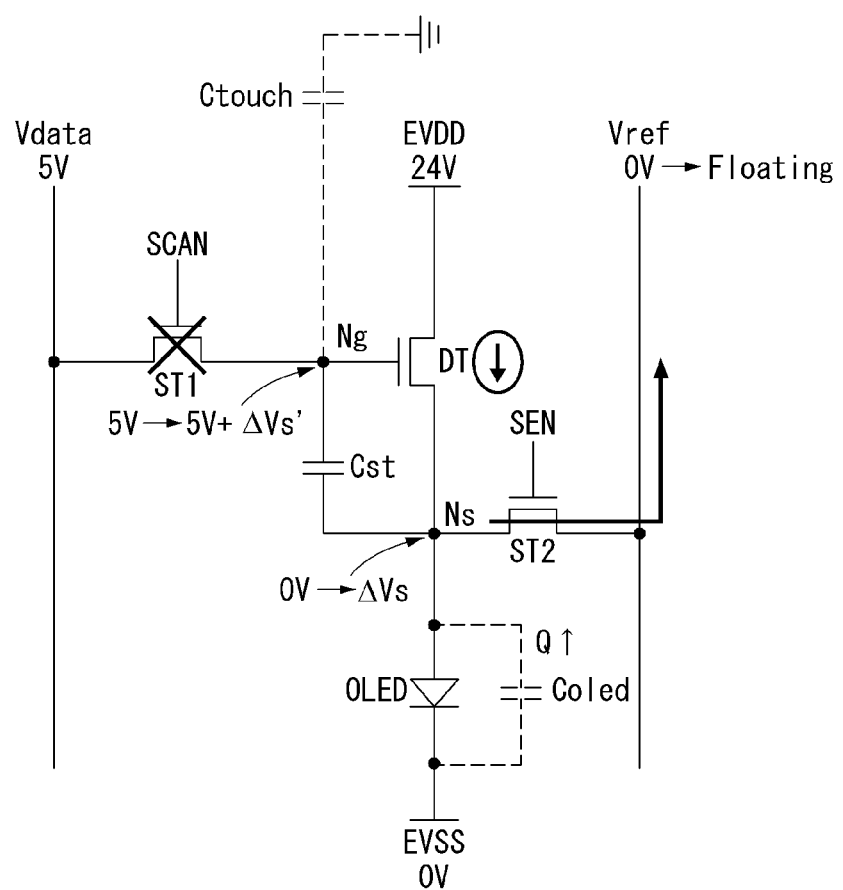
FIG. 17B shows an operation of a pixel during a sensing period.
Figure 18:
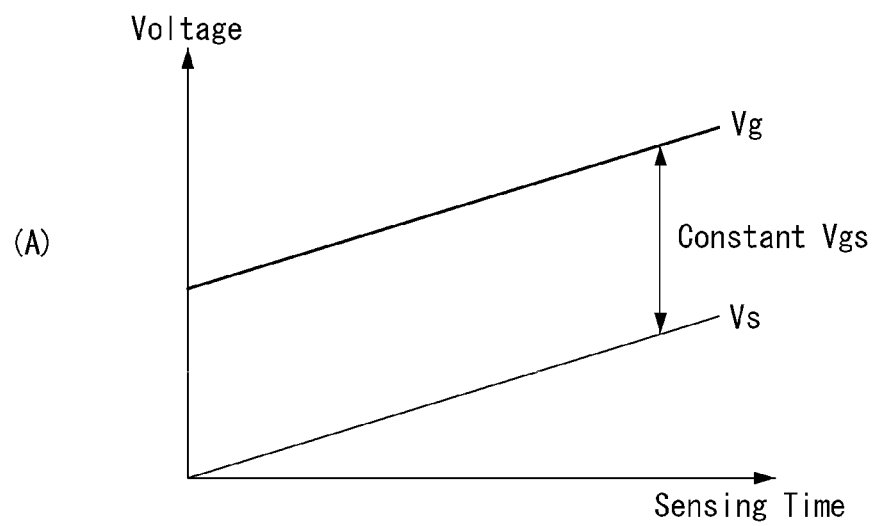
FIG. 18 shows voltages at a gate and a source of a driving transistor for sensing a touch according to the driving method of FIG. 10.
Figure 18:
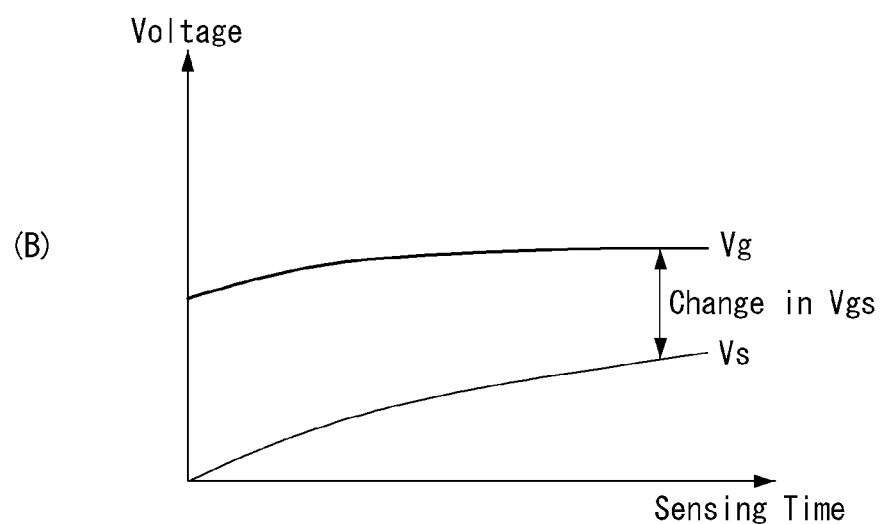
Figure 19:
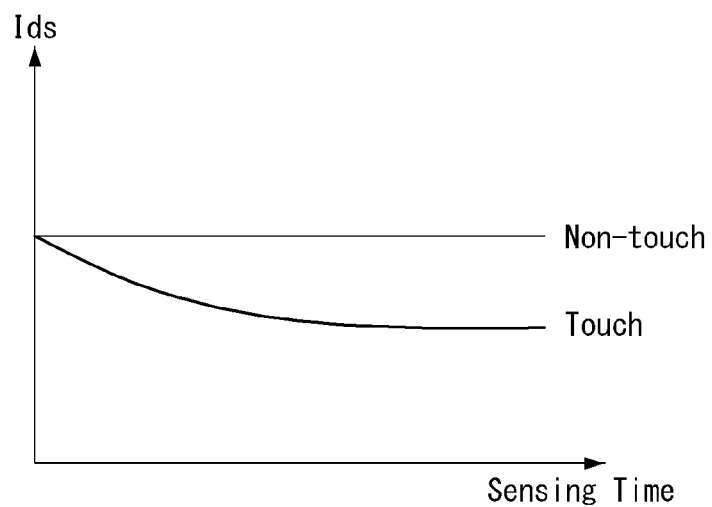
FIG. 19 shows current through the driving transistor for sensing a touch according to the driving method of FIG. 10.

FIG. 16 shows signal waveforms according to the driving method of FIG. 10. FIGS. 17A and 17B show how a pixel operates during a reset period and a sensing period. FIG. 18 shows voltages at a gate and a source of a driving transistor for sensing a touch according to the driving method of FIG. 10. FIG. 19 shows current through the driving transistor for sensing a touch according to the driving method of FIG. 10.

Referring to FIG. 16, one driving method for implementing the first sensing approach comprises a reset period ①  for touch sensing and a sensing period ②, and may further comprise an image restoration period ③.

Referring to FIGS. 16 and 17A, during the reset period ①, the first switching TFT ST1 is turned on in response to a scan control signal SCAN of ON level, the second switching TFT ST2 is turned on in response to a sensing control signal SEN of ON level, and the reference voltage control switch SW1 is turned on in response to a reference voltage control signal PRE of ON level. During the reset period ①, a data voltage VT (e.g., 5 V) for touch sensing is applied to the gate node Ng of the driving TFT DT, and a reference voltage Vref (e.g., 0 V) is applied to the source node Ns of the driving TFT DT. Thus, a Vgs required to turn on the driving TFT DT (which is higher than a threshold voltage Vth) is set.

Referring to FIGS. 16 and 17B, during the sensing period ②, the first switching TFT ST1 is turned off in response to a scan control signal SCAN of OFF level, the second switching TFT ST2 is turned on in response to a sensing control signal SEN of ON level, and the reference voltage control switch SW1 is turned off in response to a reference voltage control signal PRE of OFF level. During the sensing period ②, the gate node Ng of the driving TFT DT is disconnected from the data line and floats, and the source node Ns of the driving TFT DT is disconnected from the input terminal of reference voltage Vref and floats.

While the gate node Ng of the driving TFT DT and the source node Ns of the driving TFT DT are floating, the potential of the source node Ns of the driving TFT DT rises by ΔVs due to the Ids. In this case, if the touch capacitor Ctouch is not connected to the floating gate node Ng (that is, there is no touch input), the potential of the gate node Ng rises by ΔVs. Thus, as shown in (A) of FIG. 18, there is no change in the Vgs of the driving TFT DT, and the static current mode is maintained. In contrast, if the touch capacitor Ctouch is connected to the floating gate node Ng (that is, there is touch input), the potential of the gate node Ng rises by ΔVs', which is smaller than ΔVs, due to voltage division between the storage capacitor Cst and the touch capacitor Ctouch, and therefore, as shown in (B) of FIG. 18, the Vgs of the driving TFT DT decreases. Thus, as shown in FIG. 19, the Ids of the driving TFT DT of the touched pixel is lower than Ids of a driving TFT DT of the untouched pixel. A sampling unit samples the Ids of the driving TFT DT as a sensing value Vsen in response to a sampling signal SAM of ON level. In one aspect, the source node of the driving TFT DT is maintained below a turn-on voltage (e.g., 9V) of the OLED during the reset period ① and the sensing period ②, such that the OLED does not emit light during the reset period ① and the sensing period ②.

The image restoration period ③ is needed to maintain image integrity before and after touch sensing. During the image restoration period ③, a data line and the gate node Ng of the driving TFT DT are electrically connected by the turn on of the first switching TFT ST1 in response to a scan control signal SCAN of ON level, a sensing line and the source node Ns of the driving TFT DT are electrically connected by the turn on of the second switching TFT ST2 in response to a sensing control signal SEN of ON level, and the input terminal of reference voltage Vref and the sensing line are electrically connected in response to a reference voltage control signal PRE of ON level. Accordingly, during the image restoration period ③, a data voltage VR for image restoration is applied to the gate node Ng of the driving TFT DT, and a reference voltage Vref is applied to the source node Ns of the driving TFT DT. The driving TFT DT allows for displaying the same image before and after touch sensing by supplying an Ids, determined by the difference between the data voltage VR for image restoration and the reference voltage Vref, to the OLED and causing the OLED to emit light.

[Second Driving Example for Implementing First Sensing Approach]

Figure 20:
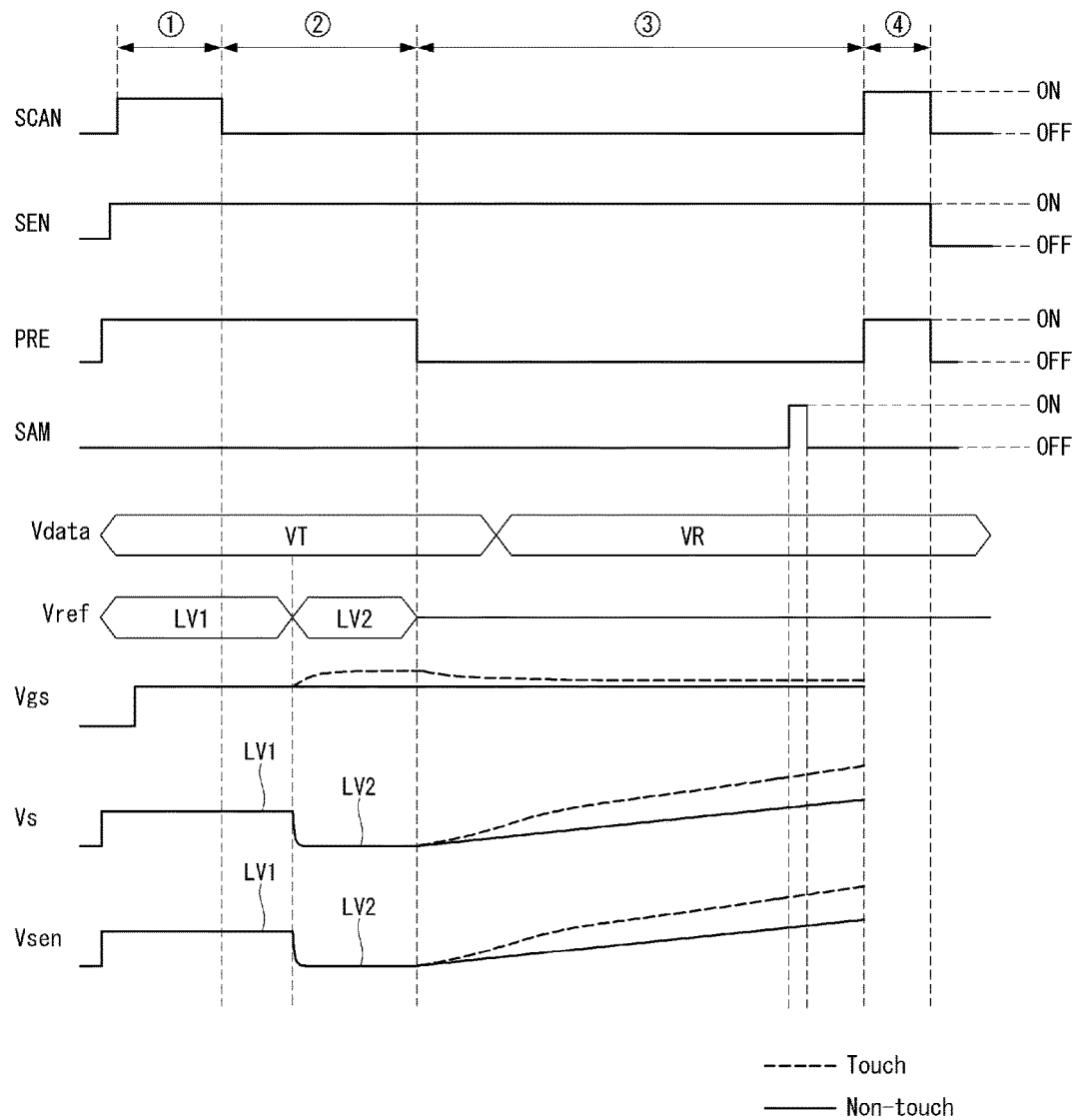
FIG. 20 shows signal waveforms according to the driving method of FIG. 11.
Figure 21A:
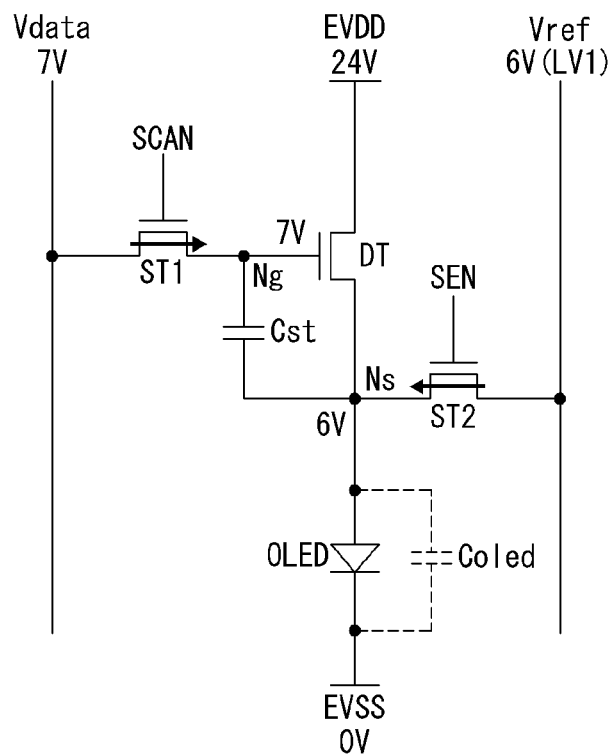
FIG. 21A shows how a pixel operates during a first reset period, according to the driving method of FIG. 11.
Figure 21B:
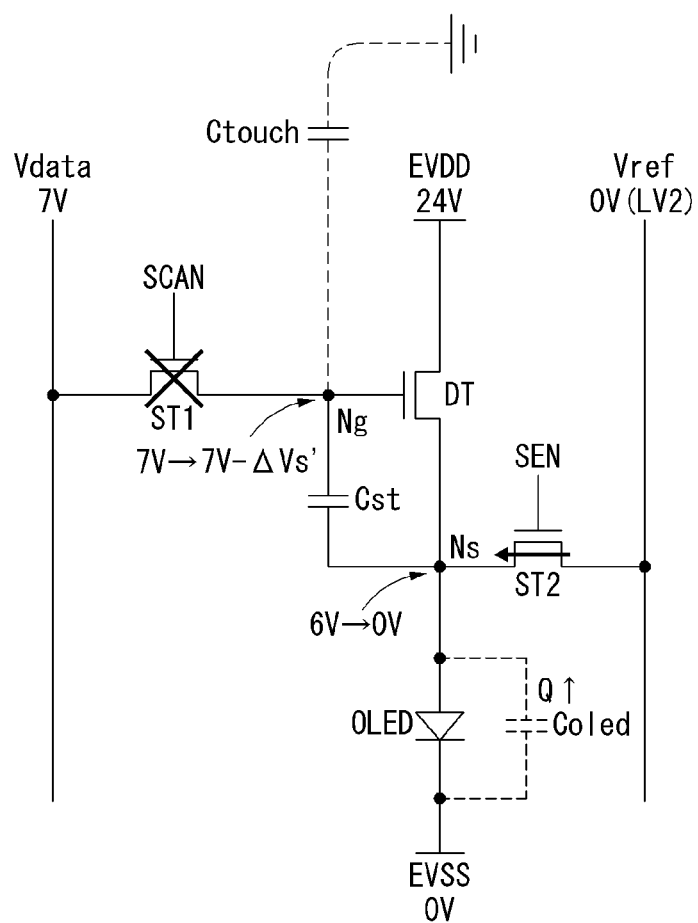
FIG. 21B shows how a pixel operates during a second reset period, according to the driving method of FIG. 11.
Figure 21C:
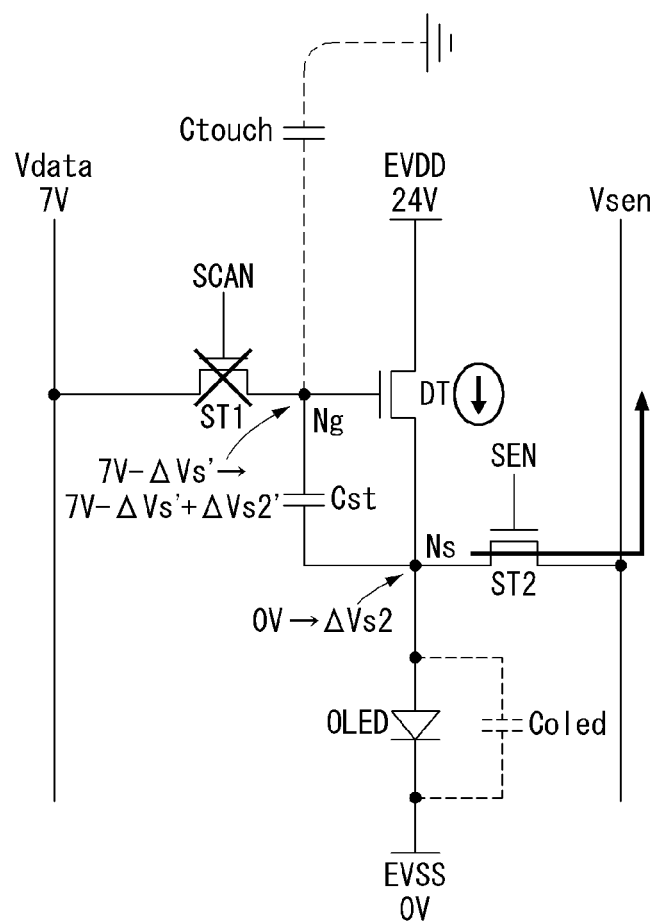
FIG. 21C shows how a pixel operates during a sensing period, according to the driving method of FIG. 11.
Figure 22:
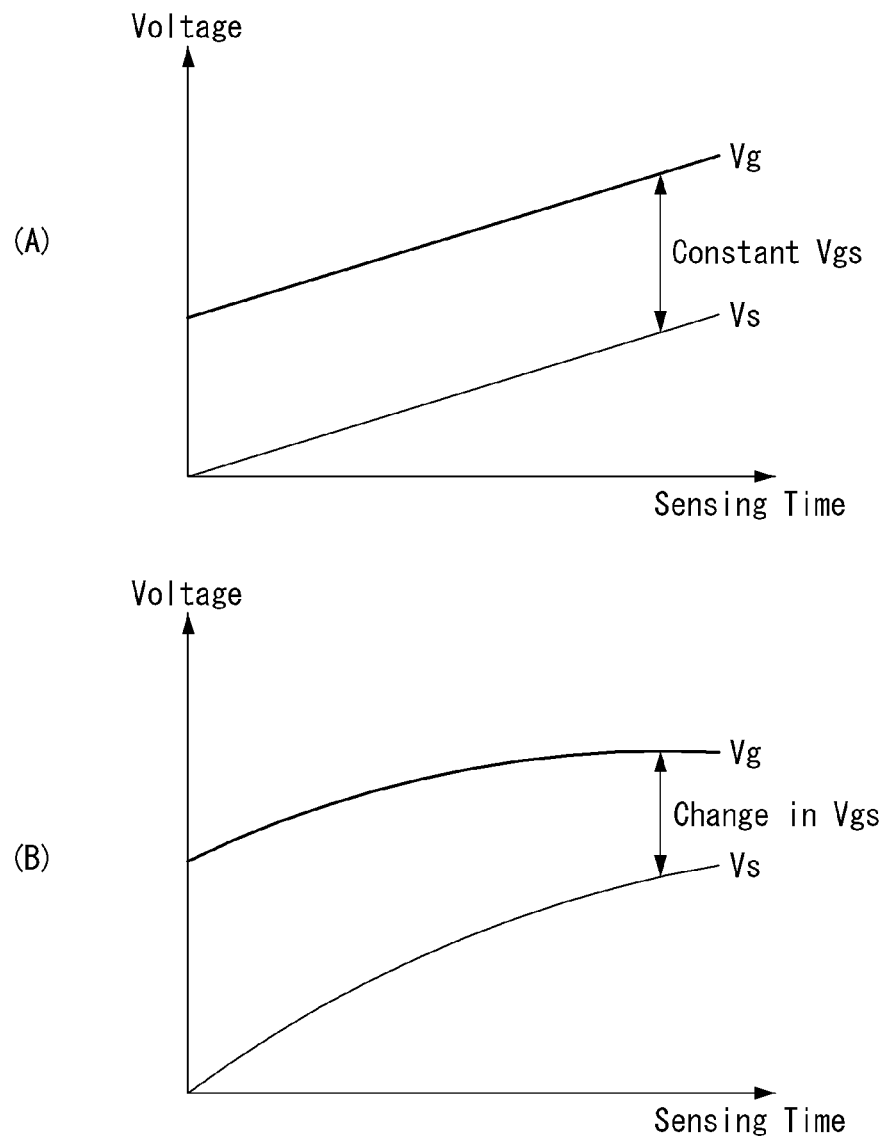
FIG. 22 shows voltages at a gate and a source of a driving transistor for sensing a touch according to the driving method of FIG. 11.
Figure 23:
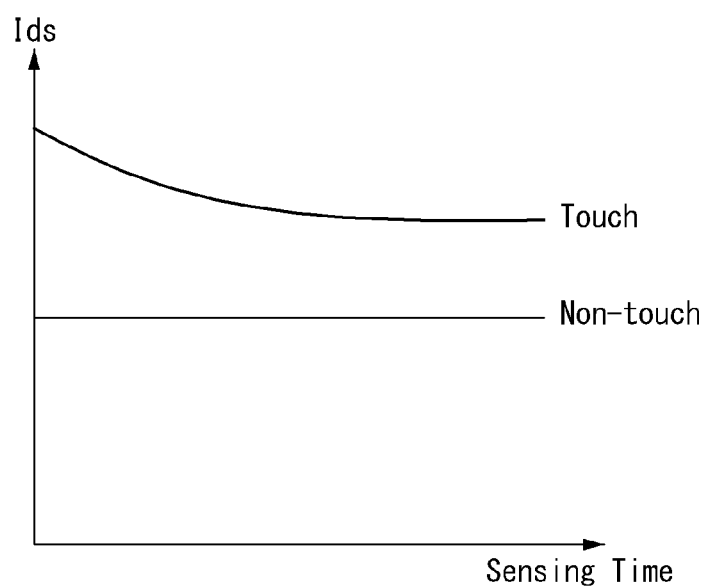
FIG. 23 shows current through the driving transistor for sensing a touch according to the driving method of FIG. 11.

FIG. 20 shows signal waveforms according to the driving method of FIG. 11. FIGS. 21A, 21B, and 21C show how a pixel operates during a first reset period, a second reset period, and a sensing period. FIG. 22 shows voltages at a gate and a source of a driving transistor for sensing a touch according to the driving method of FIG. 11. FIG. 23 shows current through the driving transistor for sensing a touch according to the driving method of FIG. 11.

Referring to FIG. 20, another driving method for implementing the first sensing approach comprises a first reset period ① and second reset period ① for touch sensing and a sensing period ③, and may further comprise an image restoration period ④.

Referring to FIGS. 20 and 21A, during the first reset period ①, the first switching TFT ST1 is turned on in response to a scan control signal SCAN of ON level, the second switching TFT ST2 is turned on in response to a sensing control signal SEN of ON level, and the reference voltage control switch SW1 is turned on in response to a reference voltage control signal PRE of ON level. During the first reset period ①, a data voltage VT (e.g., 7 V) for touch sensing is applied to the gate node Ng of the driving TFT DT, and a reference voltage Vref (e.g., 6 V) of first level (LV1) is applied to the source node Ns of the driving TFT DT. Thus, a Vgs required to turn on the driving TFT DT (which is higher than a threshold voltage Vth) is set.

Referring to FIGS. 20 and 21B, during the second reset period ②, the first switching TFT ST1 is turned off in response to a scan control signal SCAN of OFF level, the second switching TFT ST2 is turned on in response to a sensing control signal SEN of ON level, and the reference voltage control switch SW1 is turned on in response to a reference voltage control signal PRE of ON level. During the second reset period ②, the gate node Ng of the driving TFT DT is disconnected from the data line and floats, and a reference voltage Vref (e.g., 0 V) of second level (LV2), which is lower than the first level (LV1), is applied to the source node Ns of the driving TFT DT and therefore the potential decreases by ΔVs (e.g., 6 V).

During the second reset period ②, if the touch capacitor Ctouch is not connected to the floating gate node Ng (that is, there is no touch input), the potential of the gate node Ng falls by ΔVs (e.g., 6 V). Thus, there is no change in the Vgs of the driving TFT DT, and the static current mode is maintained. In contrast, if the touch capacitor Ctouch is connected to the floating gate node Ng (that is, there is touch input), the potential of the gate node Ng falls by ΔVs', which is smaller than ΔVs (e.g., 6 V), due to voltage division between the storage capacitor Cst and the touch capacitor Ctouch. Thus, the Vgs of the driving TFT DT increases, and as a result, the Ids of the driving TFT DT also increases. By inducing a rapid change in the Vgs of the driving TFT DT, the time needed for sensing can be reduced.

Referring to FIGS. 20 and 21C, during the sensing period ③, the first switching TFT ST1 is turned off in response to a scan control signal SCAN of OFF level, the second switching TFT ST2 is turned on in response to a sensing control signal SEN of ON level, and the reference voltage control switch SW1 is turned off in response to a reference voltage control signal PRE of OFF level. During the sensing period ③, the gate node Ng of the driving TFT DT is disconnected from the data line and floats, and the source node Ns of the driving TFT DT is disconnected from the input terminal of reference voltage Vref and floats.

While the gate node Ng of the driving TFT DT and the source node Ns of the driving TFT DT are floating, the potential of the source node Ns of the driving TFT DT rises by ΔVs2 due to the Ids. In this case, if the touch capacitor Ctouch is not connected to the floating gate node Ng (that is, there is no touch input), the potential of the gate node Ng rises by ΔVs2. Thus, as shown in (A) of FIG. 22, there is no change in the Vgs of the driving TFT DT, and the static current mode is maintained. In contrast, if the touch capacitor Ctouch is connected to the floating gate node Ng (that is, there is touch input), the potential of the gate node Ng rises by ΔVs2', which is smaller than ΔVs2, due to voltage division between the storage capacitor Cst and the touch capacitor Ctouch, and therefore, as shown in (B) of FIG. 22, the Vgs of the driving TFT DT changes. The Vgs of a driving TFT DT to which touch input is applied already has increased relatively in the second reset period ②, compared to the Vgs of a driving TFT DT to which no touch input is applied. Thus, even if the Vgs of the driving TFT DT to which touch input is applied changes to a lower level, it is still higher than that of the driving TFT DT to which no touch input is applied. Thus, as shown in FIG. 23 the Ids of the driving TFT DT of the touched pixel is higher than Ids of a driving TFT DT of the untouched pixel. A sampling unit samples the Ids of the driving TFT DT as a sensing value Vsen in response to a sampling signal SAM of ON level. In one aspect, the source node of the driving TFT DT is maintained below a turn-on voltage (e.g., 9V) of the OLED during the first reset period □, the second reset period ②, and the sensing period ③, such that the OLED does not emit light during the first reset period ①, the second reset period ②, and the sensing period ③.

The operational effects of the image restoration period ④ are identical to those set forth above.

[First Driving Example for Implementing Second Sensing Approach]

Figure 24:
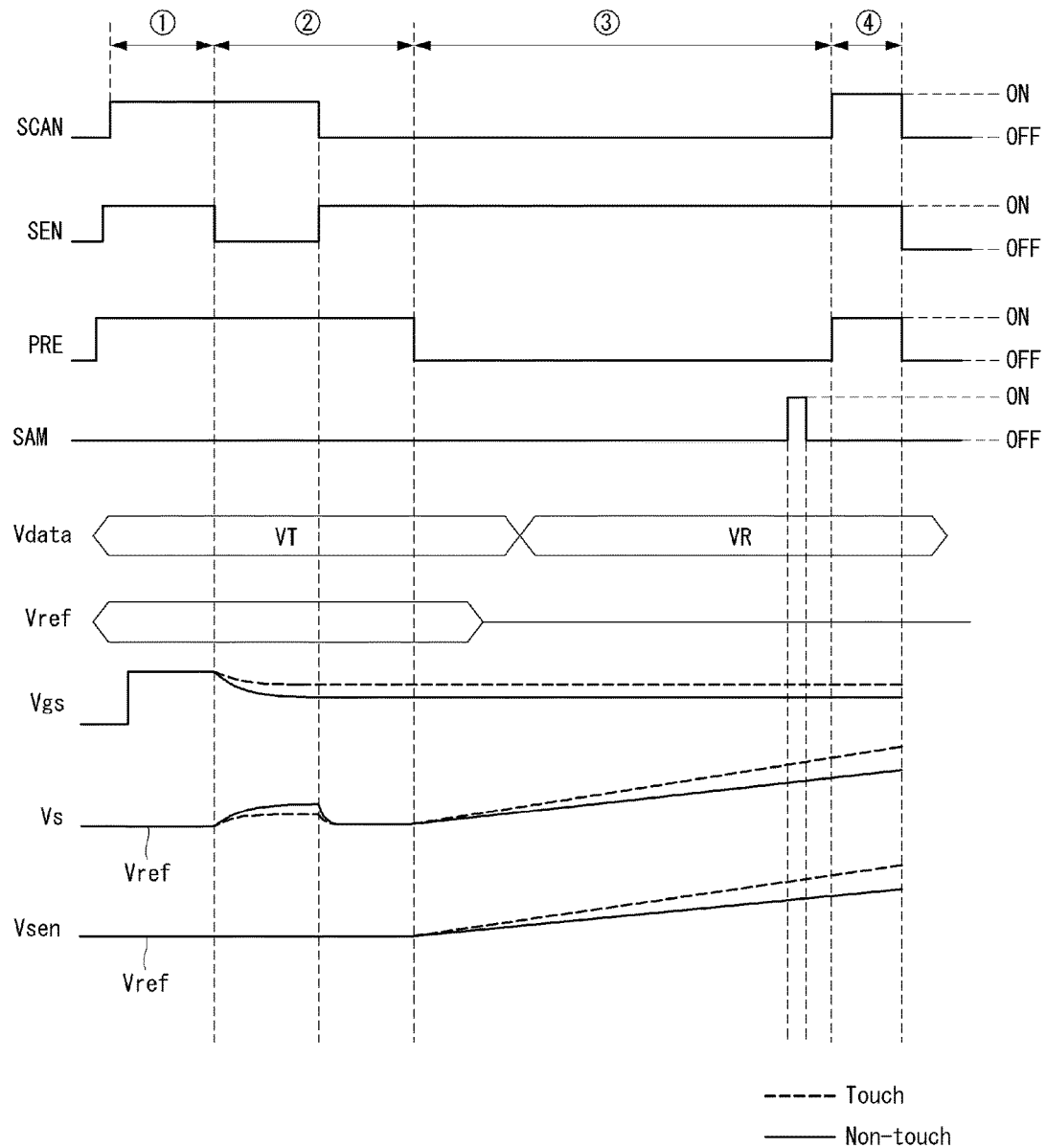
FIG. 24 shows signal waveforms according to the driving method of FIG. 14.
Figure 25A:
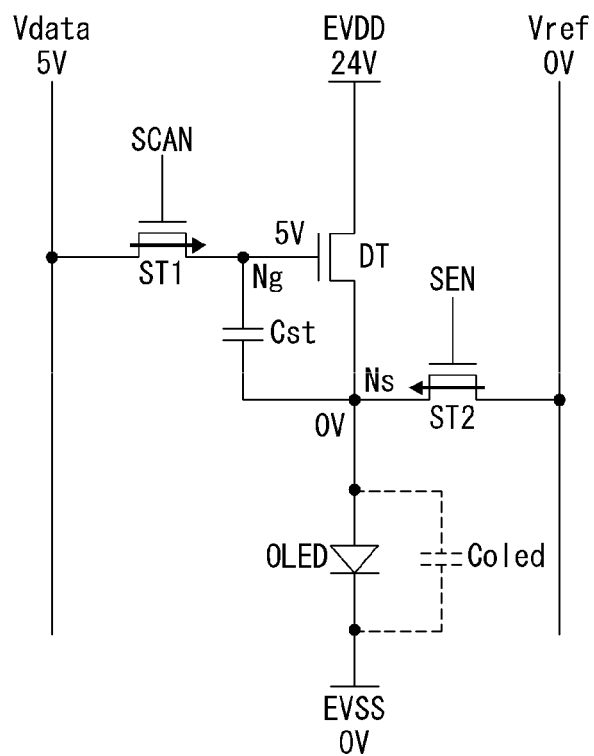
FIG. 25A shows how a pixel operates during a first reset period, according to the driving method of FIG. 14.
Figure 25B:
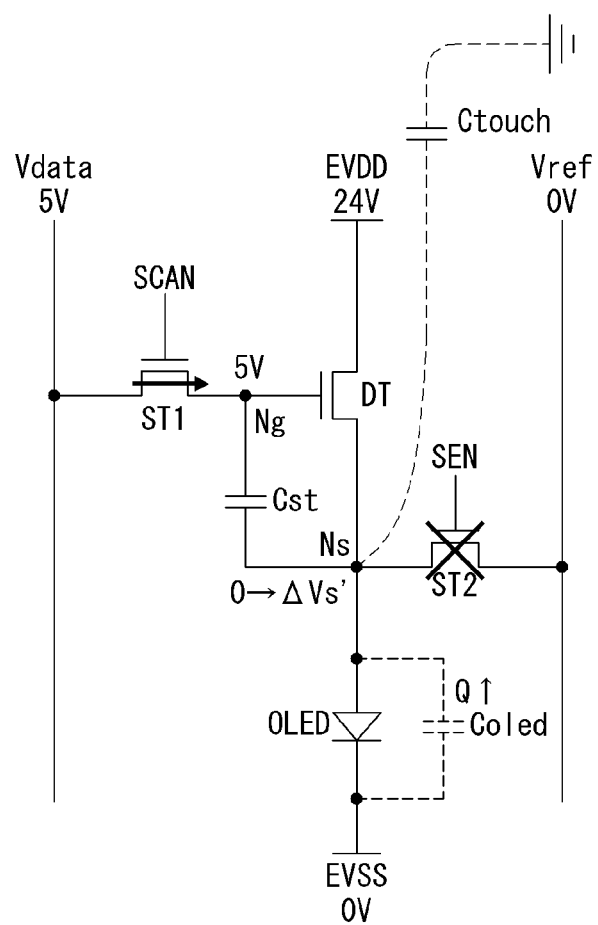
FIG. 25B shows how a pixel operates during a second reset period, according to the driving method of FIG. 14.
Figure 25C:
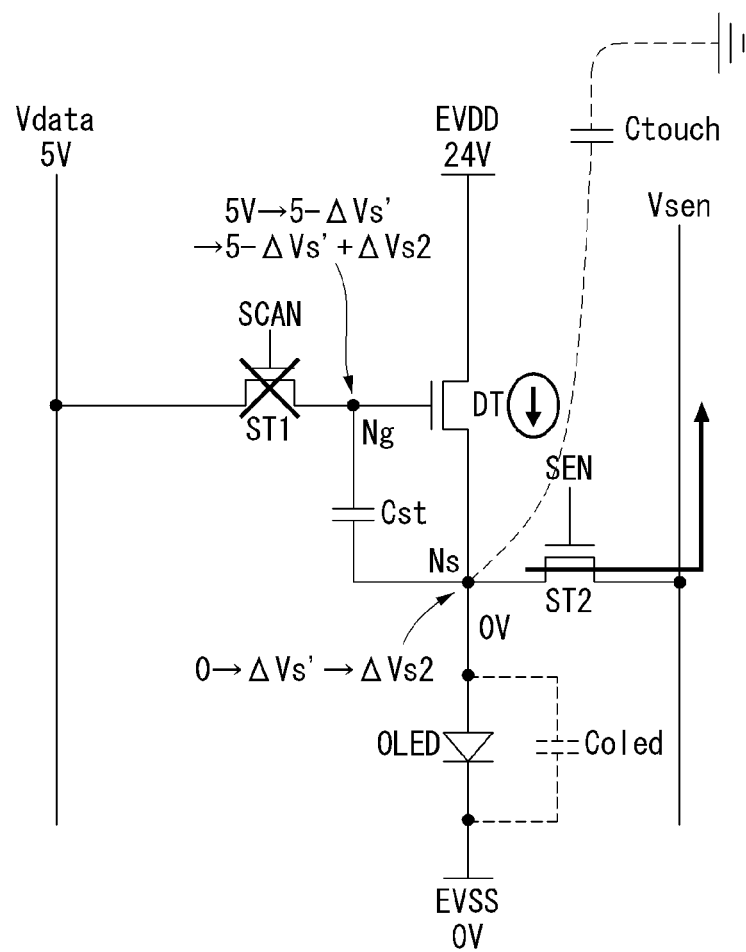
FIG. 25C shows how a pixel operates during a sensing period, according to the driving method of FIG. 14.
Figure 26:
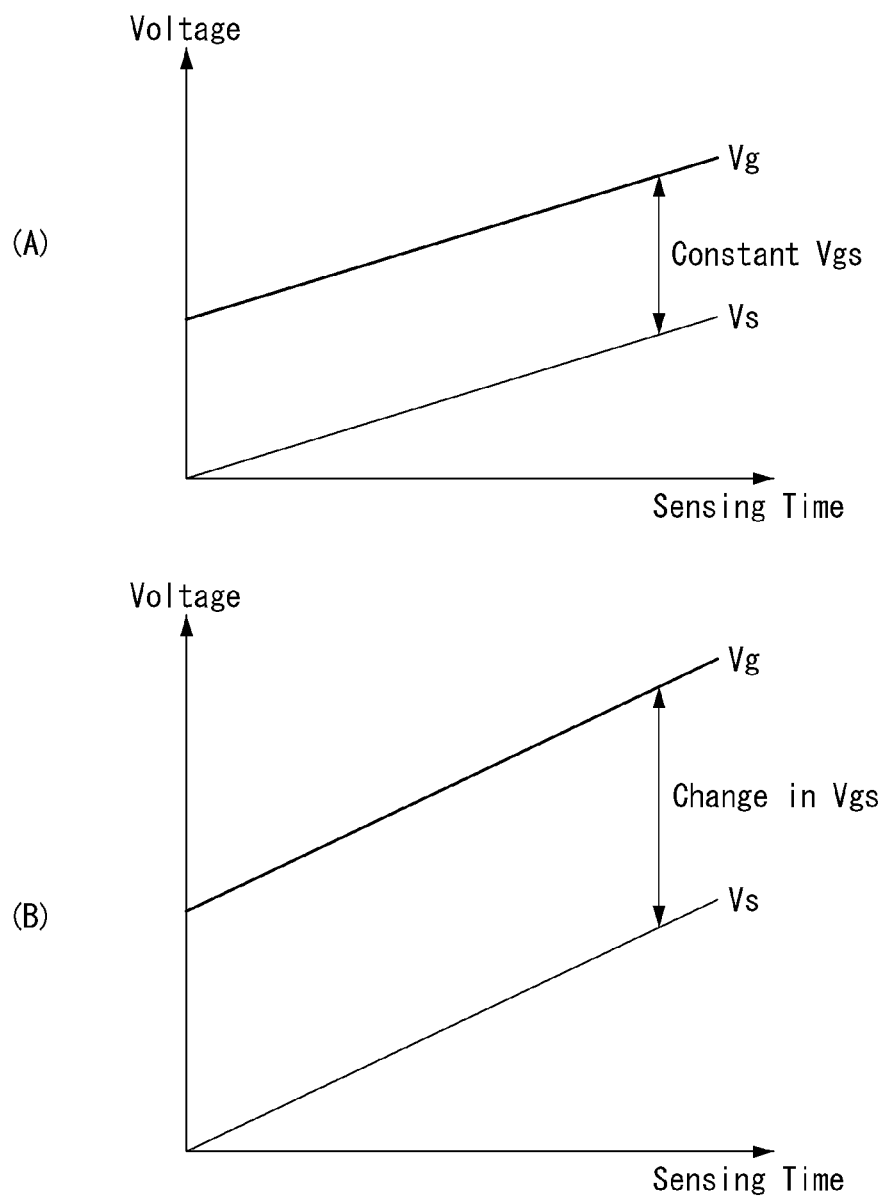
FIG. 26 shows voltages at a gate and a source of a driving transistor for sensing a touch according to the driving method of FIG. 14.
Figure 27:
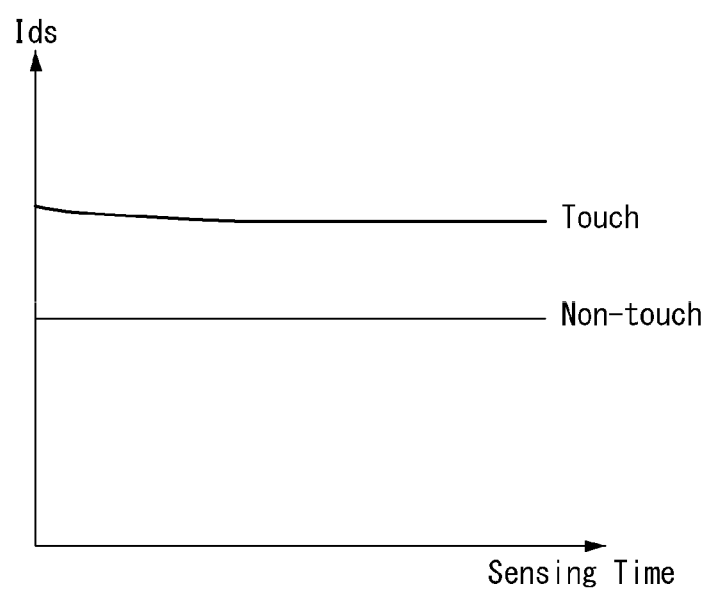
FIG. 27 shows current through the driving transistor for sensing a touch according to the driving method of FIG. 14.

FIG. 24 shows signal waveforms according to the driving method of FIG. 14. FIGS. 25A, 25B, and 25C show how a pixel operates during a first reset period, a second reset period, and a sensing period. FIG. 26 shows voltages at a gate and a source of a driving transistor for sensing a touch according to the driving method of FIG. 14. FIG. 27 shows current through the driving transistor for sensing a touch according to the driving method of FIG. 14.

Referring to FIG. 24, one driving method for implementing the second sensing approach comprises a first reset period ① and second reset period ② for touch sensing and a sensing period ③, and may further comprise an image restoration period ④.

Referring to FIGS. 24 and 25A, during the first reset period ①, the first switching TFT ST1 is turned on in response to a scan control signal SCAN of ON level, the second switching TFT ST2 is turned on in response to a sensing control signal SEN of ON level, and the reference voltage control switch SW1 is turned on in response to a reference voltage control signal PRE of ON level. During the first reset period ①, a data voltage VT (e.g., 5 V) for touch sensing is applied to the gate node Ng of the driving TFT DT, and a reference voltage Vref (e.g., 0 V) is applied to the source node Ns of the driving TFT DT. Thus, a Vgs required to turn on the driving TFT DT (which is higher than a threshold voltage Vth) is set.

Referring to FIGS. 24 and 25B, during the second reset period ②, the first switching TFT ST1 is turned on in response to a scan control signal SCAN of ON level, the second switching TFT ST2 is turned off in response to a sensing control signal SEN of OFF level, and the reference voltage control switch SW1 is turned on in response to a reference voltage control signal PRE of ON level.

During the second reset period ②, the potential of the gate node Ng of the driving TFT DT is fixed at the data voltage VT (e.g., 5 V) for touch sensing, and the source node Ns of the driving TFT DT floats. During the second reset period ②, an Ids flows through the driving TFT DT by the Vgs of the driving TFT DT, which is set in the first reset period, and the potential Vs of the source node Ns rises by ΔVs' due to the Ids. That is, the driving TFT DT operates as a source follower type during the second reset period ②, thus inducing a change in the Vgs of the driving TFT DT.

During the second reset period ②, the amount of increase in the potential Vs of the source node Ns differs depending on whether the touch capacitor Ctouch is connected to the floating source node Ns (that is, there is touch input) or not (that is, there is no touch input). Due to voltage division between a parasitic capacitor Coled at two ends of the OLED and the touch capacitor Ctouch, the amount ΔVs' of increase in the potential Vs of the source node Ns observed when there is touch input becomes Ids*Δt/(COLED+CTOUCH). On the contrary, the amount ΔVs' of increase in the potential Vs of the source node Ns observed when there is no touch input is not affected by the touch capacitor Ctouch, and therefore the amount ΔVs' without the touch capacitor Ctouch becomes Ids*Δt/COLED, which is greater than that observed when there is touch input. That is, when the touch capacitor Ctouch is connected to the floating source node Ns, the potential Vs of the source node Ns rises by a smaller amount than that observed when the touch capacitor Ctouch is not connected to the floating source node Ns. Thus, the Vgs of the driving TFT DT increases according to the touch capacitor Ctouch, and as a result, the Ids of the driving TFT DT also increases.

Referring to FIGS. 24 and 25C, during the sensing period ③, the first switching TFT ST1 is turned off in response to a scan control signal SCAN of OFF level, the second switching TFT ST2 is turned on in response to a sensing control signal SEN of ON level, and the reference voltage control switch SW1 is turned off in response to a reference voltage control signal PRE of OFF level. During the sensing period ③, the gate node Ng of the driving TFT DT is disconnected from the data line and floats, and the source node Ns of the driving TFT DT is disconnected from the input terminal of reference voltage Vref and floats.

While the gate node Ng of the driving TFT DT and the source node Ns of the driving TFT DT are floating, the potential of the source node Ns of the driving TFT DT rises due to the Ids. If the touch capacitor Ctouch is not connected to the source node Ns (that is, there is no touch input), the amount of increase in the potential of the source node Ns is equal to a first value, and the potential of the gate node Ng rises by the first value. Therefore, the Vgs of the driving TFT DT is kept at a second value, as shown in (A) of FIG. 26. In contrast, if the touch capacitor Ctouch is connected to the source node Ns (that is, there is touch input), the amount of increase in the potential of the source node Ns becomes $\Delta Vs2$, which is smaller than the first value, due to voltage division between the parasitic capacitor Coled at two ends of the OLED and the touch capacitor Ctouch, the potential of the gate node Ng rises by $\Delta Vs2$, and therefore the Vgs of the driving TFT DT changes to a value greater than the second value, as shown in (B) of FIG. 26. In one aspect, the source node of the driving TFT DT is maintained below a turn-on voltage (e.g., 9V) of the OLED during the first reset period ①, the second reset period ②, and the sensing period ③, such that the OLED does not emit light during the first reset period ①, the second reset period ②, and the sensing period ③.

As shown in FIG. 27, the Ids of the driving TFT DT of the touched pixel is higher than Ids of a driving TFT DT of the untouched pixel. A sampling unit samples the Ids of the driving TFT DT as a sensing value Vsen in response to a sampling signal SAM of ON level.

The operational effects of the image restoration period ④ are identical to those set forth above.

[Second Driving Example for Implementing Second Sensing Approach]

Figure 28:
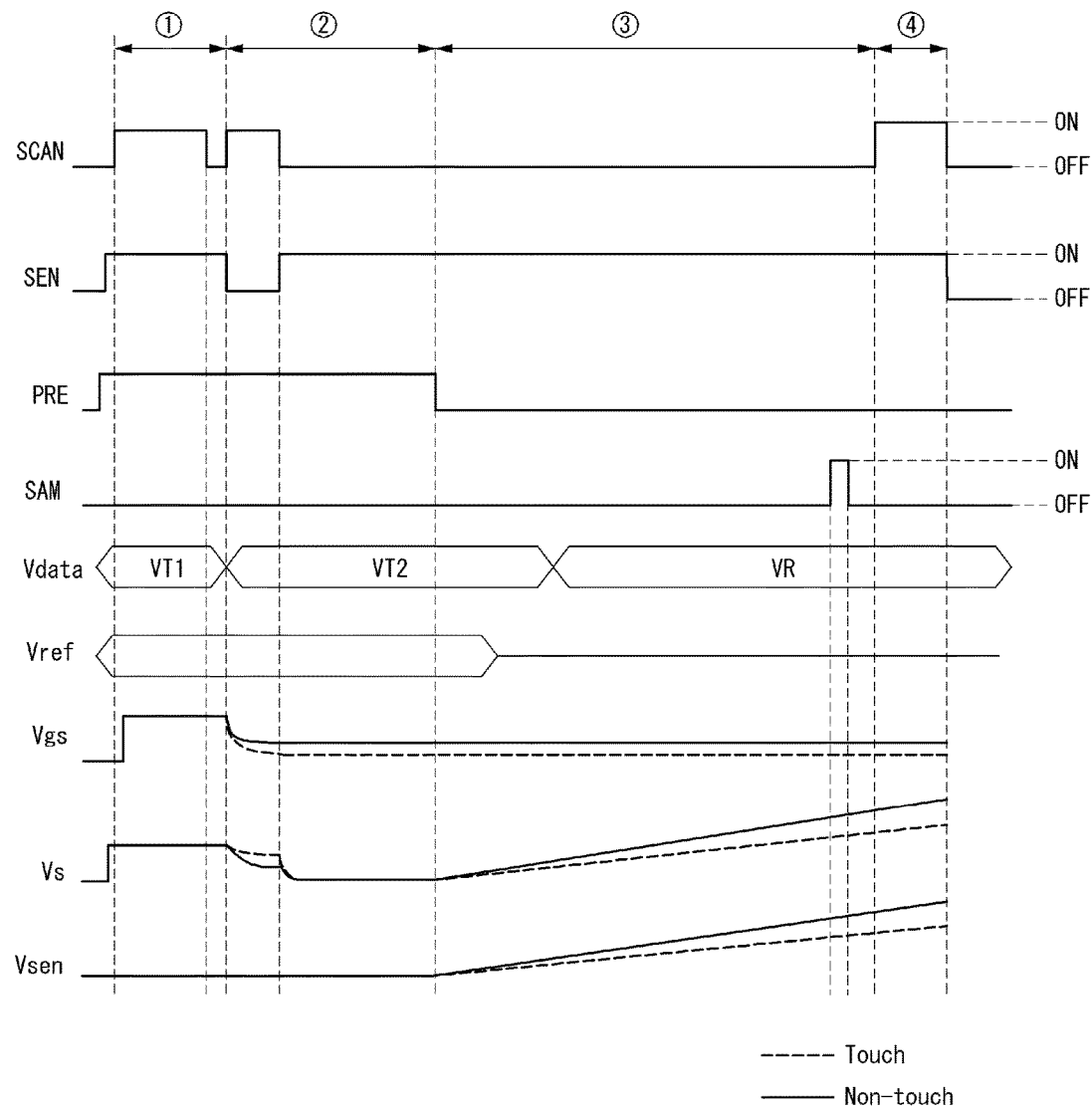
FIG. 28 shows signal waveforms according to the driving method of FIG. 15.

FIG. 28 shows signal waveforms according to the driving method of FIG. 15.

Referring to FIG. 28, another driving method for implementing the second sensing approach comprises a first reset period ① and second reset period ② for touch sensing and a sensing period ③, and may further comprise an image restoration period ④.

This driving method is different from the driving method of FIG. 24 in that, during the second reset period ②, a rapid change in the Vgs of the driving TFT DT is induced by causing the source node Ns of the driving TFT DT to float to operate the driving TFT DT as a source follower type and varying (decreasing or increasing) the data voltage for touch sensing, and the other configuration elements are substantially identical to those explained with reference to FIG. 24.

Concretely, in this driving method, during the second reset period ②, the data voltage for touch sensing applied to the gate node Ng may decrease by $\Delta Vg$ while the source node Ns of the driving TFT DT is floating. In this case, if the touch capacitor Ctouch is not connected to the floating source node Ns (that is, there is no touch input), the potential of the source node Ns falls by $\Delta Vg$ and gradually rises according to the source follower method. In contrast, if the touch capacitor Ctouch is connected to the floating source node Ns (that is, there is touch input), the potential of the source node Ns falls by $\Delta Vg'$, which is smaller than $\Delta Vg$, due to voltage division between the parasitic capacitor Coled at two ends of the OLED and the touch capacitor Ctouch. Thus, the Vgs of the driving TFT DT decreases according to the touch capacitor Ctouch, and as a result, the Ids of the driving TFT DT also decreases accordingly. By inducing a rapid change in the Vgs of the driving TFT DT, the time needed for sensing can be reduced. In one aspect, the source node of the driving TFT DT is maintained below a turn-on voltage (e.g., 9V) of the OLED during the first reset period ①, the second reset period ②, and the sensing period ③, such that the OLED does not emit light during the first reset period ①, the second reset period ②, and the sensing period ③.

Figure 29:
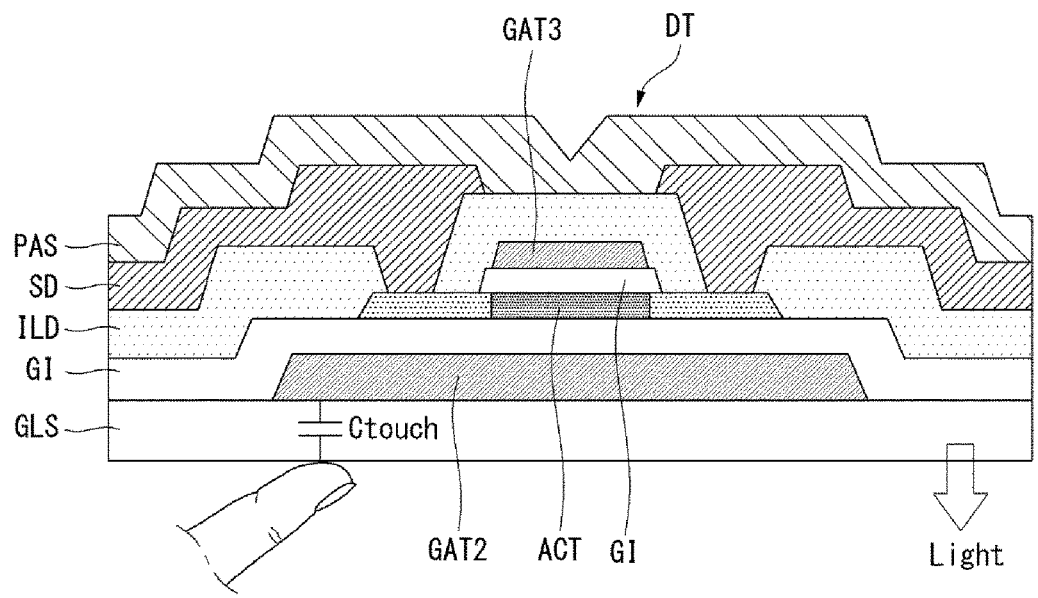
FIG. 29 shows an example of a cross-section structure of the driving TFT of a pixel.
Figure 30:
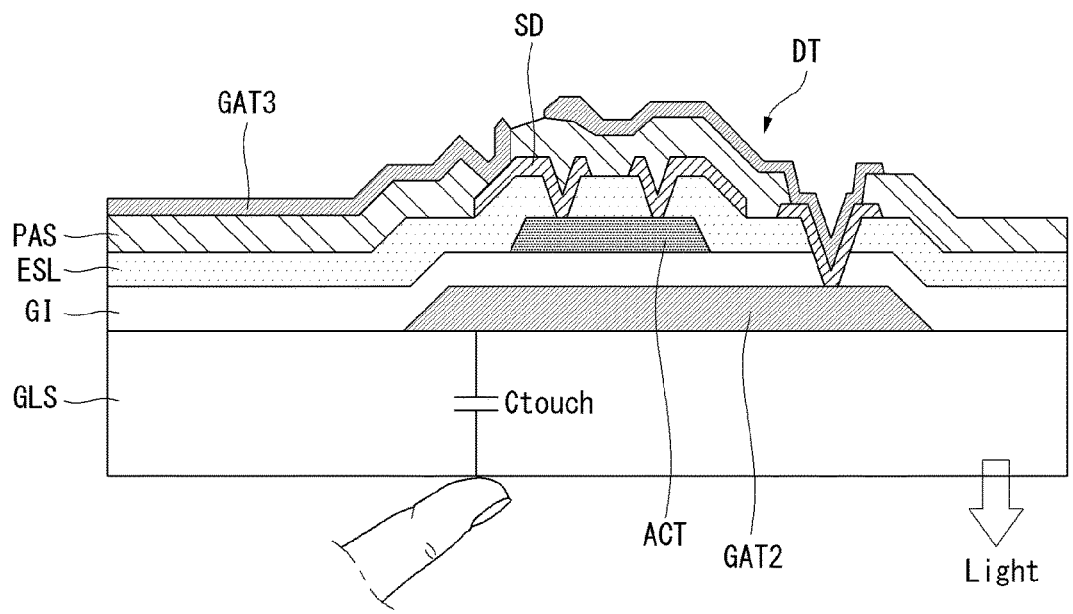
FIG. 30 shows another example of a cross-section structure of the driving TFT of a pixel.
Figure 31:
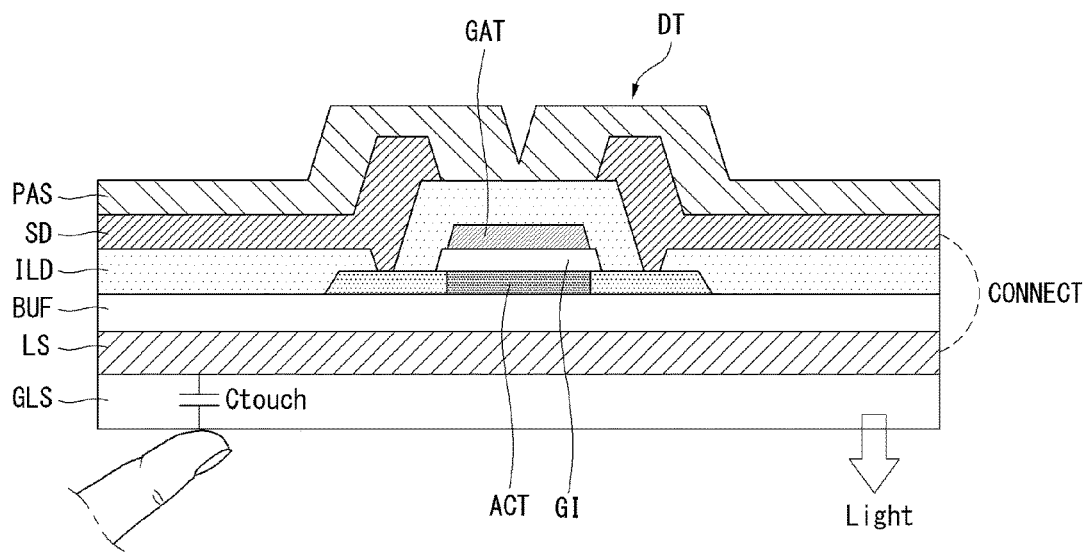
FIG. 31 shows another example of a cross-section structure of the driving TFT of a pixel.

FIGS. 29 to 31 show various examples of a cross-section structure of the driving TFT of a pixel.

In the above-described first sensing approach, the touch capacitor Ctouch is connected between the gate node Ng of the driving TFT DT and a finger. Accordingly, the driving TFT DT needs to be configured in such a manner that the gate electrode GAT serves as an electrode of the touch capacitor Ctouch, in order to implement the first sensing approach. An example of the structure of the driving TFT DT is as shown in FIGS. 29 and 30, and the driving TFT DT may have any structure as long as the gate electrode GAT is exposed toward the light-emitting face through the substrate GLS.

In the above-described second sensing approach, the touch capacitor Ctouch is connected between the source node Ns of the driving TFT DT and a finger. Accordingly, the driving TFT DT needs to be configured in such a manner that the source electrode SD serves as an electrode of the touch capacitor Ctouch, in order to implement the second sensing approach. An example of the structure of the driving TFT DT is as shown in FIG. 31, and the driving TFT DT may have any structure as long as the source electrode SD is exposed toward the light-emitting face through the substrate GLS. In FIG. 31, a metal light blocking pattern LS electrically connected to the source electrode SD is exposed to the light-emitting face through the substrate GLS.

In FIGS. 29 to 31, GLS denotes the substrate, LS denotes the metal light blocking pattern, ACT denotes an active layer of the driving TFT, GAT, GAT1, GAT2 and GAT3 denote the gate electrode, SD denotes the source electrode (or drain electrode) of the driving TFT, and GI, BUF, ILD, ESL, and PAS denote an insulating film.

[Driving Mode Conversion Method]

Figure 32A:
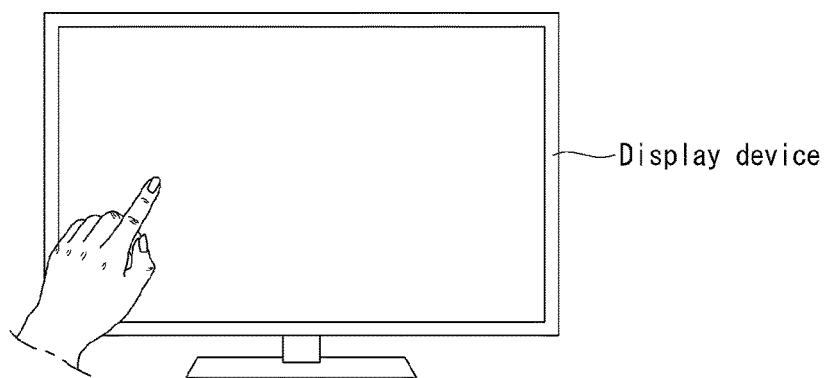
FIGS. 32A through 32C show various examples of a method for converting a driving mode.
Figure 32B:
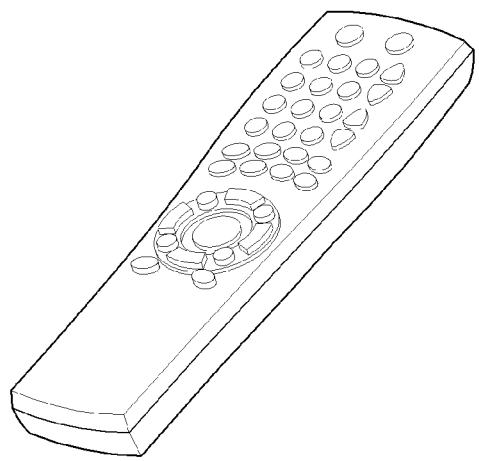
Figure 32C:
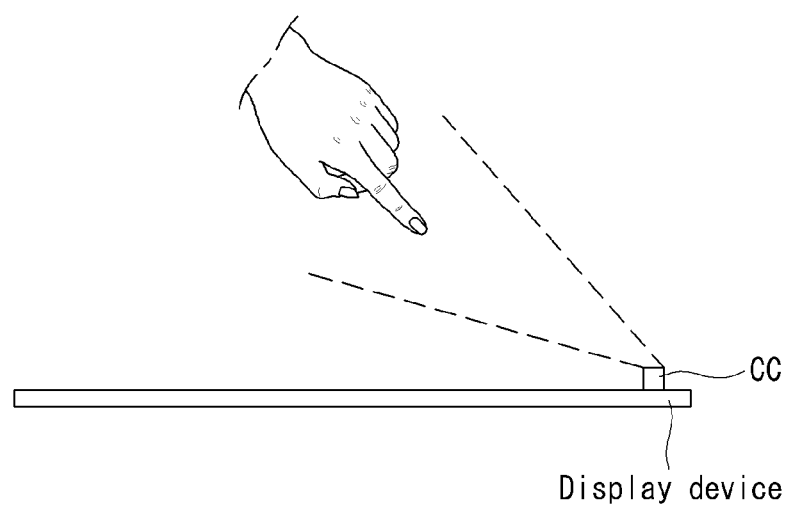

FIGS. 32A through 32C show various examples of a method for converting a driving mode.

If a touch sensor integrated display device performs a touch sensing operation at all times, the touch sensor integrated display device may be ineffective in terms of power consumption and image quality. In one embodiment, the touch sensor integrated display device performs the touch sensing operation only if necessary. Thus, the touch sensor integrated display device according to the embodiment of the invention may be driven in a non-touch driving mode for the implementation of an image of high quality before information related to a touch is input, and may be driven in a touch driving mode when information related to a touch is input, thereby performing a touch sensing operation.

The timing controller 11 according to the embodiment of the invention may switch between the non-touch driving mode and the touch driving mode based on whether or not there is a touch input, user's mode selection information, distance information between the display device and the user, and the like.

More specifically, as shown in FIG. 32A, the timing controller 11 determines whether or not there is a touch input through a minimum touch sensing operation not affecting the image quality. When a touch input is sensed in the non-touch driving mode, the timing controller 11 may change the non-touch driving mode to the touch driving mode. When a touch input is not sensed for a predetermined period of time in the touch driving mode, the timing controller 11 may change the touch driving mode to the non-touch driving mode. Further, the timing controller 11 may switch between the non-touch driving mode and the touch driving mode depending on user's mode selection information input through a remote controller shown in FIG. 32B, a smart phone, a button, etc. Further, the timing controller 11 determines a distance between the display device and the user based on information input from a camera mounted on the display device or an infrared sensor CC shown in FIG. 32C, etc. When the distance between the display device and the user is within a predetermined distance in the non-touch driving mode, the timing controller 11 may change the non-touch driving mode to the touch driving mode. When the distance between the display device and the user is beyond the predetermined distance in the touch driving mode, the timing controller 11 may change the touch driving mode to the non-touch driving mode.

[Method for Securing Sensing Time]

Figure 33:
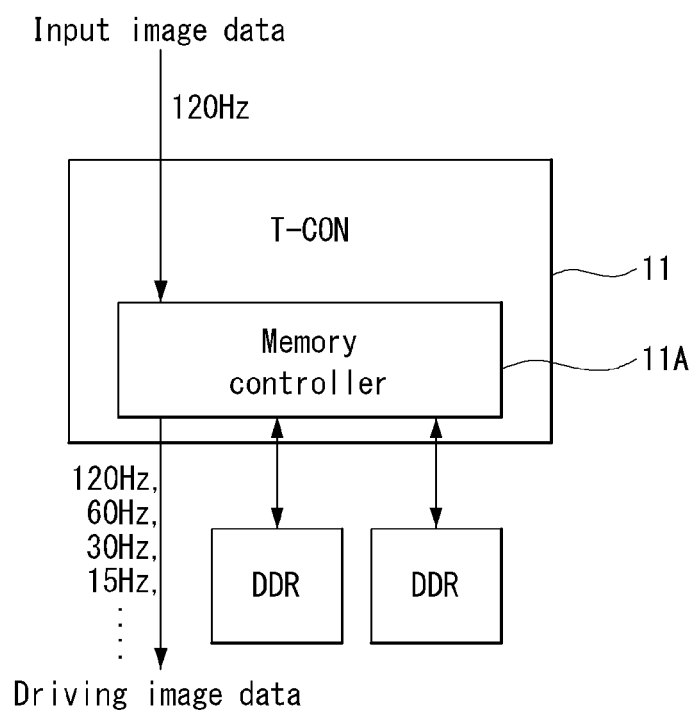
FIG. 33 illustrates configuration of a timing controller for changing a frame frequency.
Figure 34:
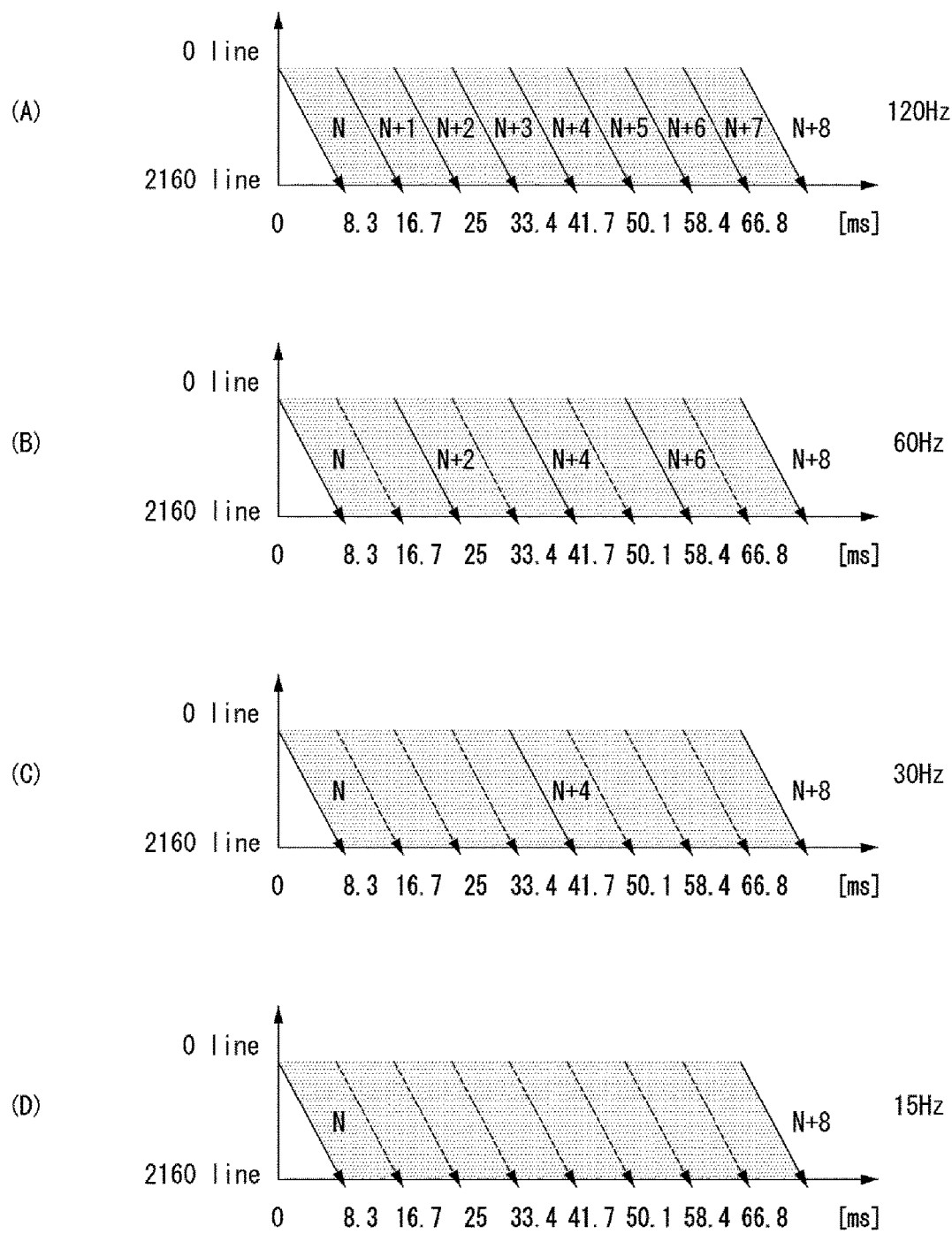
FIG. 34 shows various examples of a change in a frame frequency.

FIG. 33 illustrates configuration of a timing controller for changing a frame frequency, and FIG. 34 shows various examples of a change in a frame frequency.

In one or more embodiments, a sensing time is provided for an external compensation when the display device operates in the non-touch driving mode. In addition, a touch sensing time as well as the sensing time is provided for the external compensation when the display device operates in the touch driving mode. As shown in FIG. 33, the timing controller 11 may include a memory DDR and a memory controller 11A in order to secure the sensing time. The memory controller 11A may control a write operation and a read operation of the memory DDR and store image data input from the outside in the memory DDR at a first frame frequency (for example, 120 Hz). Then, the timing controller 11 may output the image data stored in the memory DDR at a second frame frequency (for example, 60 Hz) lower than the first frame frequency.

For example, the memory controller 11A may read input image data of 120 Hz stored in the memory DDR at intervals of two frames and output it, thereby reducing an output frame frequency of data to 60 Hz as shown in (B) of FIG. 34. Further, the memory controller 11A may read input image data of 120 Hz stored in the memory DDR at intervals of four frames and output it, thereby reducing an output frame frequency of data to 30 Hz as shown in (C) of FIG. 34. Further, the memory controller 11A may read input image data of 120 Hz stored in the memory DDR at intervals of eight frames and output it, thereby reducing an output frame frequency of data to 15 Hz as shown in (D) of FIG. 34. The lower the output frame frequency is, the longer a refresh period of one screen is. Thus, a portion of an increased hold period of the same image may be used as the sensing time. Hence, the embodiment of the invention can easily secure the sensing time by changing a frame frequency.

[Method for Securing Touch Sensing Time in Touch Driving Mode]

Various methods for securing a touch sensing time during a drive of the display device in a touch driving mode are described with reference to FIGS. 35 to 44.

Figure 35:
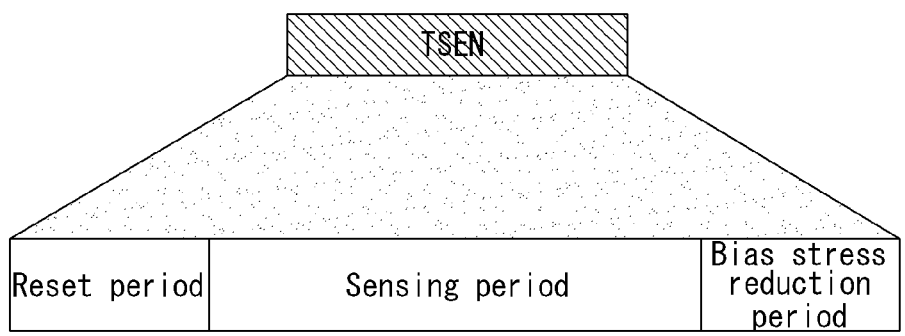
FIG. 35 illustrates configuration of a touch sensing period.
Figure 36:
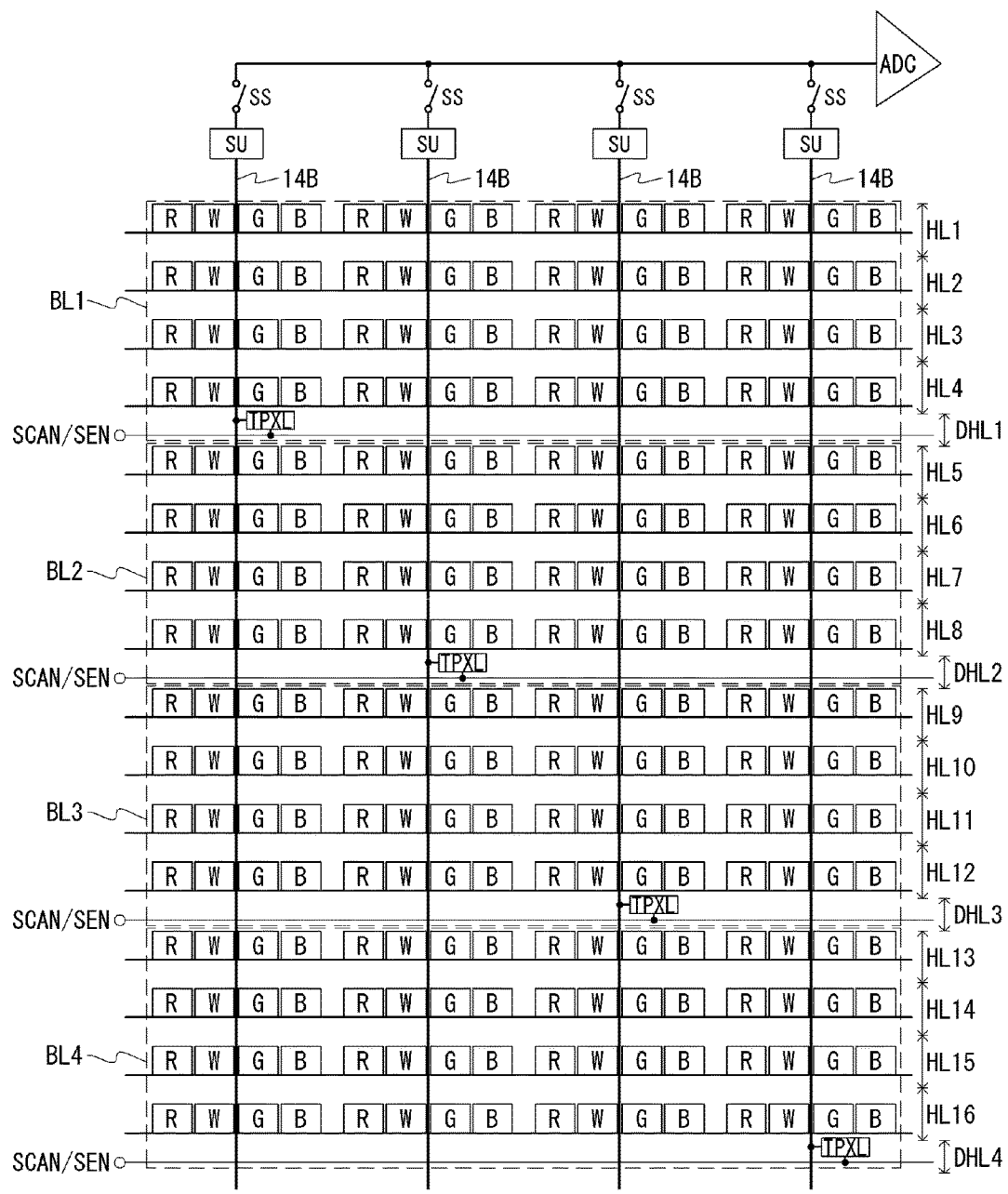
FIG. 36 illustrates configuration, in which a pixel array of a display panel is divided into a plurality of touch blocks.

FIG. 35 illustrates configuration of a touch sensing period. FIG. 36 illustrates configuration, in which a pixel array of a display panel is divided into a plurality of touch blocks each including a sensing target pixel line. A sensing target pixel line herein refers to a pixel line (i.e., a gate line 15A, a gate line 15B, or both) coupled to selected pixels from a group of pixels. The selected pixels may be disposed in a row.

Referring to FIG. 35, a touch sensing period TSEN includes a reset period, a sensing period, and a bias stress reduction period. As described above, the embodiment of the invention sets a Vgs suitable to turn on the driving TFT in the reset period, senses changes in an Ids of the driving TFT in response to a touch input to obtain a sensing value in the sensing period, and adjusts the Vgs of the driving TFT in the bias stress reduction period to relieve a gate bias stress accumulated on the gate electrode of the driving TFT. In one example, the panel driver circuit applies a stress reduction data voltage to the gate electrode of the driving TFT to turn off the driving TFT during the bias stress reduction period. The stress reduction data voltage may be equal to or lower than the reference voltage.

Figure 37:
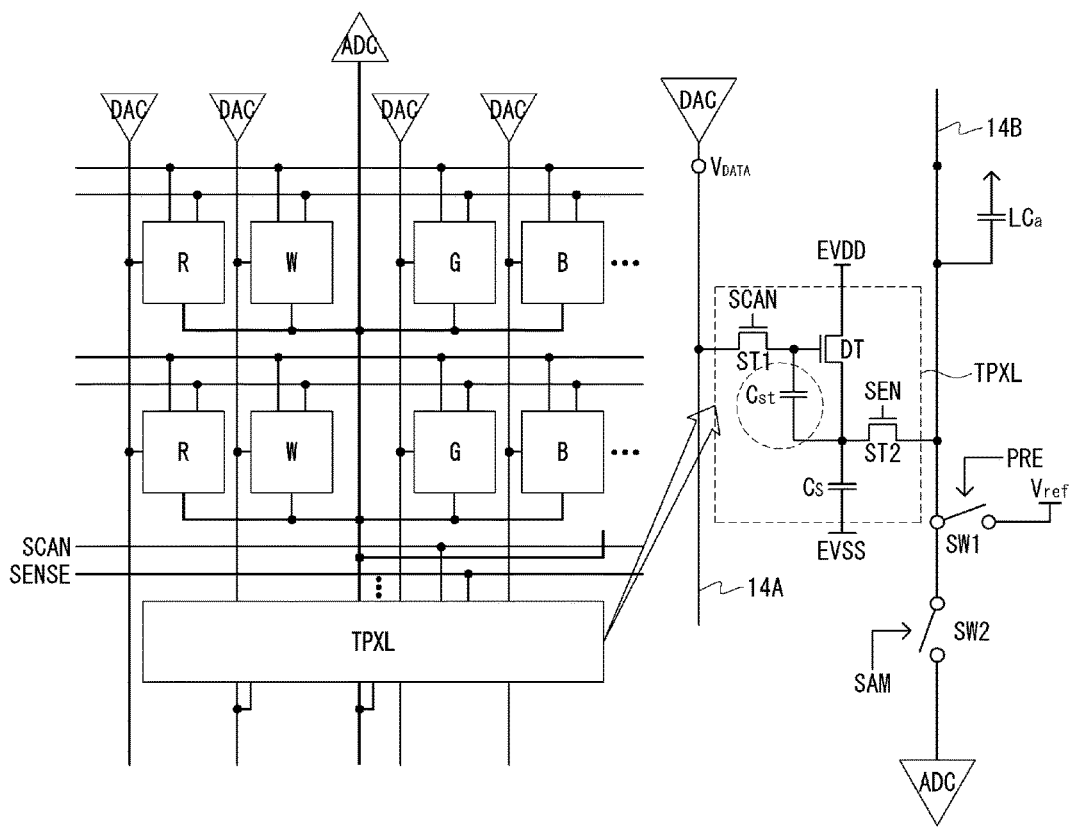
FIG. 37 illustrates a connection configuration of sensing target dummy pixels which are disposed on a dummy pixel line of each touch block and are used as a touch sensor.

FIG. 36 illustrates in detail configuration, in which a pixel array of a display panel is divided into a plurality of touch blocks. FIG. 37 illustrates a connection configuration of sensing target dummy pixels (also referred to as "dummy pixels") which are disposed on a dummy pixel line of each touch block and are used as a touch sensor. A vertical active period AP and a vertical blank period VBP are included in a single frame.

As shown in FIG. 36, the touch sensing is performed on each of touch blocks BL1, BL2, BL3, and BL4. For example, each of the touch blocks BL1, BL2, BL3, and BL4 may include one dummy pixel line (e.g., DHL1, DHL2, DHL3, and DHL4) and four horizontal pixel lines (e.g., HL1-HL4, HL5-HL8, HL9-HL12, and HL13-HL16). At least one sensing target dummy pixel TPXL may be disposed on each of the dummy pixel lines DHL1, DHL2, DHL3, and DHL4. In this instance, a touch resolution may be less than a physical resolution of the display panel in terms of horizontal and vertical resolutions. The embodiment of the invention is not limited to the configuration illustrated in FIG. 36. Other configurations may be used. For example, a position and the number of dummy pixel lines and a position and the number of sensing target dummy pixels in each touch block may be variously changed.

In FIG. 36, because the sensing target dummy pixels TPXL of the first to fourth dummy pixel lines DHL1 to DHL4 are connected to different sensing units SU through different sensing lines 14B, a touch sensing operation can be simultaneously performed on the sensing target dummy pixels TPXL of the first to fourth dummy pixel lines DHL1 to DHL4. This is described later with reference to FIGS. 46 and 47.

Referring to FIG. 37, the sensing target dummy pixel TPXL may be configured to include a source capacitor Cs instead of the OLED and may be connected to one of four data lines 14A connected to pixel units. Specifically, the sensing target dummy pixel TPXL includes a driving transistor and a capacitor Cs. A driving transistor of the sensing target dummy pixel may be referred to as a dummy driving TFT or a dummy driving transistor. The dummy driving transistor may have a similar structure on a same layer as driving TFT of other pixels for displaying an image. However, the dummy driving transistor may be coupled to the capacitor Cs without the OLED.

Figure 38:
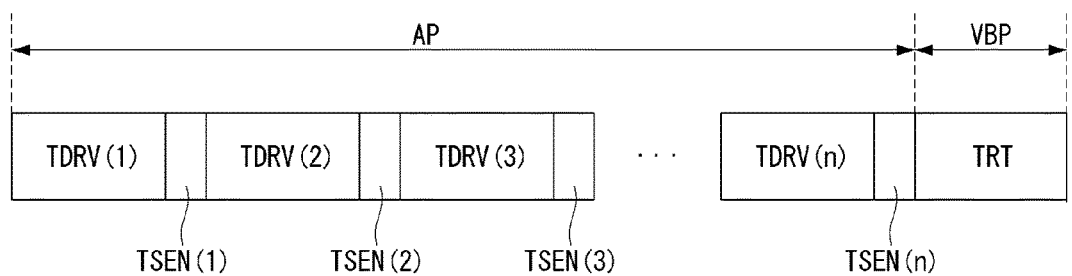
FIG. 38 illustrates a method for assigning a touch sensing period to a vertical active period.
Figure 39:
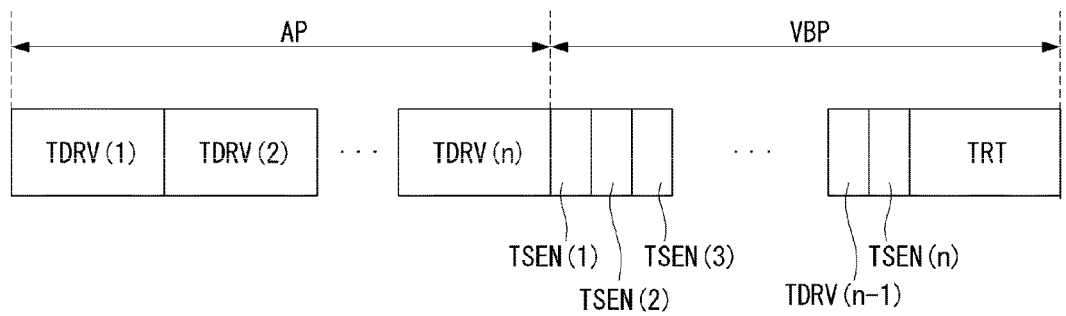
FIG. 39 illustrates a method for assigning a touch sensing period to a vertical blank period.

FIG. 38 illustrates a method for assigning a touch sensing period to a vertical active period. FIG. 39 illustrates a method for assigning a touch sensing period to a vertical blank period.

The touch sensing may be performed on a specific dummy pixel line while writing image display data (or programming) on pixels coupled to horizontal pixel lines of touch blocks. To this end, as shown in FIG. 38, a plurality of touch sensing periods TSEN(1) to TSEN(n), in which sensing target dummy pixels are sensed, are arranged in a vertical active period AP, and one touch sensing period may be assigned to each touch block. The plurality of touch sensing periods TSEN(1) to TSEN(n) and a plurality of image display data address periods TDRV(1) to TDRV(n) are alternately arranged in the vertical active period AP. The image display data is written on the horizontal pixel lines of each touch block through the image display data address period. For example, a touch input of a dummy pixel line included in a first touch block BL1 is sensed during a first touch sensing period TSEN(1), and image display data is written on horizontal pixel lines included in the first touch block BL1 during a first image display data address period TDRV(1). An external compensation period TRT may be additionally assigned to a vertical blank period VBP shown in FIG. 38. Changes in electrical characteristics (for example, a threshold voltage, mobility, etc.) of the driving TFT (or the OLED) may be sensed in the external compensation period TRT for the purpose of external compensation.

The touch sensing may be performed on dummy pixel lines after image display data is written on all of horizontal pixel lines of touch blocks. To this end, as shown in FIG. 39, the image display data is written on all of the horizontal pixel lines of the touch blocks in a plurality of image display data address periods TDRV(1) to TDRV(n) assigned to a vertical active period AP. Further, a plurality of touch sensing periods TSEN(1) to TSEN(n), in which the sensing target dummy pixels are sensed, are assigned to a vertical blank period VBP, and one touch sensing period may be assigned to each touch block. An external compensation period TRT, in which electrical characteristics (for example, a threshold voltage, mobility, etc.) of the driving TFT (or the OLED) are sensed and compensated, may be additionally assigned to the vertical blank period VBP.

Figure 40:
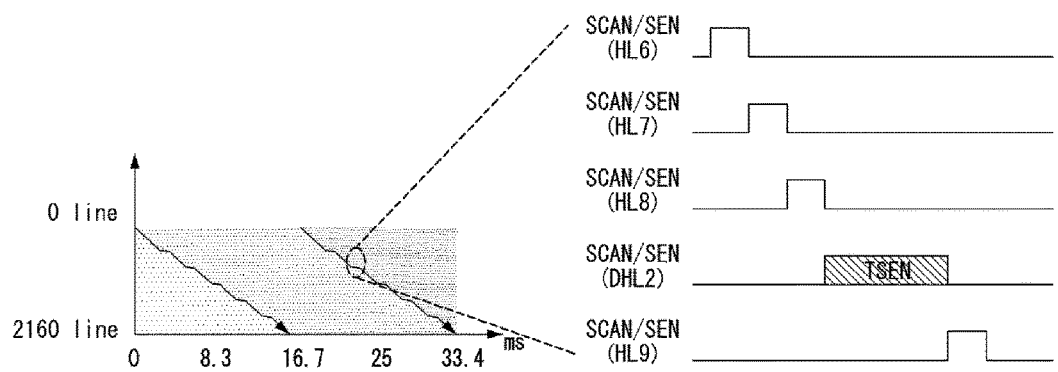
FIGS. 40 and 41 show an example of a gate signal applied to a dummy pixel line and horizontal pixel lines adjacent to the dummy pixel line in one block when a touch sensing period is assigned to a vertical active period as shown in FIG. 38.
Figure 41:
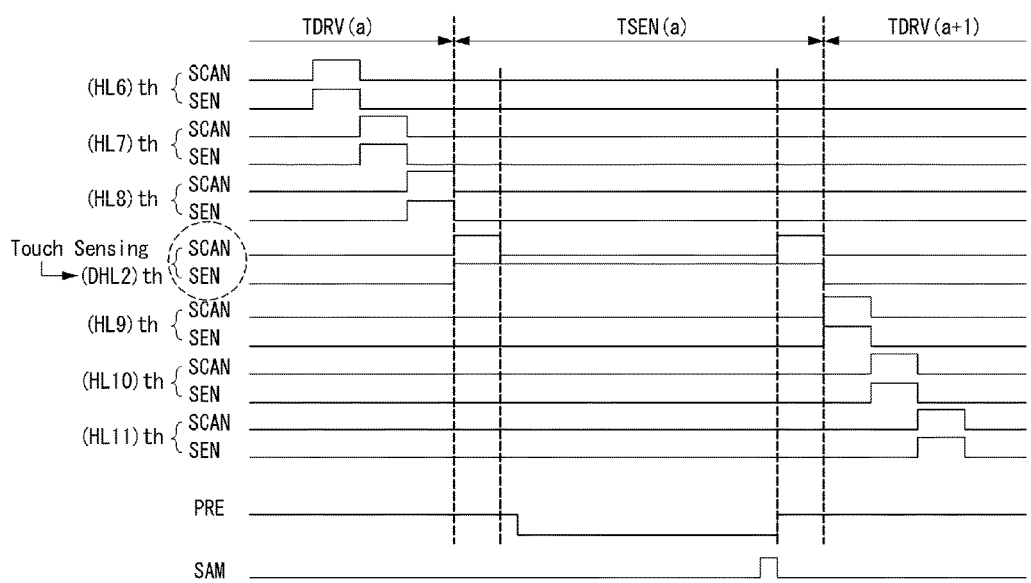
Figure 42:
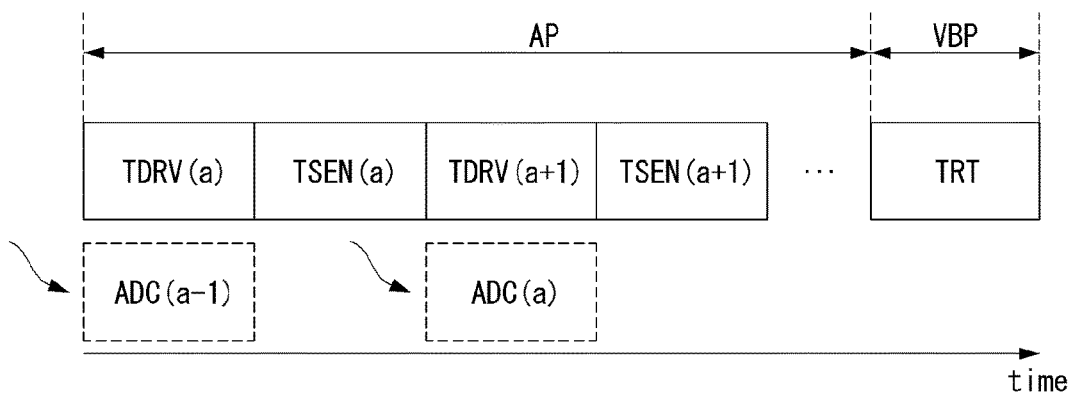
FIG. 42 shows a transmission timing of a sensing value for reducing a touch sensing time when a touch sensing period is assigned to a vertical active period as shown in FIG. 38.

FIGS. 40 and 41 show an example of a gate signal applied to a dummy pixel line and horizontal pixel lines adjacent to the dummy pixel line in one block when a touch sensing period is assigned to a vertical active period as shown in FIG. 38. FIG. 42 shows a transmission timing of a sensing value for reducing a touch sensing time when a touch sensing period is assigned to a vertical active period as shown in FIG. 38.

Referring to FIGS. 40 and 41 together with FIG. 36, a gate signal (for example, a scan control signal SCAN and a sensing control signal SEN), which can cause the touch sensing to be performed in the vertical active period AP, is applied to a sensing target dummy pixel TPXL disposed on a second dummy pixel line DHL2 of a second touch block BL2. The gate signal may be selected among the gate signals shown in FIGS. 16, 20, 24, and 28, and the driving method for the touch sensing was described in the corresponding figure. The scan control signal SCAN and the sensing control signal SEN, which are in phase, may be applied to non-sensing target pixels P in a line sequential manner in the vertical active period AP.

The touch sensing time includes time required to transmit a sensing value, that is converted into a digital value by the ADC of the data drive circuit 12, to the timing controller 11.

In order to reduce the touch sensing time, as shown in FIG. 42, the embodiment of the invention may overlap a transmission timing of the sensing value with the image display data address periods when the touch sensing period is assigned to the vertical active period AP as described above. For example, the embodiment of the invention may transmit a sensing value with respect to an ath touch block BLa during an image display data address period TDRV(a+1) of an (a+1)th touch block BLa+1.

Figure 43:
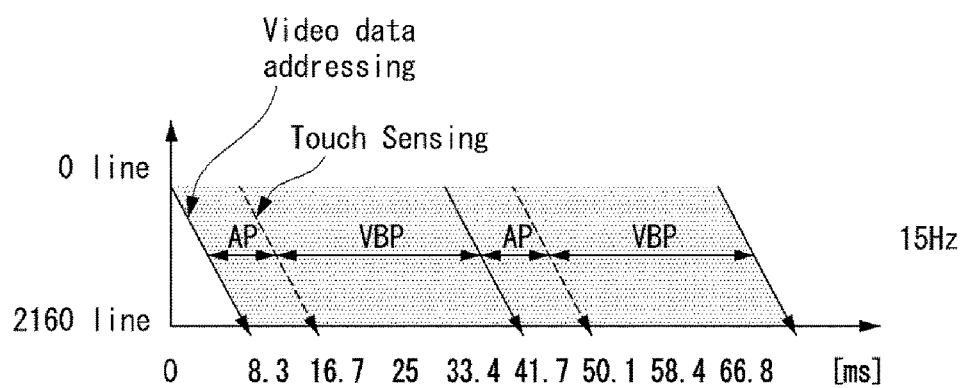
FIGS. 43 and 44 show a driving timing of sensing target dummy pixels in a vertical blank period when a touch sensing period is assigned to the vertical blank period as shown in FIG. 39.
Figure 44:
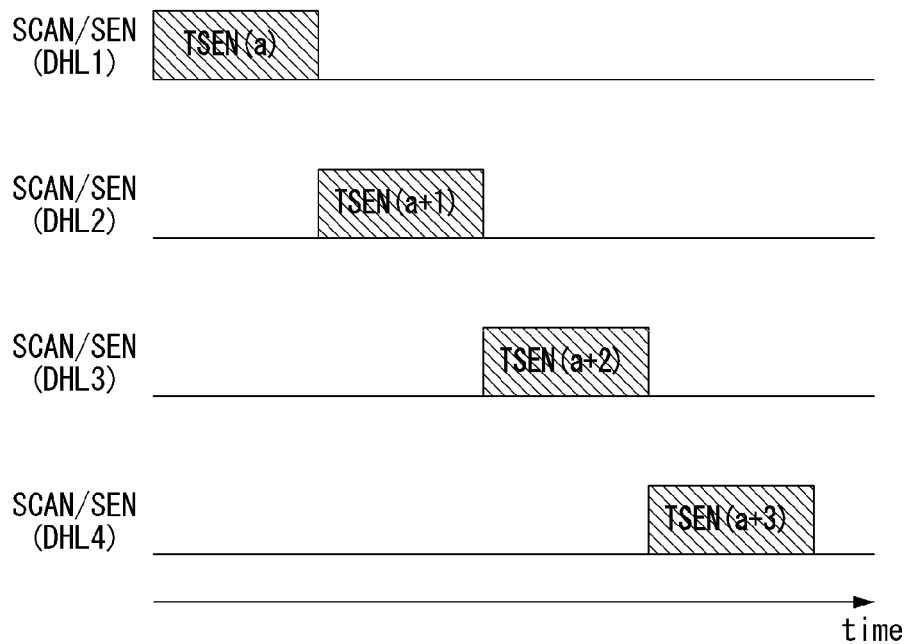
Figure 45:
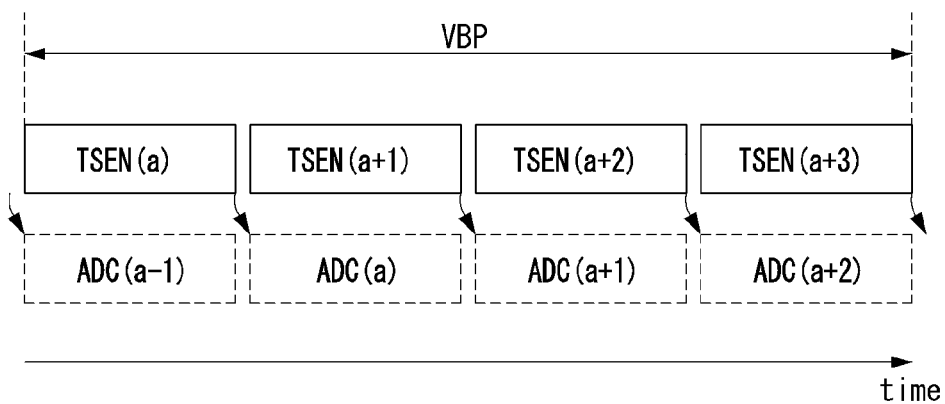
FIG. 45 shows a transmission timing of a sensing value for reducing a touch sensing time when a touch sensing period is assigned to a vertical blank period as shown in FIG. 39.

FIGS. 43 and 44 show a driving timing of sensing target dummy pixels in a vertical blank period when a touch sensing period is assigned to the vertical blank period as shown in FIG. 39. FIG. 45 shows a transmission timing of a sensing value for reducing a touch sensing time when a touch sensing period is assigned to a vertical blank period as shown in FIG. 39.

Referring to FIGS. 43 and 44 together with FIG. 36, a gate signal (for example, a scan control signal SCAN and a sensing control signal SEN) is applied to first to fourth dummy pixel lines DHL1 to DHL4, so that sensing target dummy pixels TPXL of touch blocks BL1 to BL4 are sequentially sensed during a vertical blank period VBP. The gate signal may be selected among the gate signals shown in FIGS. 16, 20, 24, and 28, and the driving method for the touch sensing was described in the corresponding figure. FIG. 44 shows that a first touch sensing period TSEN(a), in which the first dummy pixel line DHL1 of the first touch block BL1 is sensed, a second touch sensing period TSEN(a+1), in which the second dummy pixel line DHL2 of the second touch block BL2 is sensed, a third touch sensing period TSEN(a+2), in which the third dummy pixel line DHL3 of the third touch block BL3 is sensed, and a fourth touch sensing period TSEN(a+3), in which the fourth dummy pixel line DHL4 of the fourth touch block BL4 is sensed, are sequentially arranged in the vertical blank period VBP.

In order to reduce the touch sensing time, as shown in FIG. 45, the embodiment of the invention may overlap a transmission timing of a sensing value of a touch block with a touch sensing period of a subsequent touch block. For example, the embodiment of the invention may transmit a sensing value ADC(a) with respect to the first touch block BL1 during the touch sensing period TSEN(a+1) of the second touch block BL2.

Figure 46:
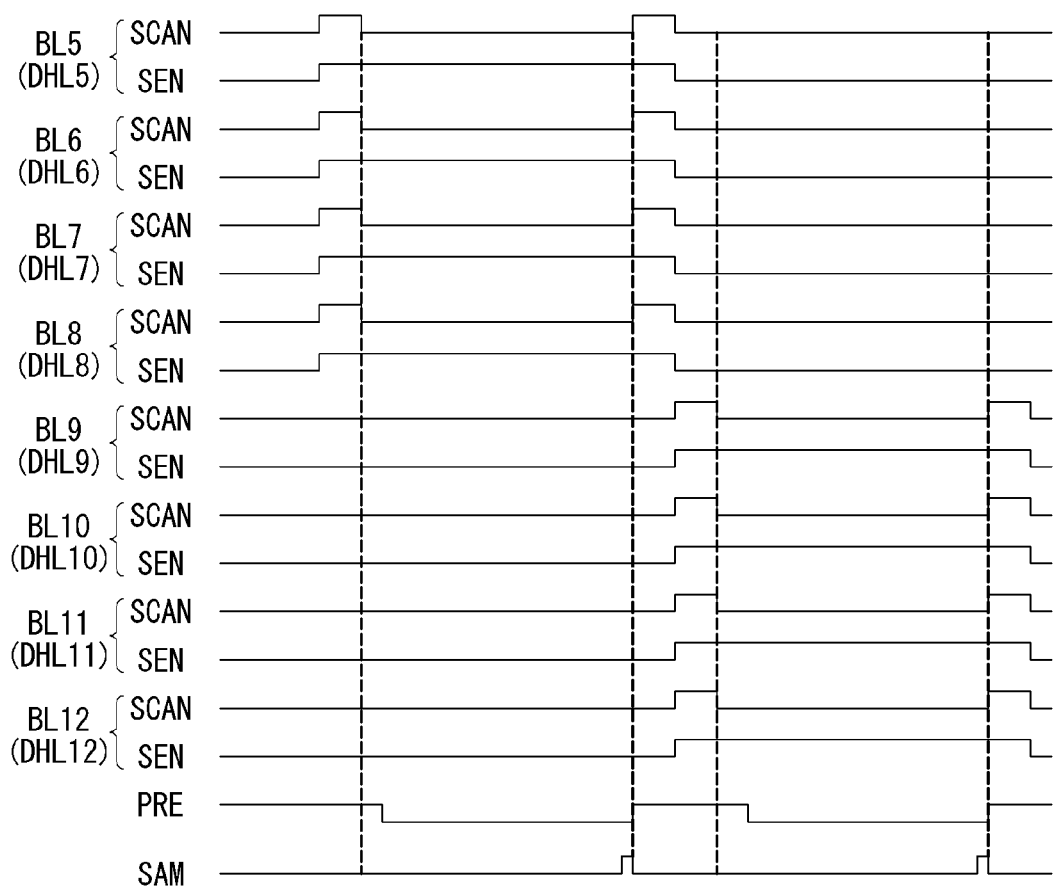
FIG. 46 shows a timing, at which sensing target dummy pixels included in a plurality of touch blocks are simultaneously driven when a touch sensing period is assigned to a vertical blank period as shown in FIG. 39.
Figure 47:
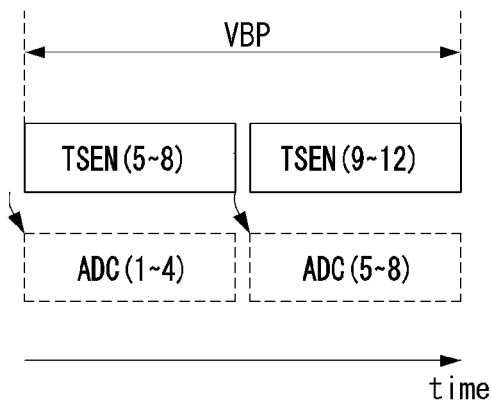
FIG. 47 shows a transmission timing of a sensing value for reducing a touch sensing time when sensing target dummy pixels included in a plurality of touch blocks are simultaneously driven as shown in FIG. 46.

FIG. 46 shows a timing, at which sensing target dummy pixels included in a plurality of touch blocks are simultaneously driven when a touch sensing period is assigned to a vertical blank period as shown in FIG. 39. FIG. 47 shows a transmission timing of a sensing value for reducing a touch sensing time when sensing target dummy pixels included in a plurality of touch blocks are simultaneously driven as shown in FIG. 46.

As described above with reference to FIG. 36, because the sensing target dummy pixels TPXL of the dummy pixel lines DHL1 to DHL4 included in the vertically adjacent touch blocks BL1 to BL4 are connected to different sensing units SU through different sensing lines 14B, a touch sensing operation can be simultaneously performed on the sensing target dummy pixels TPXL. For example, as shown in FIG. 46, a first group comprising four vertically adjacent touch blocks BL5-BL8 may be simultaneously sensed, and subsequently a second group comprising four vertically adjacent touch blocks BL9-BL12 may be simultaneously sensed. Sensed values are sequentially applied to the ADC and converted into digital values. In the example illustrated in FIG. 46, a touch sensing time of simultaneously sensing dummy pixel lines in groups can be reduced to ¼ or less of a touch sensing time of sequential sensing dummy pixel lines individually.

In order to further reduce the touch sensing time, as shown in FIG. 47, the embodiment of the invention may overlap a transmission timing of a sensing value with respect to a touch group with a touch sensing period of a touch group adjacent to the touch group when the touch sensing period is assigned to the vertical blank period as described above. For example, a sensing value ADC(5-8) with respect to the first touch group BL5-BL8 may be transmitted during a touch sensing period TSEN(9-12) of the second touch group BL9-BL12 adjacent to the first touch group BL5-BL8.

[Method for minimizing Touch Influence during External Compensation in Touch Driving Mode]

Figure 48:
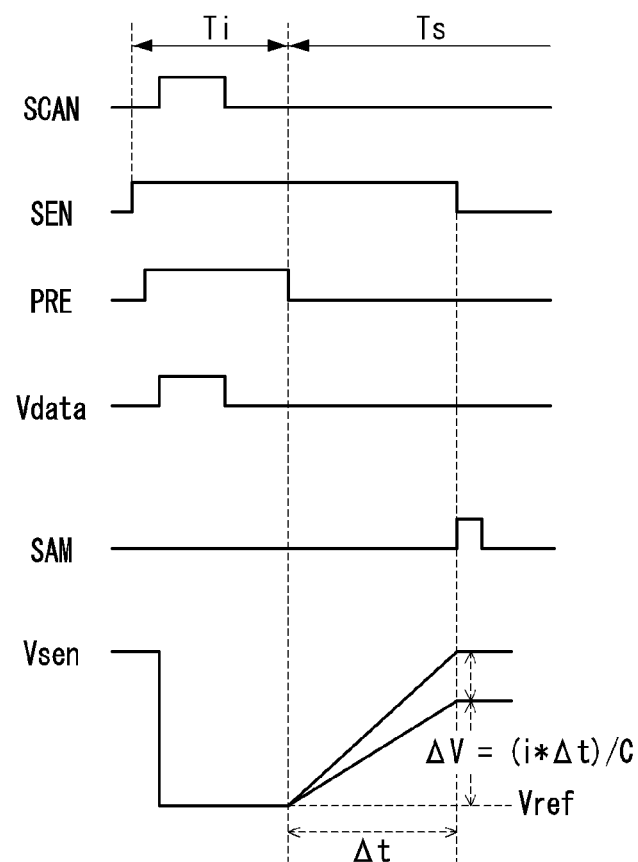
FIGS. 48 and 49 illustrate methods for minimizing an influence of a touch input during external compensation in a touch driving mode.
Figure 49:
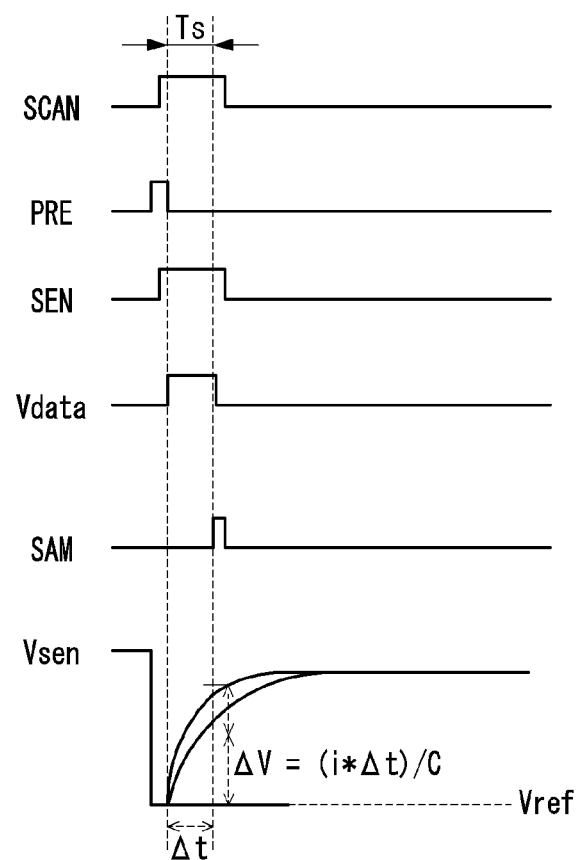

FIGS. 48 and 49 illustrate methods for minimizing an influence of a touch input during external compensation in a touch driving mode.

As described above, an external compensation operation for compensating for changes in electrical characteristics of the driving TFT is performed to go side by side with a touch sensing operation even in the touch driving mode, in which the touch sensing is performed. The external compensation operation may be performed on pixels P in the external compensation period TRT of the vertical blank period VBP. When the electrical characteristics (for example, a threshold voltage, mobility, etc.) of the driving TFT are sensed using the external compensation period TRT, a sensing value of the external compensation may be affected by the touch input and distorted. Because the sensing value of the external compensation is a result of sensing a source node voltage of the driving TFT DT, the source node voltage of the driving TFT DT may be distorted during the external compensation sensing if the Vgs and the Ids of the driving TFT DT change due to the touch input.

As a method for minimizing a distortion of the sensing value of the external compensation caused by the touch input, the embodiment of the invention may apply an external compensation data voltage greater than a touch driving data voltage to a gate node of the driving TFT in the external compensation period TRT and apply a reference voltage to a source node of the driving TFT in the external compensation period TRT, thereby increasing the Vgs of the driving TFT to a value greater than a value set in a dummy pixel during the touch sensing. When the Vgs of the driving TFT increases, the Ids of the driving TFT may increase in proportion to an increase in the Vgs. Therefore, a sensing speed increases, and thus the distortion of the sensing value can be minimized. FIG. 48 shows a driving waveform thereof. The external compensation is performed during a reset period Ti, in which the Vgs of the driving TFT is set to a large value, and a sensing period Ts, in which the source node voltage of the driving TFT is sensed at a maximum sensing speed. In the external compensation, changes in the electrical characteristics of the driving TFT are determined based on a magnitude of the sensing value.

As another method for minimizing the distortion of the sensing value of the external compensation caused by the touch input, as shown in FIG. 49, the embodiment of the invention may apply a scan control signal SCAN and a sensing control signal SEN at an on-level through sensing target pixel lines to couple the gate node and the source node to corresponding signal lines (e.g., data line 14A and sensing line 14B) during a sensing period Ts, thereby preventing one of the gate node and the source node of the driving TFT from being electrically floated in the sensing period Ts. As described above, when only one of the gate node and the source node of the driving TFT is floated in the reset period Ti, the Vgs of the driving TFT changes due to the touch input. When the gate node and the source node of the driving TFT are simultaneously connected to each signal line (for example, the data line 14A and the sensing line 14B) during the sensing period Ts, the Vgs of the driving TFT does not change even if there is a touch input. In this instance, the Ids of the driving TFT depends only on the electrical characteristics of the driving TFT. FIG. 49 shows a driving waveform thereof. The external compensation according to the embodiment of the invention simultaneously applies the scan control signal SCAN and the sensing control signal SEN at an on-level during the sensing period Ts, thereby preventing the touch input from affecting the Vgs of the driving TFT. In the external compensation, changes in the electrical characteristics of the driving TFT are determined based on a magnitude of the sensing value with respect to the source node voltage of the driving TFT.

[Method for improving Touch Sensing performance in Touch Driving Mode]

A touch performance can be affected by a capacitance of a touch capacitor Ctouch and a capacitance of a storage capacitor Cst. The touch performance can be improved as the capacitance of the touch capacitor Ctouch increases if the storage capacitor Cst is uniform. Further, the touch performance can be improved as the capacitance of the storage capacitor Cst decreases if the touch capacitor Ctouch is uniform. However, reducing the capacitance of the storage capacitor Cst affects a hold capability of the Vgs of the driving TFT.

In one or more embodiments, the capacitance of the touch capacitor Ctouch is increased without decreasing the capacitance of the storage capacitor Cst, in order to increase the touch performance.

Figure 50:
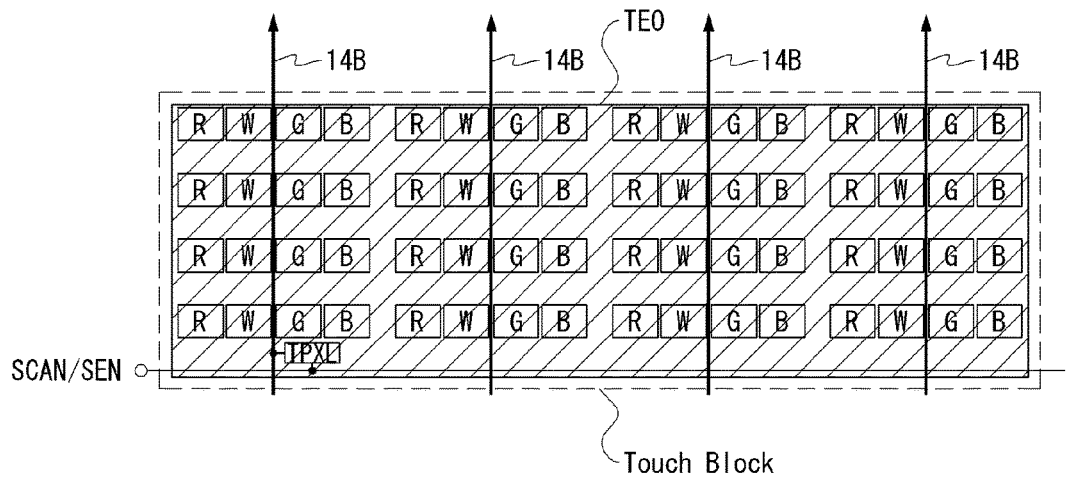
FIG. 50 shows an example of an auxiliary electrode which is patterned on each touch block and connected to a sensing target dummy pixel in order to improve sensing sensitivity.
Figure 51A:
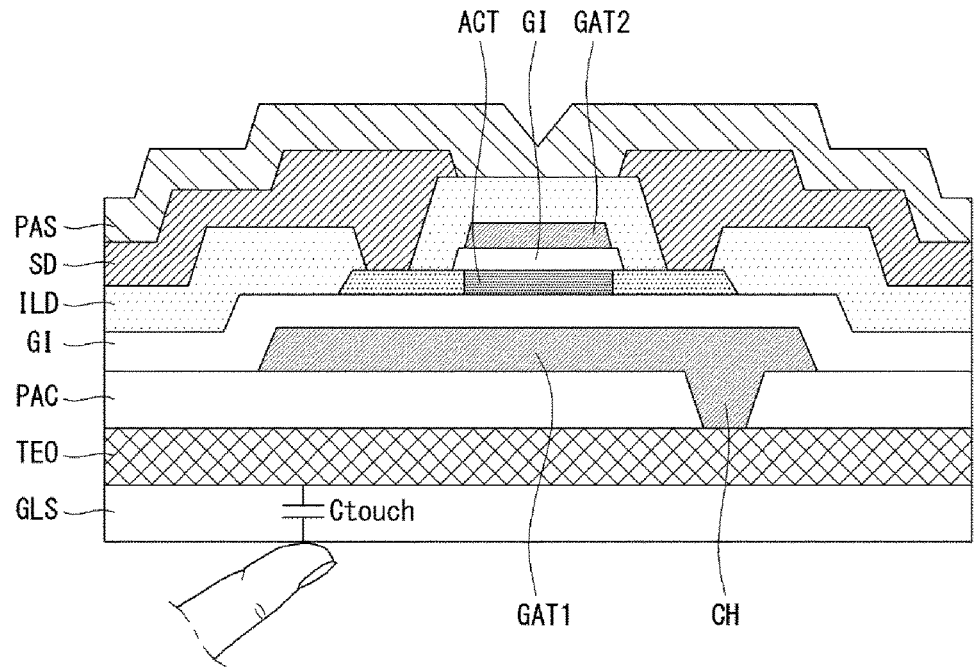
FIG. 51A illustrates a cross-sectional structure of a driving TFT included in a sensing target dummy pixel shown in FIG. 50.

FIG. 50 shows an example of an auxiliary electrode which is patterned on a touch block and connected to a sensing target dummy pixel in order to improve sensing sensitivity. FIG. 51A illustrates a cross-sectional structure of a driving TFT included in a sensing target dummy pixel shown in FIG. 50, and FIG. 51B illustrates a cross-sectional structure of a driving TFT included in a non-sensing target pixel shown in FIG. 50.

Referring to FIG. 50, the pixel array according to the embodiment of the invention further includes an auxiliary electrode TEO in order to improve the touch sensing sensitivity. The auxiliary electrode TEO is patterned on each touch block and connected to a sensing target dummy pixel TPXL. More specifically, as shown in FIG. 51A, the auxiliary electrode TEO is positioned between a substrate GLS and one side electrode GAT1 of a touch capacitor Ctouch and is electrically connected to the one side electrode GAT1 of the touch capacitor Ctouch through a contact hole CH passing through an insulating film PAC. In the embodiment disclosed herein, the one side electrode GAT1 of the touch capacitor Ctouch may be a gate electrode (or a source electrode) of a driving TFT included in the sensing target dummy pixel TPXL. The auxiliary electrode TEO increases a capacitance of the touch capacitor Ctouch by increasing an area of the one side electrode GAT1 of the touch capacitor Ctouch to a size of a touch block.

Figure 51B:
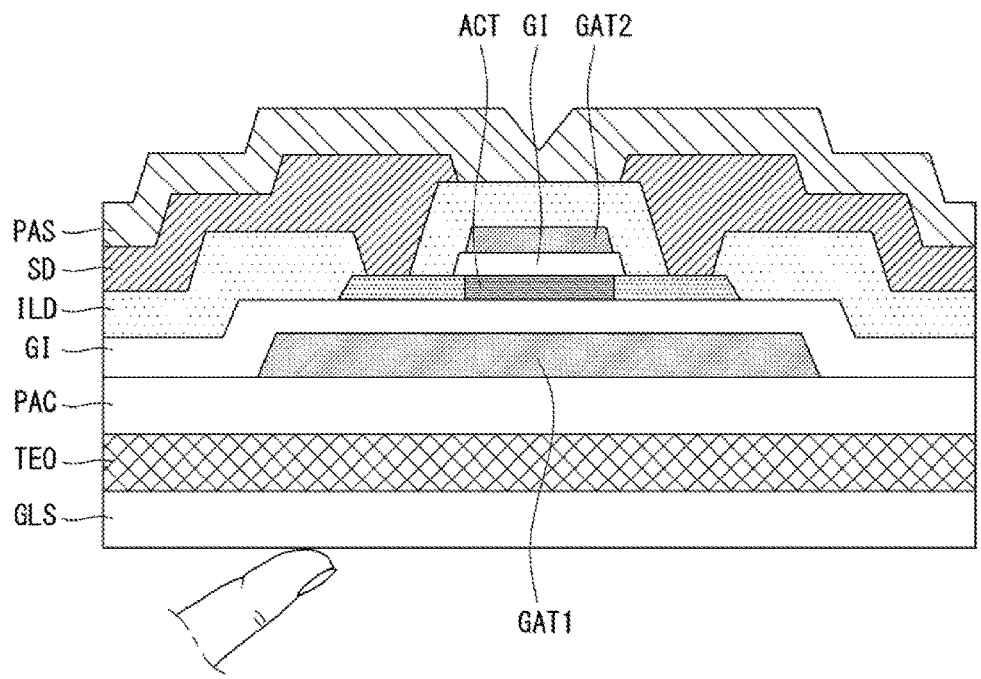
FIG. 51B illustrates a cross-sectional structure of a driving TFT included in a non-sensing target pixel shown in FIG. 50.

As shown in FIG. 51B, the auxiliary electrode TEO is electrically insulated from driving TFTs included in non-sensing target pixels P belonging to the touch block due to the insulating film PAC. Thus, because the non-sensing target pixels P of the touch block are excluded from an influence of a touch input, an image of good quality can be displayed even if there is a touch input. The auxiliary electrode TEO may be implemented as a conductor of a transparent material.

Figure 52:
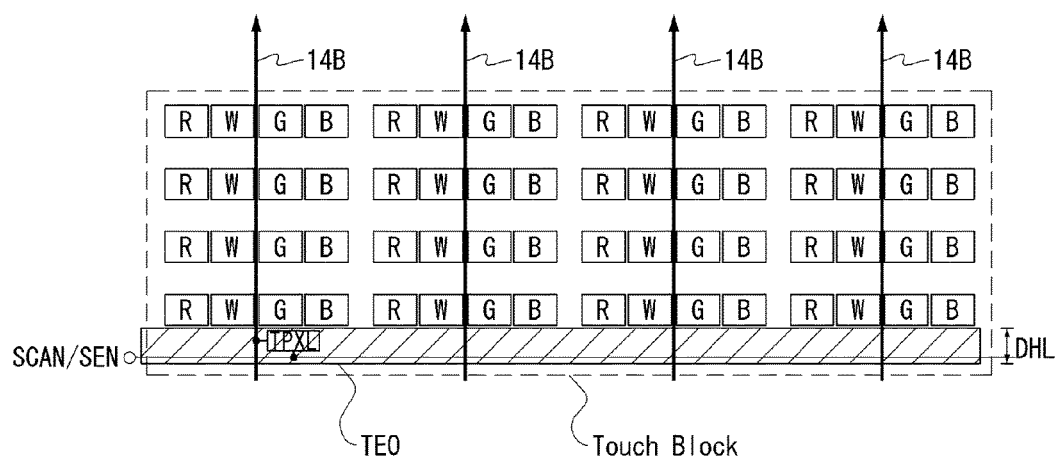
FIG. 52 shows an example of an auxiliary electrode which is patterned on each dummy pixel line in order to improve sensing sensitivity and connected to a sensing target dummy pixel.
Figure 53A:
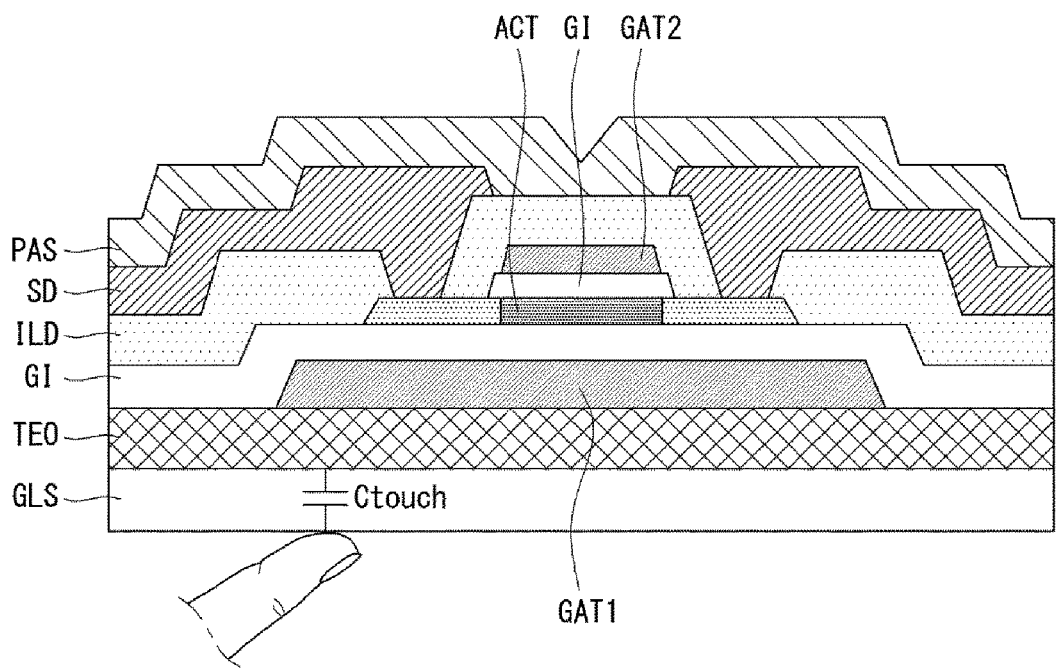
FIG. 53A illustrates a cross-sectional structure of a driving TFT included in a sensing target dummy pixel shown in FIG. 52.
Figure 53B:
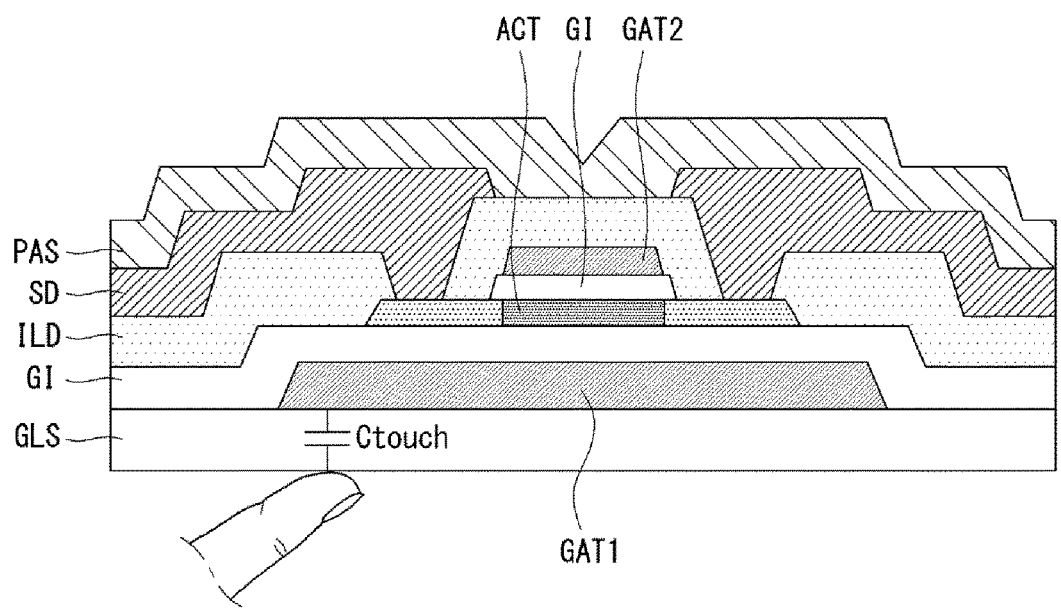
FIG. 53B illustrates a cross-sectional structure of a driving TFT included in a non-sensing target pixel shown in FIG. 52.

FIG. 52 shows an example of an auxiliary electrode which is patterned on each dummy pixel line and connected to a sensing target dummy pixel in order to improve sensing sensitivity. FIG. 53A illustrates a cross-sectional structure of a driving TFT included in a sensing target dummy pixel shown in FIG. 52, and FIG. 53B illustrates a cross-sectional structure of a driving TFT included in a non-sensing target pixel shown in FIG. 52.

Referring to FIG. 52, the pixel array according to the embodiment of the invention may further include an auxiliary electrode TEO, which is patterned on each dummy pixel line and connected to a sensing target dummy pixel TPXL, in order to improve the touch sensing sensitivity.

More specifically, as shown in FIG. 53A, the auxiliary electrode TEO is positioned between a substrate GLS and one side electrode GAT1 of a touch capacitor Ctouch and is directly connected to the one side electrode GAT1 of the touch capacitor Ctouch. In the embodiment disclosed herein, the one side electrode GAT1 of the touch capacitor Ctouch may be a gate electrode (or a source electrode) of a driving TFT included in the sensing target dummy pixel TPXL. The auxiliary electrode TEO increases a capacitance of the touch capacitor Ctouch by increasing an area of the one side electrode GAT1 of the touch capacitor Ctouch to a size of a dummy pixel line.

The auxiliary electrode TEO may be formed only on the dummy pixel line of the touch block but not formed on horizontal pixel lines. The auxiliary electrode TEO is electrically insulated from driving TFTs included in non-sensing target pixels P belonging to the touch block. Thus, an influence of the touch input on the non-sensing target pixels P of the touch block is reduced. The auxiliary electrode TEO may be formed of a conductive material.

Figure 54:
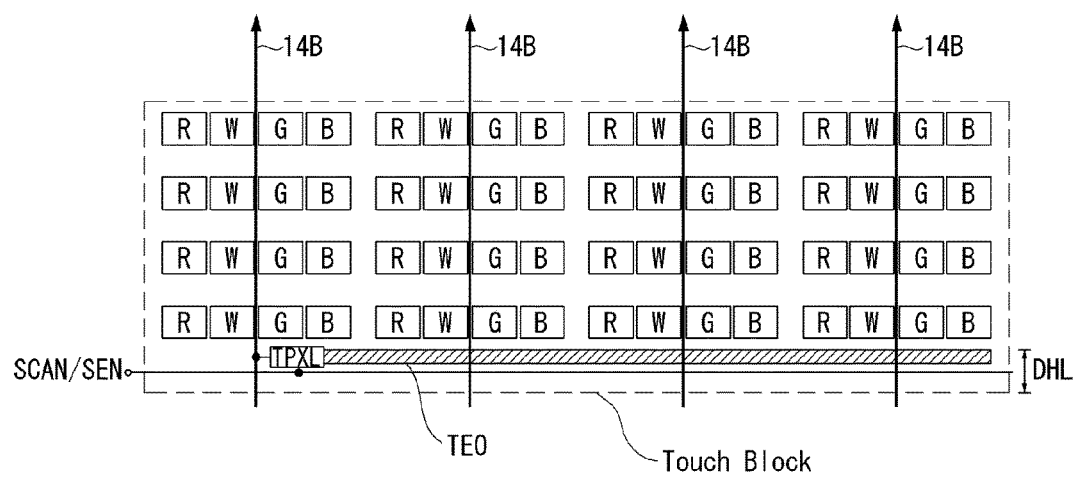
FIG. 54 shows another example of an auxiliary electrode which is patterned on each dummy pixel line in order to improve sensing sensitivity and connected to a sensing target dummy pixel.

FIG. 54 shows another example of an auxiliary electrode which is patterned on a per dummy pixel line basis and connected to a sensing target dummy pixel in order to improve sensing sensitivity. FIG. 55 shows an example of extending a gate electrode of a driving TFT included in a sensing target dummy pixel to form an auxiliary electrode.

Referring to FIG. 54, the pixel array according to the embodiment of the invention may further include an auxiliary electrode TEO, that is patterned on a per dummy pixel line basis and connected to a sensing target dummy pixel TPXL, in order to improve the touch sensing sensitivity.

More specifically, the auxiliary electrode TEO is formed by extending a gate electrode GAT1 of a driving TFT included in a sensing target dummy pixel shown in FIG. 29 on a dummy pixel line DBL. The gate electrode GAT1 of the driving TFT becomes one side electrode of a touch capacitor Ctouch. The auxiliary electrode TEO increases an area of the one side electrode of the touch capacitor Ctouch to a size of the dummy pixel line DBL. As a result, a capacitance of the touch capacitor Ctouch may increase.

Figure 55:
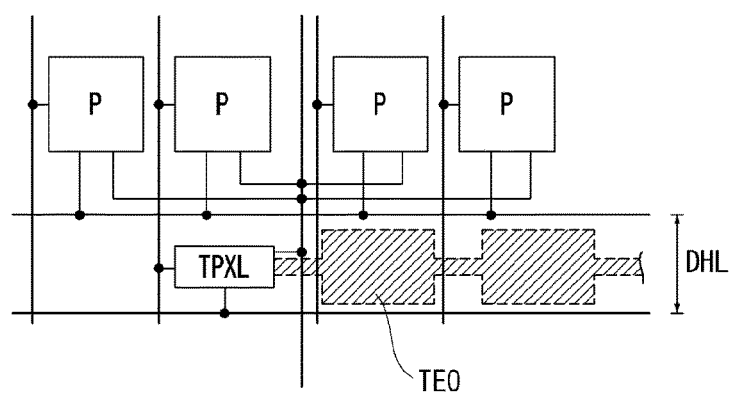
FIG. 55 shows an example of extending a gate electrode of a driving TFT included in a sensing target dummy pixel to form an auxiliary electrode.

As shown in FIG. 55, the auxiliary electrode TEO may be formed only on the dummy pixel line of the touch block but not formed on horizontal pixel lines. Because the auxiliary electrode TEO is formed as one body together with the gate electrode GAT1 of the driving TFT included in the sensing target dummy pixel, a separate additional process is not necessary. The auxiliary electrode TEO may be formed of a gate metal material.

As described above, the touch sensor integrated display device according to the embodiment of the invention performs a touch sensing using components available in a display panel. Thus, various embodiments of the touch sensor integrated display device disclosed herein can reduce additional elements for touch sensing because it senses touch input using an external compensation-type pixel array.

Moreover, the touch sensor integrated display device according to the embodiment of the invention senses a change in the Ids of the driving TFT resulting from a change in the Vgs of the driving TFT caused by touch input. Thus, the Ids is sensed as an amplified current even if the amount of Vgs change caused by touch input is small, and this offers an advantage to enhance sensing capabilities.

Furthermore, the touch sensor integrated display device according to the embodiment of the invention can improve the touch sensing performance in the touch driving mode and also reduce an influence of touch input during the external compensation in the touch driving mode, thereby increasing the accuracy of the touch sensing.

Furthermore, the touch sensor integrated display device according to the embodiment of the invention divides the pixel array into a plurality of touch blocks and disposes a sensing target dummy pixel as well as image display pixels on each touch block. The touch sensor integrated display device according to the embodiment of the invention may sense only the sensing target dummy pixels during the touch sensing and thus can further simplify a sensing operation.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch sensor integrated display device comprising:
a display panel including a pixel array configured to display an input image, the pixel array being divided into a plurality of touch blocks, each touch block including pixels displaying the input image and a sensing target dummy pixel sensing a touch input, the sensing target dummy pixel including a dummy driving thin film transistor (TFT), a source-drain current of the dummy driving TFT controlled based on a gate-source voltage of the dummy driving TFT, the sensing target dummy pixel not displaying the input image;
a panel drive circuit configured to, in a touch sensing period, supply a scan control signal and a sensing control signal to the sensing target dummy pixel, set the gate-source voltage of the dummy driving TFT to turn on the dummy driving TFT by applying a touch driving data voltage to a gate node of the dummy driving TFT and applying a reference voltage to a source node of the dummy driving TFT, and output a sensing value by sensing a change in the source-drain current of the dummy driving TFT caused by the touch input; and
a timing controller configured to compare the sensing value with a predetermined reference value and detect the touch input.

2. The touch sensor integrated display device of claim 1, wherein each of the pixels displaying the input image includes a driving TFT on a same layer as the dummy driving TFT of the sensing target dummy pixel.

3. The touch sensor integrated display device of claim 1, wherein each of the pixels displaying the input image includes a driving TFT and an organic light emitting diode (OLED) coupled to the driving TFT, and wherein the sensing target dummy pixel further includes acapacitor coupled to the dummy driving TFT without the OLED.

4. The touch sensor integrated display device of claim 1, wherein touch sensing periods of a number of the touch blocks are assigned to a vertical active period for an image display,
    wherein image display data address periods, in which image display data is written on the pixels of each touch block, are further assigned to the vertical active period, and
    wherein the touch sensing periods and the image display data address periods are alternately positioned in the vertical active period.

5. The touch sensor integrated display device of claim 4, wherein a transmission timing of a sensing value of a first touch block of the touch blocks overlaps an image display data address period of a second touch block of the touch blocks adjacent to the first touch block.

6. The touch sensor integrated display device of claim 1, wherein touch sensing periods of a number of the touch blocks are assigned to a vertical blank period between vertical active periods, and
    wherein image display data is written on the pixels of the touch blocks in the vertical active periods.

7. The touch sensor integrated display device of claim 6, wherein a transmission timing of a sensing value of a first touch block of the touch blocks overlaps a touch sensing period of a second touch block of the touch blocks adjacent to the first touch block.

8. The touch sensor integrated display device of claim 6, wherein the touch blocks are simultaneously sensed in groups,
    wherein touch blocks in a touch group are individually connected to different sensing units of the panel drive circuit, and
    wherein a transmission timing of a sensing value with respect to a first touch group overlaps a touch sensing period of a second touch group adjacent to the first touch group.

9. The touch sensor integrated display device of claim 1, wherein the touch sensing period further includes a bias stress reduction period,
    wherein the panel drive circuit applies a stress reduction data voltage to the gate node of the dummy driving TFT to turn off the dummy driving TFT during the bias stress reduction period, and
    wherein the stress reduction data voltage is equal to or less than the reference voltage.

10. The touch sensor integrated display device of claim 4, wherein an external compensation period, in which a change in electrical characteristics of a driving TFT included in each of the pixels displaying the input image is sensed, is assigned to a vertical blank period, and
    wherein in the external compensation period, the panel drive circuit applies an external compensation data voltage greater than the touch driving data voltage to a gate node of the driving TFT and applies the reference voltage to a source node of the driving TFT.

11. The touch sensor integrated display device of claim 6, wherein an external compensation period, in which a change in electrical characteristics of a driving TFT included in each of the pixels displaying the input image is sensed, is further assigned to the vertical blank period, and
    wherein in the external compensation period, the panel drive circuit applies an external compensation data voltage greater than the touch driving data voltage to a gate node of the driving TFT and applies the reference voltage to a source node of the driving TFT.

12. The touch sensor integrated display device of claim 4, wherein an external compensation period, in which a change in electrical characteristics of a driving TFT included in each of the pixels displaying the input image is sensed, is assigned to a vertical blank period, and
    wherein the panel drive circuit applies the scan control signal and the sensing control signal to couple a gate node and a source node of the driving TFT to corresponding signal lines during a sensing period included in the external compensation period and to prevent the gate node and the source node of the driving TFT from being floated.

13. The touch sensor integrated display device of claim 6, wherein an external compensation period, in which a change in electrical characteristics of a driving TFT included in each of the pixels displaying the input image is sensed, is further assigned to the vertical blank period, and
    wherein the panel drive circuit applies the scan control signal and the sensing control signal to couple a gate node and a source node of the driving TFT to corresponding signal lines during a sensing period included in the external compensation period and to prevent the gate node and the source node of the driving TFT from being floated.

14. The touch sensor integrated display device of claim 1, wherein the timing controller includes:
    a memory; and
    a memory controller configured to store image data input in the memory at a first frame frequency and output data stored in the memory at a second frame frequency less than the first frame frequency.

15. The touch sensor integrated display device of claim 1, wherein a touch capacitor caused by the touch input is connected to the gate node or the source node of the dummy driving TFT and changes the gate-source voltage of the dummy driving TFT.

16. The touch sensor integrated display device of claim 1, wherein the display panel further includes an auxiliary electrode patterned on each touch block and connected to the sensing target dummy pixel, and
    wherein the auxiliary electrode is positioned between one side electrode of a touch capacitor caused by the touch input and a substrate, and is electrically connected to the one side electrode of the touch capacitor through a contact hole passing through an insulating film.

17. The touch sensor integrated display device of claim 1, wherein the display panel further includes an auxiliary electrode patterned on each dummy pixel line and connected to the sensing target dummy pixel, the sensing target dummy pixel being disposed on the dummy pixel line, and
    wherein the auxiliary electrode is positioned between one side electrode of a touch capacitor caused by the touch input and a substrate, and is directly connected to the one side electrode of the touch capacitor.

18. The touch sensor integrated display device of claim 17, wherein the auxiliary electrode is formed by extending the gate node of the dummy driving TFT on the dummy pixel line.

19. A method for driving a touch sensor integrated display device comprising:
    a first step of setting a touch sensing period with respect to a display panel, in which a pixel array displaying an input image is divided into a plurality of touch blocks, each touch block includes a plurality of pixels displaying the input image and a sensing target dummy pixel sensing a touch input, and the sensing target dummy pixel includes a dummy driving thin film transistor (TFT) controlling a source-drain current based on a gate-source voltage;

a second step of, in the touch sensing period, supplying a scan control signal and a sensing control signal to the sensing target dummy pixel corresponding to a touch block of the plurality of touch blocks, setting the gate-source voltage of the dummy driving TFT to turn on the dummy driving TFT by applying a touch driving data voltage to a gate node of the dummy driving TFT and applying a reference voltage to a source node of the dummy driving TFT, and outputting a sensing value by sensing a change in the source-drain current of the dummy driving TFT caused by the touch input; and a third step of comparing the sensing value with a predetermined reference value to detect the touch input based on the comparison.

\* \* \* \* \*